(12) United States Patent
Watanabe et al.

(10) Patent No.: US 6,608,791 B2
(45) Date of Patent: Aug. 19, 2003

(54) SEMICONDUCTOR DEVICE INCORPORATING INTERNAL POWER SUPPLY FOR COMPENSATING FOR DEVIATION IN OPERATING CONDITION AND FABRICATION PROCESS CONDITIONS

(75) Inventors: Takao Watanabe, Kokubunji (JP); Ryoichi Hori, Tokyo (JP); Goro Kitsukawa, Tokyo (JP); Yoshiki Kawajiri, Hachioji (JP); Takayuki Kawahara, Kokubunji (JP); Kiyoo Itoh, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/103,827

(22) Filed: Mar. 25, 2002

(65) Prior Publication Data

US 2002/0131314 A1 Sep. 19, 2002

Related U.S. Application Data

(60) Continuation of application No. 09/506,438, filed on Feb. 18, 2000, now Pat. No. 6,363,029, which is a continuation of application No. 08/305,528, filed on Sep. 13, 1994, now Pat. No. 5,822,267, which is a continuation of application No. 07/985,076, filed on Dec. 3, 1992, now Pat. No. 5,377,156, which is a division of application No. 07/808,878, filed on Dec. 18, 1991, now Pat. No. 5,197,033, which is a division of application No. 07/608,640, filed on Nov. 5, 1990, now Pat. No. 5,086,238, which is a continuation of application No. 07/196,743, filed on May 20, 1988, now abandoned, which is a continuation-in-part of application No. 07/126,485, filed on Nov. 30, 1987, now Pat. No. 4,873,673, and a continuation-in-part of application No. 07/130,640, filed on Dec. 9, 1987, now Pat. No. 4,837,462, which is a division of application No. 06/886,816, filed on Jul. 18, 1986, now Pat. No. 4,730,132.

(30) Foreign Application Priority Data

| Jul. 22, 1985 | (JP) | 60-161467 |
| Jan. 31, 1986 | (JP) | 61-17929 |
| Feb. 17, 1986 | (JP) | 61-30846 |
| Dec. 3, 1986 | (JP) | 61-286610 |
| Feb. 20, 1987 | (JP) | 62-35519 |
| May 22, 1987 | (JP) | 62-123797 |
| Jul. 8, 1987 | (JP) | 62-168652 |
| Sep. 9, 1987 | (JP) | 62-223921 |
| Nov. 27, 1987 | (JP) | 62-297546 |

(51) Int. Cl.$^7$ ............................................. G11C 7/04
(52) U.S. Cl. .................. 365/211; 365/191; 365/210; 365/212; 365/226
(58) Field of Search .................. 365/189.07, 189.09, 365/191, 210, 211, 212, 226

(56) References Cited

U.S. PATENT DOCUMENTS

| 3,909,606 A | * | 9/1975 | Shibata et al. | 714/699 |
| 4,358,728 A | * | 11/1982 | Hashimoto | 323/275 |
| 4,763,021 A | * | 8/1988 | Stickel | 326/71 |

FOREIGN PATENT DOCUMENTS

| JP | 55015537 | 2/1980 |
| JP | 55078313 | 6/1980 |
| JP | 55082319 | 6/1980 |
| JP | 63006908 | 1/1988 |
| JP | 63100519 | 5/1988 |

* cited by examiner

*Primary Examiner*—Van Thu Nguyen
(74) *Attorney, Agent, or Firm*—Kenyon & Kenyon

(57) ABSTRACT

A semiconductor integrated circuit comprises a semiconductor chip, a power supply terminal provided on the semiconductor chip for receiving a voltage from an external power supply source, an internal circuit provided on the semiconductor chip, a power supply circuit provided on the semiconductor chip for transforming an external power supply voltage received from the power supply terminal for supplying a source voltage resulting from the voltage transformation to the internal circuit, and a control circuit provided on the semiconductor chip for controlling the power supply circuit, wherein the control circuit includes external power supply voltage detecting means and/or temperature detecting means and responds to the signal from the external power supply voltage detecting means and/or the temperature detecting means by changing the power supply voltage to the internal circuit to thereby maintain the operating speed of the internal circuit to be constant.

21 Claims, 34 Drawing Sheets

SEMICONDUCTOR DEVICE INCORPORATING INTERNAL POWER SUPPLY FOR COMPENSATING FOR DEVIATION IN OPERATING CONDITION AND FABRICATION PROCESS CONDITIONS

CROSS REFERENCES TO RELATED APPLICATIONS

This application is a continuation of application Ser. No. 09/506,438 filed on Feb. 18, 2000, issuing as U.S. Pat. No. 6,363,029, which is a continuation of application Ser. No. 08/305,528 filed Sep. 13, 1994 now U.S. Pat. No. 5,822,267, which is a continuation of application Ser. No. 07/985,076 filed on Dec. 3, 1992, U.S. Pat. No. 5,377,156, which is a division of application Ser. No. 07/808,878 filed on Dec. 18, 1991, U.S. Pat. No. 5,197,033, which is a division of application Ser. No. 07/608,640 filed on Nov. 5, 1990, U.S. Pat. No. 5,086,238, which is a continuation of application Ser. No. 07/196,743 filed on May 20, 1988, now abandoned, which is a continuation-in-part of: a) application Ser. No. 07/126,485 filed on Nov. 30, 1987, U.S. Pat. No. 4,873,673; and b) application Ser. No. 07/130,640 filed on Dec. 9, 1987, U.S. Pat. No. 4,837,462, which in turn is a division of application Ser. No. 06/886,816 filed on Jul. 18, 1986, U.S. Pat. No. 4,730,132.

BACKGROUND OF THE INVENTION

The present invention relates generally to an improvement of performance of a semiconductor device and more particularly to a semiconductor device of high bit density realized in a structure suited for achieving high stability and enhanced reliability.

The technique for realizing the semiconductor devices in the form of integrated circuits having high bit density has made remarkable progress in recent years. Suppose, by way of example, a MOS dynamic random access memory (hereinafter referred to as a DRAM in abbreviation) The MOS DRAM of 1 Mbits is manufactured on a mass production basis A test chip of a 4-Mbit DRAM has already been reported. At the present state of the art, a 16-Mbit-DRAM is undergoing development for practical applications. For realizing the semi-conductor device of such high bit density, the size of the devices or elements constituting the semiconductor device as well as the size of wires must be made very small or fine in the range on the order of 0.5 $\mu$m to 1 $\mu$m. However, a great difficulty is encountered in fabricating such small (fine) devices or elements and wires accurately, giving rise to a problem that remarkable deviations can not be avoided. Taking the MOS DRAM as an example, the gate length and the threshold voltages which mainly determine the characteristics of the MOS transistors constituting the MOS DRAM will vary significantly in dependence on fluctuation in the device size and impurity concentration. Considering the changes in the supply voltage and the ambient temperature in the actual operating condition, the access time of the DRAM will vary in the range from first to third order of magnitude. Further, deviations due to the fabrication process condition exert significant influence to the reliability of the device. More specifically, degradation in the dielectric breakdown strength (dioxide breakdown strength) as well as degradation in the characteristics (due to hot carriers) occur as the result of implementation of the elements in small or minute size. Further, such characteristics concerning reliability of the device depend by and large on the dispersion in the implemented size.

As a hitherto known technique for improving the stability and reliability of the characteristics of the integrated semiconductor device, there is known a method of operating the on-chip elements by lowering the externally supplied voltage with the aid of an on-chip voltage limiter provided on the semiconductor device chip, as is disclosed in U.S. Pat. No. 4,482,985.

However, in the prior known techniques mentioned above, no consideration is paid to the influence of the conditions in the fabrication process condition and the operating condition to the electric characteristics and reliability, and thus it has been difficult to realize a semiconductor device of high stability and improved reliability.

Besides, because no consideration is made concerning the influence of the condition in the fabrication process, yield of products of satisfactory quality in a manufacturing on the mass production basis is low, giving rise to a problem that high manufacturing cost is involved.

SUMMARY OF THE INVENTION

It is therefore an object of the present invention to realize a semiconductor device enjoying high stability and improved reliability by protecting the electrical characteristics and the reliability against changes, notwithstanding a deviation or variation in the condition of the fabrication process condition and the operating condition.

In view of the above and other objects which will be more apparent as the description proceeds, it is proposed according to an aspect of the present invention to control the operation voltage and/or operation current of circuits incorporated in the semiconductor device in dependence on deviation or variation in the fabrication process condition and the operating condition.

According to an embodiment of the present invention, the operation voltage and/or operation current of the circuits and/or elements (devices) incorporated in the semiconductor device is controlled in accordance with the electrical characteristics whereby a semiconductor device of high stability and enhanced reliability can be realized.

These and other objects and many of the attendant advantages of the present invention will be readily appreciated as the same becomes better understood by reference to the following detailed description when considered in connection with the accompanying drawings.

DETAILED DESCRIPTION OF THE PRESENT INVENTION

Figure 1:
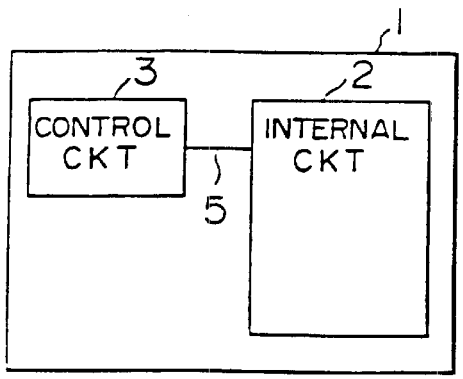
FIGS. 1 to 6 are schematic diagrams for illustrating the basic principle underlying the present invention.

FIG. 1 is a schematic diagram for illustrating the basic principle underlying an embodiment of the present invention. In this figure, reference numeral 1 denotes a semiconductor chip, 2 denotes an internal circuit inherent to a semiconductor device, and a numeral 3 denotes a control circuit implemented according to the invention for generating control signals or controlled internal voltages in accordance a deviation in the condition in the fabrication process as well as the operating condition in which the semiconductor device is used. The control signal or internal voltage as generated is utilized for controlling operation of the internal circuit 2 by way of a control bus or line 5. Although a single line 5 is shown, it will be readily understood that a number of signal lines may be prepared in the form of a bus in conformance with the configuration of the internal circuit 2.

According to the illustrated embodiment of the invention, the characteristics of the internal circuit 2 can be maintained in predetermined constant relationship in conformance with the fabrication process condition and the operating condition, whereby a semiconductor device enjoying high stability and improved reliability can be realized.

Figure 2:
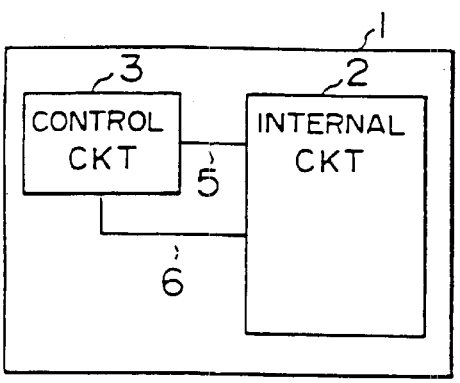

FIG. 2 shows another exemplary embodiment of the present invention, which is so arranged that an operation characteristic of the internal circuit 2 such as, for example, operating speed, operating current or the like is detected by a detecting or sensing line 6, whereby a corresponding control signal is generated. In this respect, the semiconductor device shown in FIG. 2 differs from the one shown in FIG. 1.

In the case of the embodiment of the invention shown in FIG. 2, dynamic characteristics of the circuit 2 are detected straightforwardly for generating the control signal. Thus, the arrangement shown in FIG. 2 allows the control to be performed with a higher accuracy as compared with that of the device shown in FIG. 1, whereby a semiconductor device can be realized which enjoys further improved stability and reliability. It goes without saying that a plurality of the sensing lines 6 may be provided, if necessary FIG. 3 shows a further embodiment of the invention which differs from the one shown in FIG. 2 in that a detecting or monitor circuit 4 having characteristics similar to those of the internal circuit 2 is provided for detecting the operation characteristics thereof.

With this arrangement, the operation characteristics of the internal circuit can be detected indirectly in terms of the characteristics of the detecting or monitor circuit 4 even in the case where no proper circuitry is provided for detecting the operation characteristics of the circuit 2, whereby the control can be so performed that the characteristics of the circuit 2 bear a predetermined relation.

Figure 3:
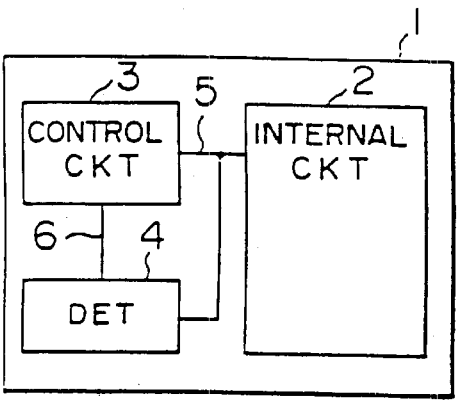

In the case of the semiconductor device shown in FIG. 3, the detecting circuit 4 is also under the control of the control circuit 3 which serves to vary the characteristics of the detecting or monitor circuit 4 in a manner similar to the control of internal circuit 2. It is conceivable to operate the detecting circuit 4 independent of the internal circuit 2 in accordance with the envisaged applications of the semiconductor device.

Figure 4:
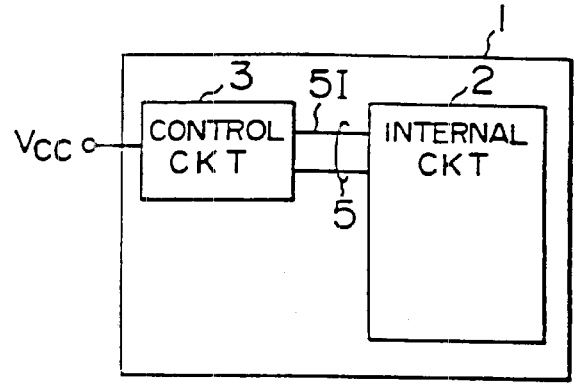

FIG. 4 is a schematic diagram showing a version of the embodiment illustrated in FIG. 1. In the case of the semiconductor device shown in FIG. 4, a power supply source voltage is fed to the internal circuit 2 from the control circuit 3 by way of a power supply line 5I. The instant embodiment of the invention is suited for the internal circuit implemented with small or fine elements. More specifically, by setting the potential on the power supply line 5I at a value lower than the voltage which the elements constituting the internal circuit 2 can withstand, the semiconductor device constituted by the fine elements with high bit density can be operated while maintaining high stability and reliability. Further, since there arises no necessity to lower the external voltage, no burden is imposed on the user. In the case of the dynamic random access memory or DRAM, as the bit density is increased from 256 K bits to 1 M bits and hence to 4 M bits, the constituent elements have to be realized in more and more fine (minute) structure. In that case, lowering of the external voltage to cope with the lowering of the voltage withstanding capability of the constituent elements is undesirable, in order to assure the compatibility with the conventional devices. For this reason alone, the embodiment shown in FIG. 4 is advantageous. Although a plurality of control lines are shown in FIG. 4, the operation characteristics of the internal circuit 2 can be stabilized by controlling the voltage by means of the control circuit. Further, the voltage control may be carried out such that a variation in the internal voltage with reference to the external voltage $V_{CC}$ can be first compensated for, being followed by compensation of variations in the characteristics of the internal circuit 2 brought about by changes in the environmental conditions such as temperature and deviations in the fabrication process condition. Needless to say, the control circuit to which the external voltage $V_{CC}$ is applied directly is implemented by using the elements having the voltage withstanding capability or the breakdown strength exceeding the external voltage $V_{CC}$.

Figure 5:
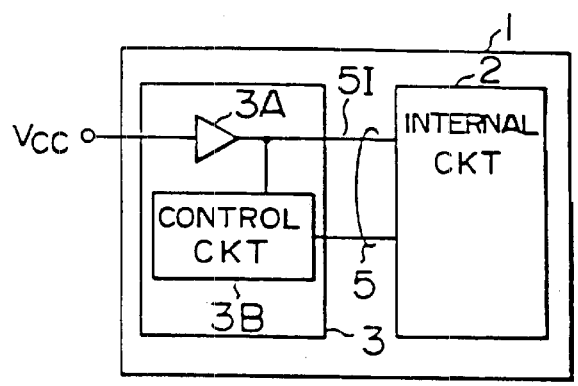

However, there may exist some application in which a part of the control circuit has to be constituted by a fine element of lower breakdown strength in an effort to enhance the bit density or in an attempt to make the characteristics of the control circuit coincide with those of the internal circuit. To this end, a voltage transformer circuit 3A may be provided internally in the control circuit 3, whereby a voltage lower than the level $V_{CC}$ is supplied through an output line 5I to the internal circuit 2 as well as the circuitry 3B of the low breakdown strength incorporated in the control circuit 3, as is shown in FIG. 5 With this arrangement of the semiconductor device, the integration or bit density thereof can be further enhanced because the circuits inclusive of the control circuit can be realized with fine (minute) elements. Besides, since the control circuitry 3B and the internal circuit 2 can be constituted by elements having identical characteristics, variation in the operation characteristics of the internal circuit 2 can be controlled very precisely on the basis of corresponding variations in the characteristics of the control circuitry 3B, to a further advantage.

It should however be mentioned in conjunction with the illustrative embodiments shown in FIGS. 4 and 5 that some of the constituent elements thereof which exhibit a high breakdown strength (voltage withstanding capability) may be operated with the external voltage $V_{CC}$, as occasion requires. Additionally, it goes without saying that the semiconductor devices shown in FIGS. 2 and 3 may equally be realized with the fine elements having low breakdown strength in the manner similar to the semiconductor devices shown in FIGS. 4 and 5.

In the exemplary embodiments of the invention as illustrated in FIGS. 1 to 5, it is assumed that a single control circuit is provided on one semiconductor chip. It should however be appreciated that the internal circuit 2 may be divided into several circuits each being provided with the respective control circuitry. To this end, the arrangements shown in FIGS. 1 to 5 may of course be combined appropriately on a case-by-case basis. With the arrangement that the internal circuit 2 is divided into several circuits for accomplishing the control of the operation characteristics thereof, such control can be achieved for realizing the optimum operation characteristics for the individual functions of the divided circuitries.

Figure 6:
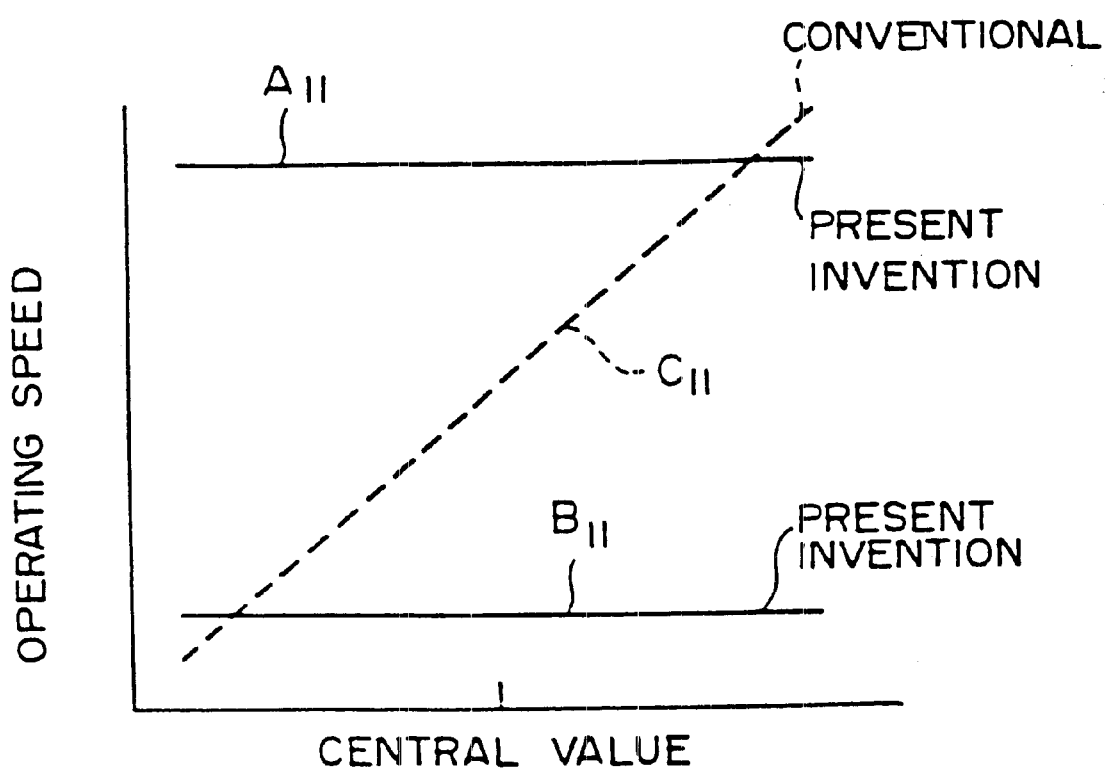

FIG. 6 is a view illustrating, in graph form such control that the operating speed of the circuit is maintained constantly at values differing from one another. More specifically a broken curve $C_{11}$ shown in this figure represents the operation speed of a conventional circuit incorporating no control circuitry. As will be seen from this curve, the operating speed varies significantly in dependence on the fabrication process condition and the operating conditions. In contrast, a circuit incorporating a number of control circuits according to the present invention can exhibit a constant high speed as indicated by a solid line curve $B_{11}$. Of course, the circuit incorporating the control circuits and destined for low-speed operation can be maintained at a desired constant low speed, as indicated by a solid line curve $A_{12}$.

In the case of an output circuit or the like, by way of example, when charge and discharge of the output load capacitance is performed at a high speed, noise is likely to be generated in the power supply source to exert adverse influence to the operation of the internal circuits or semiconductor devices disposed in the vicinity. In that case, by controlling only the output circuit so that it operates at a low speed, the operating speed can be maintained at a constant value without lowering the speed of the whole circuit system. Although such control that the circuit operation is maintained independent of the fabrication process condition and the operating condition is described, this is only one example of the use of the present invention. The circuit operation speed may be imparted with a desired dependency on a desired factor, as occasion requires. For example, such control can be equally realized that the operating speed of a circuit is increased as a function of increases in the temperature. In that case, control may be made such that a delay involved due to resistance of wiring conductors within a semiconductor device or wiring conductors interconnecting the semiconductor devices can be compensated for by the increased operating speed brought about by a temperature rise, to thereby maintain constant the speed of the semiconductor device or that of the whole system including the semiconductor devices.

As will now be appreciated, according to the embodiments of the present invention shown in FIGS. 1 to 6, circuit characteristics can be protected against variation brought about in the fabrication process, which in turn means that yield of the products of satisfactory quality fabricated on the mass production basis can be improved. Further, since the circuit characteristics can be protected from variations as caused by changes in the operating condition, reliability of a system such as a computer which is realized by using the semiconductor devices according to the invention can be improved significantly.

There exist certain applications where synchronization is required between operations of the two circuits incorporated in the circuit 2. In that case, by adopting the inventive circuit arrangement, the timing margin can be set at a minimum value by virtue of the invariability of the characteristics. This in turn means that the operating speed of the semiconductor device can be correspondingly increased. In the case of DRAM (dynamic random access memory), for example, synchronization has to be established between the memory cell array and peripheral circuitries. In that case, by adopting the teachings of the present invention, the timing margin can be set to a minimum, whereby operating speed of the DRAM can be increased.

The same holds true in the case where synchronization in operation must be established among more than two semiconductor devices. In other words, operating speed of a system such as a computer constituted by a number of semiconductor devices can be increased by applying the present invention to these semiconductor devices.

In the embodiments shown in FIGS. 4 and 5, a so-called TTL interface with the positive power source of $V_{CC}$ is assumed to be employed. It should however be appreciated that essentially the same effects can be attained even when an ECL interface is employed. The following description will be made on the assumption that the TTL interface is employed. However, this never means that the invention is restricted to the use of TTL interface. The present invention can be equally realized by using the ECL interface.

In the following, exemplary embodiments of the present invention will be described with reference to more concrete circuit configurations. In the first place, description is directed to a method of controlling the characteristics of a driver, circuit constituting a basic circuitry of an integrated circuit device.

Figure 7A:
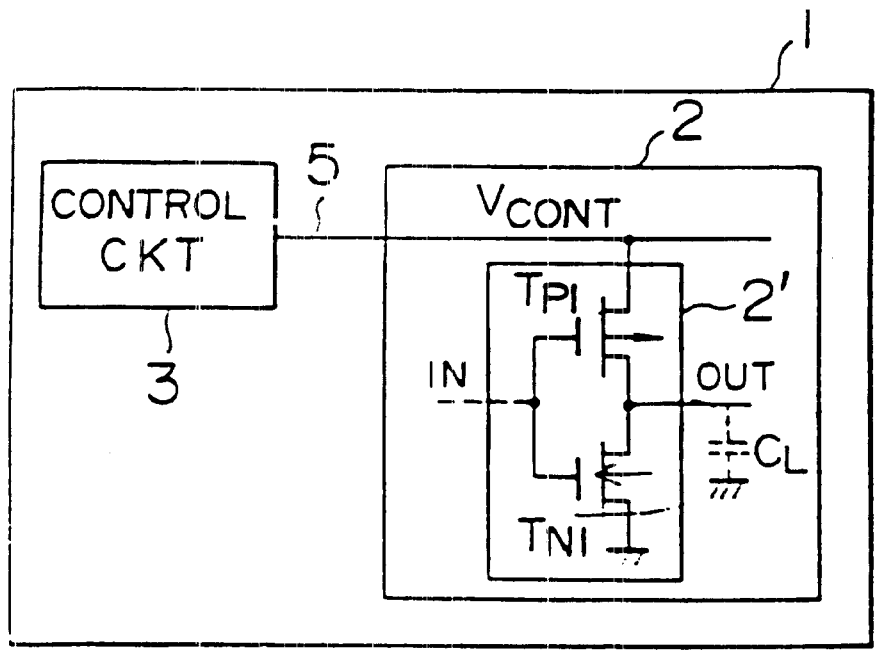
FIGS. 7 to 52 are schematic circuit diagrams showing exemplary embodiments of the invention.

FIG. 7A shows a detailed embodiment of the present invention which is designed for controlling a driver circuitry incorporated in a circuit 2 In the case of this illustrative embodiment, the characteristics of the driver circuitry are controlled by varying the power supply voltage of the circuit. Referring to FIG. 7A, an element circuitry 2' constituting a part of the circuit 2 is a CMOS inverter composed of a P-channel MOS transistor $T_{P1}$ and an N-channel MOS transistor $T_{N1}$. It should however be understood that the elementary circuitry 2' may be another logic circuit such as a NAND and a NOR circuit. Further, it may be composed of bipolar transistors or a combination of a bipolar transistor and a MOS transistor, or a circuit constituted by a combination of these circuit elements.

Figure 7B:
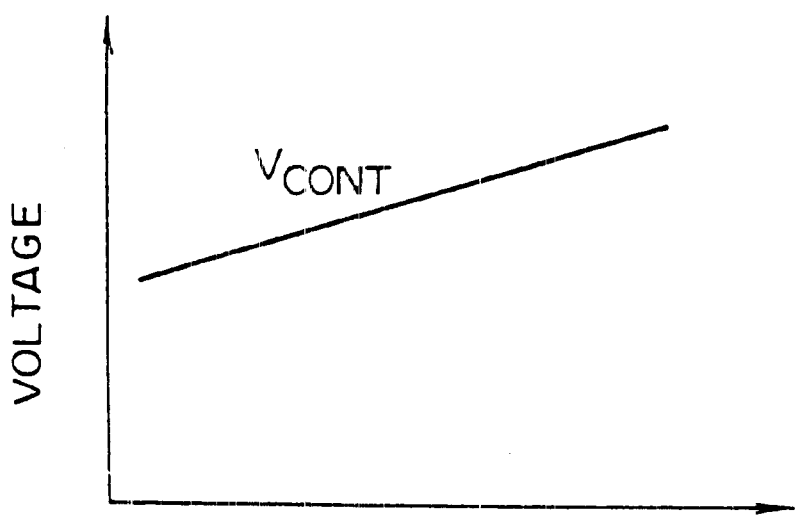

According to the instant embodiment of the invention, characteristics of the driver circuitry 2' and hence that of the whole circuit 2 can be controlled by varying a voltage $V_{CONT}$ supplied from the control circuit 3 by way of the line 5, whereby a semiconductor device enjoying a high stability and an improved reliability can be realized. Value of the control voltage $V_{CONT}$ is determined in dependence on the circuit configuration of the driver circuitries 2' to be controlled, as is illustrated in FIG. 7B, by way of example. In order to maintain constant the operating speed of the CMOS inverter while enhancing the reliability, the control voltage $V_{CONT}$ may be varied in such a manner as illustrated in FIG. 7B in consideration of various factors. More specifically, the CMOS invertor exhibits a delay time $t_d$ which bears a certain relation to a gate length $L_g$, a threshold voltage $V_T$, a thickness toy of gate oxide film, a channel conductance $\beta_o$, temperature T (absolute temperature) and a load capacity $C_L$, which relation is approximately given by $$t_d \propto C_L \times \frac{1}{\beta_o} \times L_g \times \frac{1}{V_{CONT} - V_T} \times T^{1.5} \tag{1}$$

In the actual circuits, the delay time may be deviate more or less from the value determined by the above expression for various reasons. It is however safe to say that the relation given by the expression (1) is essentially valid for CMOS circuits in general. Accordingly, the control voltage $V_{CONT}$ may be varied according to the relation given by the above expression (1) so that the delay time $t_d$ can be maintained constant. There exists such qualitative trend that the delay time $t_d$ can be held substantially constant by increasing the value of the control voltage $V_{CONT}$ as the values of various variable factors (in the case of channel conductance $\beta_o$, the reciprocal thereof) are increased. In this way, the operating speed can be maintained constant independent of variations in the fabrication process condition and the operating condition. In the case of the instant embodiment, response to the change in temperature is also taken into consideration. Consequently, performance of the circuit can be maintained substantially constant regardless of a variation in the ambient temperature as well as such variation in temperature as caused by differences in the amount of heat generated by the semiconductor device when in the standby state and when in the ordinary operating state, by way of example.

In connection with the above-mentioned expression (1), it is assumed that the values of factors $L_g$, $V_T$, $t_{ox}$ and $\beta_o$, are the same in both P-channel MOS transistor and N-channel MOS transistor. However, in actuality, these values differ from one to another element. However, in both P- and N-MOS transistors, difference is found only in respect to the polarities of voltage and current. Except for this difference, the relation given by the expression (1) is valid without need for any further modification. Accordingly, both MOS transistors are handled without discrimination except for the case where such discrimination is necessary.

As described hereinbefore, it is also contemplated by the invention to establish a desired dependence relation between the circuit speed and desired parameter(s) in place of the control for maintaining the operating speed of the circuit to be constant. By way of example, when it is desired to increase the operating speed of the circuit as a function of temperature rise, control may be made from the expression (1) in accordance with $$(V_{CONT}-V_T) T^{-n} \text{ instead of } (V_{CONT}-V_T) T^{-1.5} \text{ where n is selected greater than 1.5.} \quad (2)$$

Next, breakdown voltage will be considered. The dioxide breakdown voltage (dielectric breakdown strength) becomes lowered as the gate length $L_g$ and thickness $t_{ox}$ of the gate oxide film are decreased. In this connection, the control voltage $V_{CONT}$ may also be controlled in the manner illustrated in FIG. 7B. Further, because of the phenomenon discovered recently that the carriers of high energy generated in the vicinity of the drain domain of a MOS transistor are injected into the gate oxide film to thereby cause the threshold voltage to be increased, involving degradation of the characteristics such as lowering of the channel conductance, the breakdown voltage (referred to as the hot carrier breakdown voltage) defining the upper limit of the operation voltage becomes lower as the gate length $L_g$ and the gate oxide film thickness $t_{ox}$ become smaller with the temperature T being lower. To deal with this phenomenon, the voltage $V_{CONT}$ may be controlled in such a manner as illustrated in FIG. 7B. By virtue of such control, the problem of degradation of the characteristics can be avoided, even when the hot carrier breakdown strength is lowered due to deviations ascribable to the fabrication process condition. Besides, even when the threshold voltage is increased and/or when the channel conductance is decreased because of occurrence of the above-mentioned hot carrier phenomenon and other factors after operation for an extended period, the circuit characteristics can be maintained substantially constant through the control illustrated in FIG. 7B.

As pointed out hereinbefore, the embodiment shown in FIG. 7A is not restricted to the use of the CMOS inverter as the circuitry 2', but various other circuits can be employed. By way of example, a BiCMoS inverter shown in FIG. 8 may be employed. In that case, a higher speed can be realized because the output drive stage is constituted by the bipolar transistors. In the circuit configuration shown in FIG. 8, the collector of the bipolar transistor $Q_{N3}$ is connected to the external supply voltage $V_{CC}$. With this arrangement, a major proportion of the output current is supplied by the external power supply source $V_{CC}$, whereby the driving capability of the control circuit 3 can be decreased with the circuit design being correspondingly simplified. Parenthetically, in case the voltage withstanding capability of the bipolar transistor is low, the driving capability of the control circuit can be increased, wherein the control voltage $V_{CONT}$ is then applied to the collector of the bipolar transistor $Q_{N3}$. Circuits shown in FIGS. 9 and 10, respectively, may be employed as circuit 2' of FIG. 7A.

Figure 8:
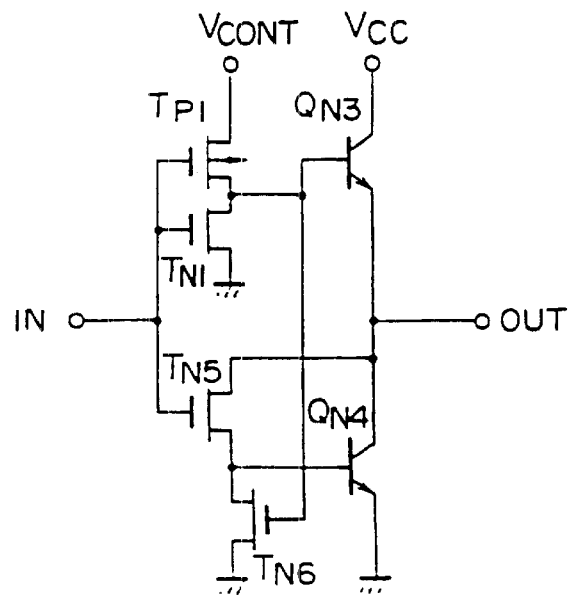
Figure 9:
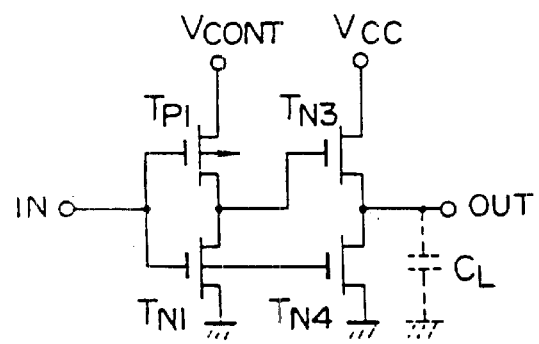

FIG. 9 shows a circuit arrangement in which the circuit shown in FIG. 7A is added with an output buffer circuit constituted by MOS transistors $T_{N3}$ and $T_{N4}$. The operation speed and the output voltage of the circuit shown in FIG. 9 are controlled by the control voltage $V_{CONT}$ as with the case of the circuit shown in FIG. 7A and is advantageous in that the driving capability of the control circuit 3 can be made smaller with the design being facilitated, as with the case of the circuit shown in FIG. 8, because the drive current for a load capacity connected to the output is supplied from the external supply source $V_{CC}$.

Figure 10:
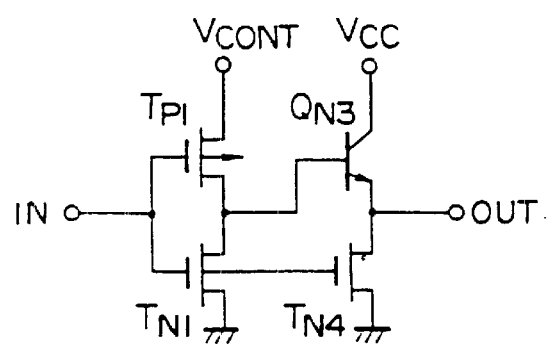

FIG. 10 shows a circuit arrangement which differs from the one shown in FIG. 9 in that the N-channel MOS transistor $T_{N3}$ in the latter circuit is replaced by the bipolar transistor $Q_{N3}$. Because of higher driving capability of the bipolar transistor $Q_{N3}$, the load can be driven at a higher speed, while the driving capability of the control circuit 3 (FIG. 7A) can be made smaller.

In the case of the embodiments shown in FIGS. 8 to 10, the circuit characteristics can be controlled with the aid of the control voltage $V_{CONT}$ in the manner similar to that of the circuit shown in FIG. 7A.

Figure 11A:
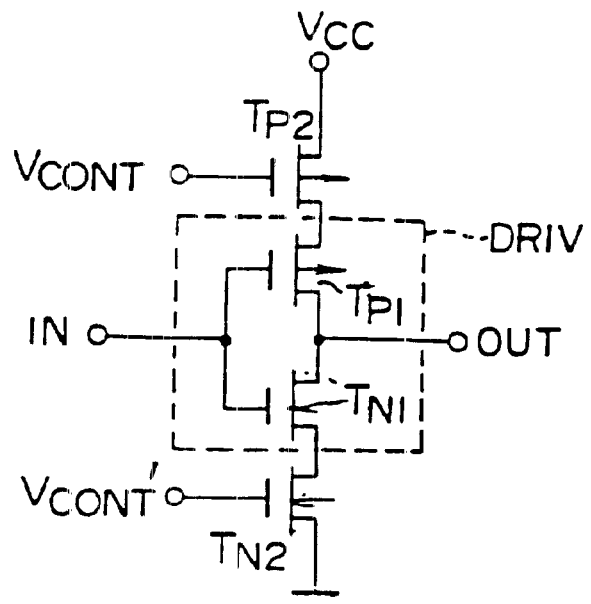

FIG. 11A shows another embodiment of the invention for controlling the characteristics of the driving circuit. This figure shows only the circuit portion corresponding to the elementary circuitry 2' shown in FIG. 7. A P-channel MOS transistor $T_{P2}$ and an N-channel MOS transistor $T_{N2}$ are inserted between the CMOS inverter constituted by P- and N-channel MOS transistors $T_{P1}$ and $T_{N1}$ and the external supply voltage $V_{CC}$ on one hand and the ground on the other hand, respectively, wherein the gate voltages $V_{CONT}$ and $V'_{CONT}$ of the MOS transistors $T_{P2}$ and $T_{N2}$ are controlled to thereby control the operation current of the CMOS inverter so that the operation speed is controlled. More specifically, the operation speed is increased as the current is increased and vice versa. The delay time $t_d$ exhibits a tendency similar to that given by the expression (1) for various variable factors. Accordingly, the gate control voltage $V_{CONT}$ for the P-channel MOS transistor $T_{P2}$ is varied from a large value to a small value while the gate control voltage $V_{CONT}$ for the N-channel MOS transistor $T_{N2}$ is varied from a small value to a large value, as the $L_g$, $V_T$, $t_{ox}$, $1/\beta_o$, T and $C_L$ are increased whereby the delay time $t_d$ can be maintained to be substantially constant.

In the instant embodiment, the operation current is supplied directly from the power supply source, wherein the control voltages $V_{CONT}$ and $V_{CONT}'$ can drive only the gates of the MOS transistors $T_{P2}$ and $T_{N2}$, respectively. Thus, the driving capability of the control circuit 3 can be made smaller, which in turn means that the circuit design can be extremely facilitated. Although the control is performed with both channel MOS transistors $T_{P2}$ and $T_{N2}$ in the instant embodiment, it falls within the purview of the invention to provide only one of these MOS transistors in dependence on the envisaged application. In conjunction with the embodiment shown in FIG. 11A, it is to be added that when the ON-resistances (resistance in the conducting state) of the MOS transistors $T_{P1}$ and $T_{N1}$ are greater than those of the transistors $T_{P2}$ and $T_{N2}$ by increasing the gate widths of the MOS transistors $T_{P1}$ and $T_{N1}$ when compared with those of the transistors $T_{P2}$ and $T_{N2}$ the output current can be determined by the ON-resistances of the MOS transistors $T_{P2}$ and $T_{N2}$, whereby the speed control can be greatly facilitated.

In the embodiment shown in FIG. 11, a MOS inverter is employed. It should however be understood that the invention is not restricted to a MOS inverter but can equally be applied to various types of logic circuits such as a NAND circuit, NOR circuit or the like. To this end, the circuit portion denoted by DRIV may be replaced by a logic circuit imparted with the driving function.

Figure 11B:
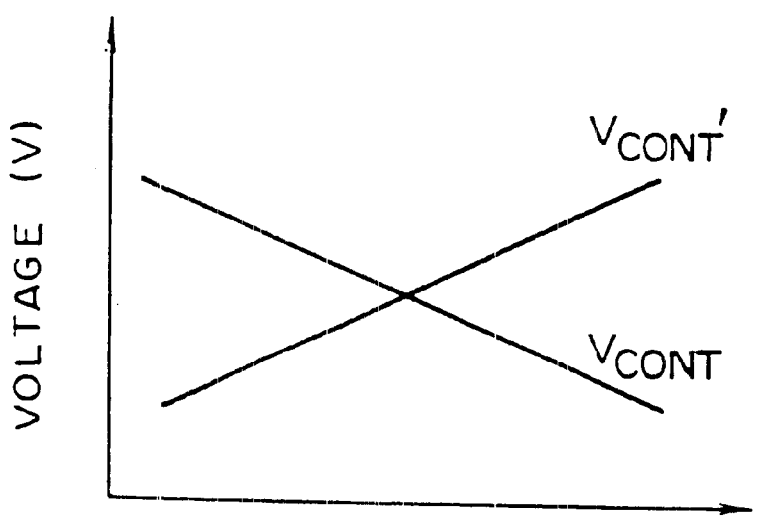
Figure 12A:
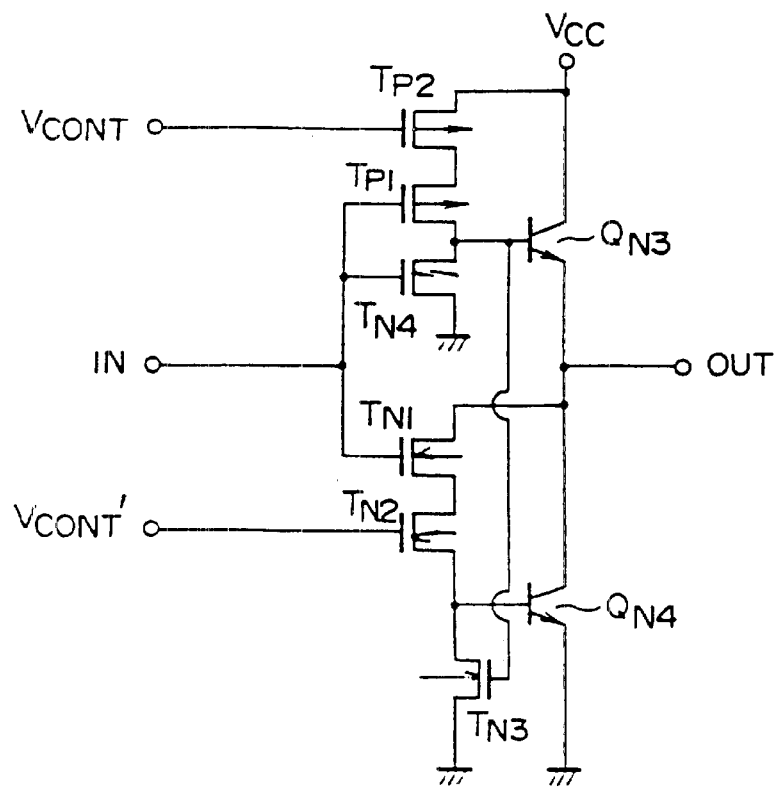
Figure 12B:
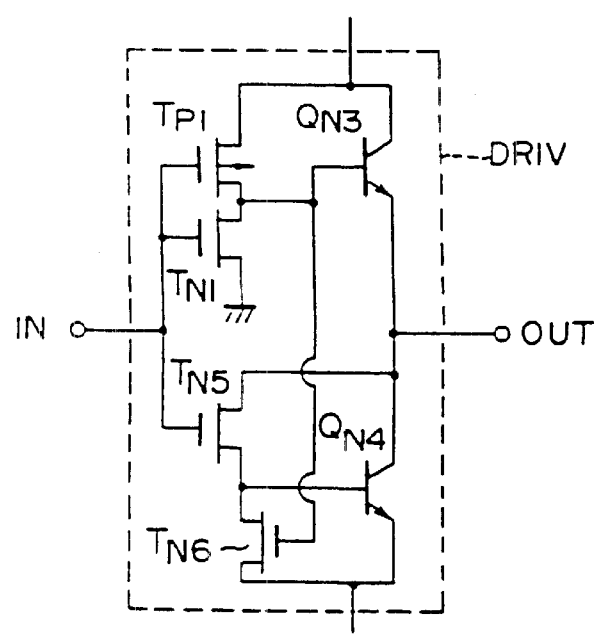

FIGS. 12A and 12B show further embodiments of the present invention in which the control principle described in reference to FIG. 11 is applied to a BiCMOS drive circuit which has a higher driving capability as compared with the CMOS circuit. As is well known in the art, in the BiCMOS circuit, the base current is fed to the base of a bipolar transistor from a MOS transistor to be amplified by the bipolar transistor for driving a load capacitance. Accordingly, the circuit operation speed can be controlled by controlling the base current with the circuit of such configuration as shown in FIG. 12A. Referring to this figure, when the input IN assumes a low level, P-channel transistor $T_{P2}$ and N-channel MOS transistor $T_{N3}$ are turned on, being followed by turn-off of N-channel MOS transistors $T_{N4}$ and $T_{N1}$. As the result, the bipolar transistor $Q_{N3}$ is turned on with the transistor $Q_{N4}$ being turned off. In this state, the base current flowing through the bipolar transistor $Q_{N3}$ can be controlled by the P-channel MOS transistor $T_{P2}$ having the gate supplied with the control voltage $V_{CONT}$. Thus, the operation speed can be controlled with the aid of the control voltage $V_{CONT}$ when the output is charged. On the other hand, when the input IN assumes a high level, the bipolar transistor $Q_{N3}$ is turned off with the transistor $Q_{N4}$ being also turned on, whereupon discharge of the output is initiated. At that time, the base current of the bipolar transistor $Q_{N4}$ is supplied from the output OUT. This base current can be controlled by the control voltage $V_{CONT}$, which in turn means that the discharge rate of the output can be controlled by the control voltage $V_{CONT}$. In this manner, the operation speed of the BiCMOS drive circuit according to the instant embodiment can be controlled. In conjunction with the above-mentioned operation speed control of the BiCMOS drive circuit, it should be mentioned that the circuit position DRIV shown in FIG. 11A may be simply replaced by a BiCMOS circuit shown in FIG. 12B. In that case, the current is determined by the MOS transistors $T_{P2}$ and $T_{N2}$ shown in FIG. 11A.

Consequently, more accurate control can be accomplished when compared with the control only of the base current as with the case of the BiCMOS circuit shown in FIG. 12A. Further, since the capacity of the MOS transistors constituting the circuit portion DRIV can be reduced by the driving capability of the bipolar transistors, there can be achieved an advantage that the input capacity as observed from the side of input IN is small. In other words, high operation speed can be realized because the load in the preceding stage is reduced.

Figure 13:
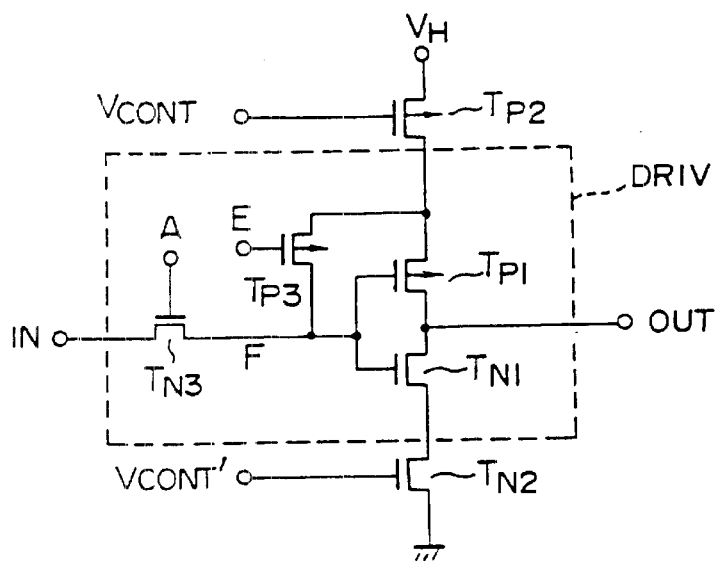
Figure 14:
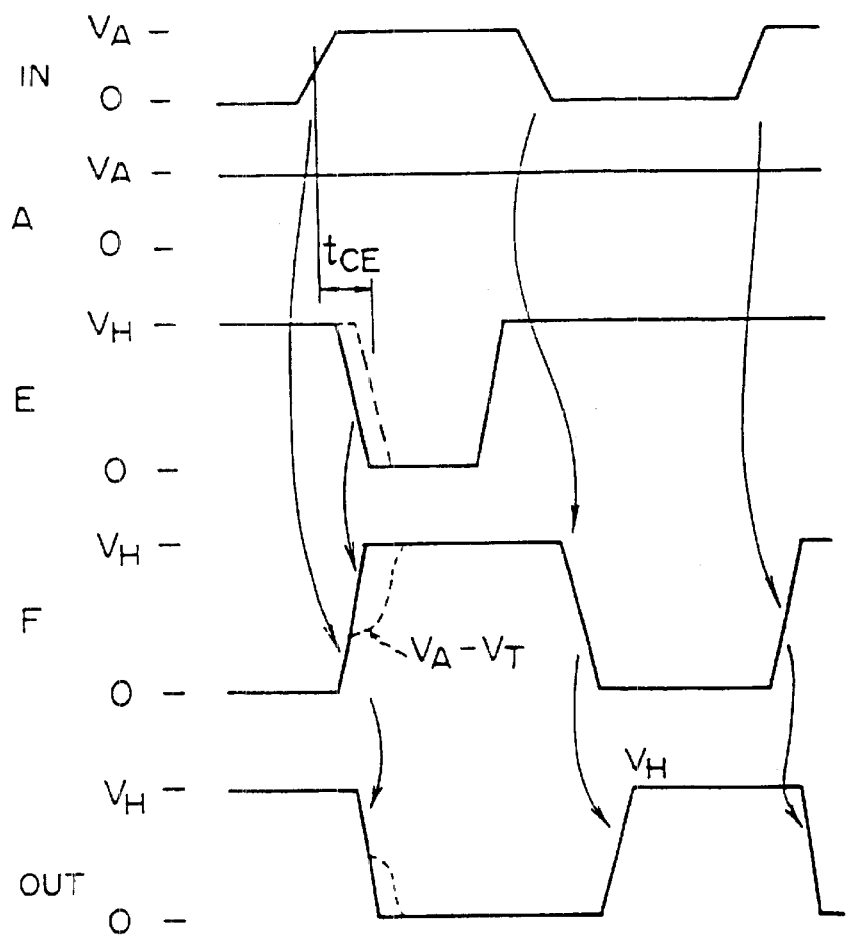

The method of controlling the current by inserting the MOS transistor between the power supply source and the driving circuit DRIV, as is shown in FIG. 11A, can find other applications. FIG. 13 shows another embodiment of the invention which is applied to a level conversion circuit for deriving a large output amplitude from an input amplitude. Operation of the level conversion circuit will be described by reference to FIG. 14. When the input IN assumes a high level $V_A$ in the state where a high potential is applied to the gate E, potential at a circuit point F assumes a value represented by $(V_A-V_T)$ by way of the N-channel MOS transistor $T_{N3}$. Subsequently, when the potential at E becomes low, the P-channel MOS transistor $T_{P1}$ is turned off with the N-channel MOS transistor $T_{N1}$ being on, whereupon the output OUT assumes a level of zero volt. When the potential at F rises up to a level $V_H$, potentials at A and C are at a level $V_A$ with the MOS transistor $T_{N3}$ being off. Accordingly, the potential at the circuit point F is protected against being lowered due to the current flow from the circuit point F toward IN. On the other hand, when the input IN assumes a low potential level in the state in which E is at a high potential, the MOS transistor $T_{N3}$ is turned on, resulting in that the circuit point F assumes the same low potential level as that at IN. As a consequence, the MOS transistor $T_{P1}$ is turned on with $T_{N1}$ being tuned off, whereby the output OUT is charged to the high level $V_H$. In connection with this circuit, it is noted that when a period $t_{CE}$ intervening between the time point at which IN assumes the high level $V_A$ and the time point at which the potential at E become low is long, as indicated by a broken line in FIG. 14, the potential at the circuit point F remains at $V_A-V_T$. Then, there may arise such a situation in which a penetration current flows through the MOS transistors $T_{P1}$ and $T_{N1}$, respectively, giving rise to occurrence of a period during which the output OUT remains at an inadequately low potential level. For this reason, it is desirable to shorten the duration of the period $t_{CE}$. This can be achieved by changing over the potential at E to a low potential level simultaneously when the input IN assumes the high level. In this way, the problem mentioned above can be solved.

As will now be appreciated, in the case of the circuit arrangement shown in FIG. 13, the amplitude $V_A$ of the input IN can be transformed to a large amplitude V. At that time, since the current can be controlled by the MOS transistors $T_{P2}$ and $T_{N2}$, the circuit can be operated at a desired constant speed. The circuit configuration shown in FIG. 13 can be effectively and advantageously utilized as a circuit for deriving a high output voltage from an input voltage, as exemplified by a word driver circuit for a dynamic memory.

Figure 15:
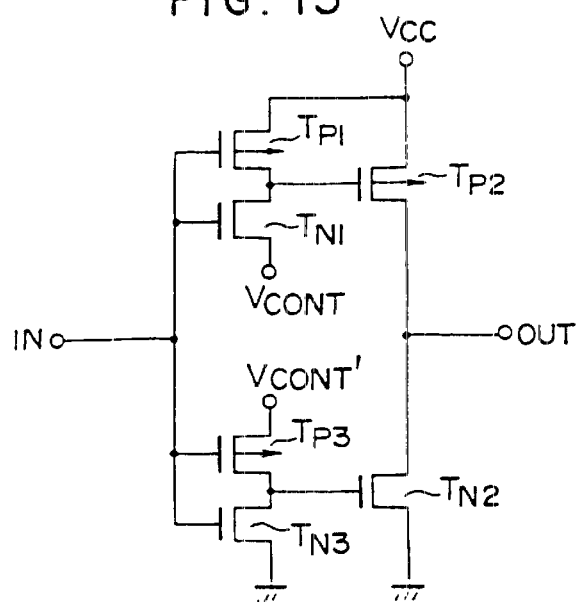

FIG. 15 shows another embodiment of the invention for controlling the operation speed of a driver circuit. In this circuit, the inverter is implemented so as to receive directly the output from the current control MOS transistor in the circuit shown in FIG. 11A. Referring to FIG. 15, when the input voltage assumes a high level, the P-channel MOS transistors $T_{P1}$ and $T_{P3}$ are turned off with N-channel MOS transistors $T_{N1}$ and $T_{N3}$ being turned on. As a result, the control voltage $V_{CONT}$ is applied to the gate of the P-channel MOS transistor $T_{P2}$, while the potential at the gate of the N-channel MOS transistor $T_{N2}$ assumes zero volt. As a consequence, the gate of the P-channel MOS transistor $T_{P2}$ is supplied with the control voltage $V_{CONT}$, while the gate potential of the N-channel MOS transistor $T_{N2}$ becomes zero volt. Accordingly, the P-channel transistor $T_{P2}$ is turned on with the N-channel transistor $T_{N2}$ being turned off, whereby a current controlled to a desired value by the control voltage $V_{CONT}$ is obtained at the output to charge a load. In contrast, when the level of the input IN becomes low, the P-channel MOS transistor $T_{P2}$ is turned off while the N-channel MOS transistor $T_{N2}$ is turned on to thereby initiate the discharge operation, whereupon the output OUT assumes zero volt level. Since the voltage $V_{CONT}$ is applied to the gate of the N-channel MOS transistor $T_{N2}$ at this time point, the rate of discharge can also be controlled. The embodiment shown in FIG. 15 is very suitable for high-speed operation because of the absence of a serial connection of two MOS transistors between the power supply source and the output OUT. Further, the control can be much facilitated when compared with the circuit shown in FIG. 11A where influences of a variation in the characteristics of two serially connected transistors has to be taken into consideration.

Figure 16:
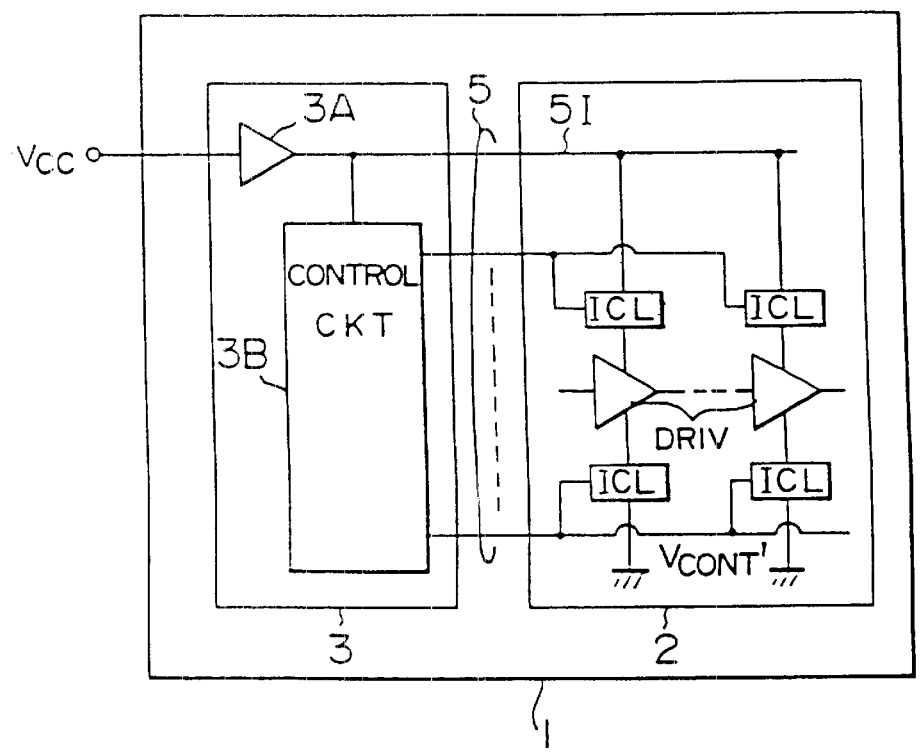

In the foregoing, various methods of controlling the operation speed of the driver circuit have been explained. In this conjunction, it will be noted that the external voltage $V_{CC}$ is utilized in the circuits shown in FIGS. 12 to 15. Under the circumstances, there may possibly arise such problem that difficulty is encountered in compensating for the variation in the external voltage $V_{CC}$. To cope with this problem, it is possible to incorporate the voltage conversion or transformer circuit 3A in the control circuit 3, as shown in FIG. 5, for thereby maintaining the output voltage $V_I$ to be constant, in order to realize the stabilized operation of the internal circuit notwithstanding of variation in the external voltage $V_{CC}$. In this case, when the internal voltage $V_I$ is set at low level, the small or fine elements having low voltage withstanding capability or breakdown strength can be operated stably. FIG. 16 shows another exemplary embodiment of the invention in which the voltage transformer circuit mentioned above is provided on the chip. In FIG. 16, a reference symbol 5I denotes a power supply line for supplying a voltage $V_I$ to the internal circuit 2 and a circuitry 3B incorporated in the control circuit from the voltage transformer circuit 3A. Further, a reference symbol ICL denotes current control circuits for controlling the current to the individual circuits DRIV such as MOS transistors $T_{P2}$, $T_{N2}$ shown in FIG. 11A. With this circuit arrangement, fine elements of small size can be operated stably with the constant voltage $V_I$, independent of the external voltage $V_{CC}$, at desired speeds corresponding to the functions of the individual circuitries.

Figure 17:
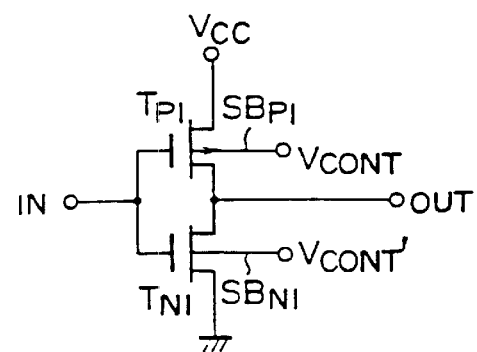

FIG. 17 shows a further embodiment of the present invention adapted to control the operation speed of a CMOS inverter. According to this embodiment, voltages of substrates SBP1 and SBP2 of P-channel MOS transistor $T_{P1}$ and N-channel MOS transistor $T_{N1}$ are controlled to thereby control the threshold voltages of these transistors $T_{P2}$ and $T_{N1}$ for controlling ultimately the operation characteristics of the inverter. The instant embodiment is advantageously suited to compensate for variation in the characteristics brought about by a fluctuation of the threshold voltage.

Although the embodiment shown in FIG. 17 is intended for application to the CMOS inverter, it should be noted that the instant embodiment can be equally applied to other circuits such as a BiCMOS inverter in which MOS transistors are employed. Besides, it is to be added that the control of the substrate voltages may be combined with the other control methods described hereinbefore.

The foregoing description made by reference to FIGS. 7 to 17 is primarily directed to the methods of controlling the characteristics of the driver circuits such as inverters, non-inverters NAND circuits and others. It is however noted that a differential amplifier in the form of an integrated circuit for producing an output in dependence on a difference between input voltages is also used widely. The following description will be made of the embodiments of the invention applied to the differential amplifiers.

Figure 18:
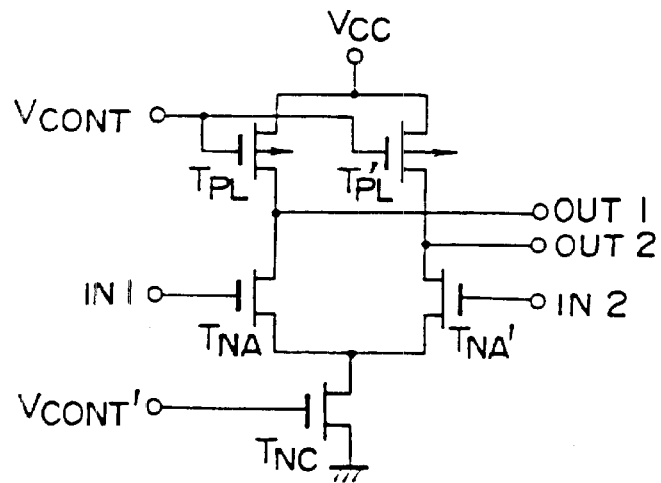

FIG. 18 shows an embodiment of the invention in which the control method described hereinbefore with reference to FIG. 11A is applied to the control of operation speed of a differential amplifier constituted by MOS transistors. In FIG. 18, reference symbols IN1 and IN2 denote differential input terminals, and OUT1 and OUT2 denote differential output terminals. In the case of this differential amplifier, the operation speed varies in dependence on deviations in the fabrication process condition as well as variations in the operating condition in a manner similar to the case of the device shown in FIG. 11A. Accordingly, by varying the control voltages $V_{CONT}$ and $V_{CONT'}$ in a similar manner as illustrated in FIG. 11B to thereby vary the operation current correspondingly, it is possible to control the operation speed with the fabrication process condition and the operating condition being taken into account. The output voltage of this differential amplifier is determined by a product of the operation current and ON-resistances (i.e. resistance in the conducting state) of the load MOS transistors $T_{PL}$ and $T_{PL}$. Accordingly, by controlling the control voltages $V_{CONT}$ and $V_{CONT'}$ so that the ratio between the ON-resistance of the MOS transistor $T_{NC}$ which determines the operation current and the ON-resistance of the load MOS transistors $T_{PL}$ and $T_{PL}$, is constant, the operation speed can be controlled while holding constant the output voltage, i.e. the product of the operation current and the ON-resistances of the transistors $T_{PL}$ and $T_{PL}$.

Figure 19:
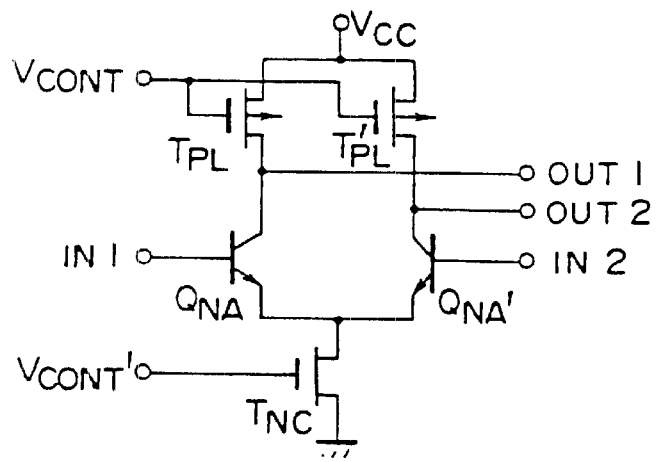

FIG. 19 shows another embodiment of the invention which differs from that shown in FIG. 18 in that the MOS transistors $T_{NA}$ and $T_{NA'}$, shown in FIG. 18 are replaced by NPN-bipolar transistors $Q_{NA}$ and $Q_{NA'}$, respectively. With the circuit configuration shown in FIG. 19, substantially the same effects as those of the circuit shown in FIG. 18 can be achieved. Moreover, the amplification factor can be increased.

Figure 20:
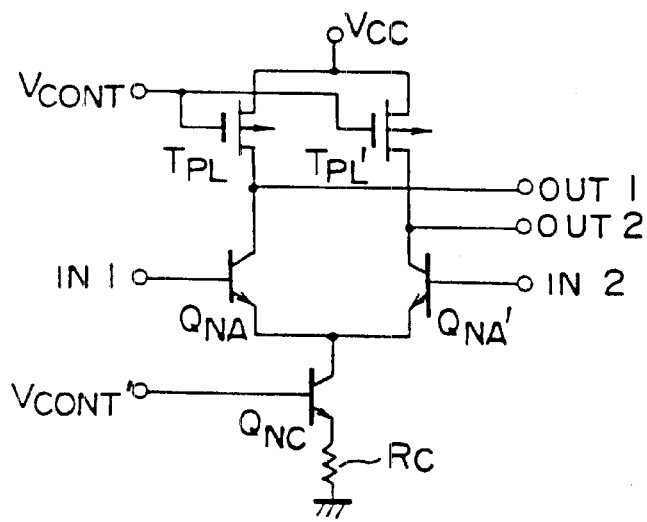

FIG. 20 shows a second version of the embodiment shown in FIG. 19. In the version shown in FIG. 20, the current control transistor $T_{NC}$ shown in FIG. 19 is replaced by an NPN-bipolar transistor $Q_{NC}$ and a resistor $R_C$. With the circuit configuration shown in FIG. 20, the operation speed can be controlled as with the case of the embodiments shown in FIGS. 18 and 19. Furthermore, the amplification factor can be increased because the operation current is made to be more constant.

In case application of the external voltage $V_{CC}$ presents a problem in respect to the dielectric breakdown strength or variation in the characteristics brought about by fluctuation in the voltage $V_{CC}$, a desired voltage can be derived by providing the voltage limiter or transformer circuit 3A on chip, as in the case of the embodiment shown in FIG. 5.

In the foregoing, various preferred embodiments for controlling the elementary circuitries constituting the internal circuit 2 (FIGS. 1 to 5) have been described. Next, description will be turned to exemplary embodiments of the control circuit 3.

Figure 21:
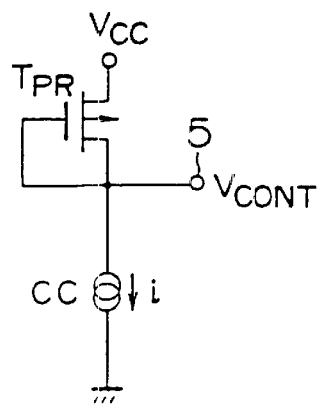

FIG. 21 illustrates a first embodiment of the control circuit 3. In this figure, a reference symbol $T_{PR}$ denotes a P-channel MOS transistor and CC denotes a constant current power source for supplying a constant current i. According to this embodiment, a gate voltage required for causing a constant current to flow through the P-channel MOS transistor $T_{PR}$ is constantly outputted regardless of deviation in the fabrication process condition, i.e. deviation in the gate length, threshold voltage, gate oxide film thickness and other factor as well as variation in the operating condition. Accordingly, this embodiment is advantageously suited for use as the control voltage ($V_{CONT}$) generating circuit to be used in combination with the circuits described hereinbefore by reference to FIGS. 11A, 12 and 13, FIG. 15 and FIGS. 18 to 20, respectively. The P-channel MOS transistor $T_{PR}$ shown in FIG. 21 is connected to the transistor $T_{P2}$ shown in FIGS. 11A, 12, and 13, and FIG. 15 or the transistors $T_{PL}$ and $T_{PL'}$, shown in FIGS. 18 to 20 in the form of a current mirror connection well known in the art. Accordingly, by appropriately selecting the size of the transistor $T_{P2}$ or $T_{PL}$ and $T_{PL}$, relative to that of the transistor $T_{PR}$, the operation current in the concerned circuits can be controlled to a given constant value.

Figure 22:
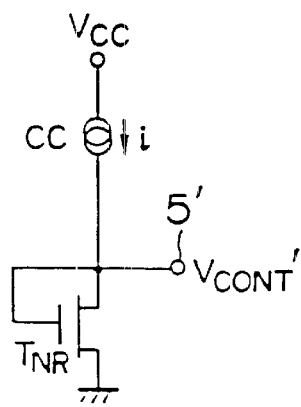

FIG. 22 shows another embodiment of the control circuit (3) which differs from the one shown in FIG. 21 in that an N-channel MOS transistor is employed. The control circuit shown in FIG. 22 is optimal for use as the control voltage ($V_{CONT}$) generating circuit in combination with the circuits shown in FIGS. 11A, 12, and 13, FIG. 15 and FIGS. 18 and 19, respectively. With the circuit of FIG. 22, substantially the same effects as those of the circuit shown in FIG. 21 can be achieved.

Figure 23:
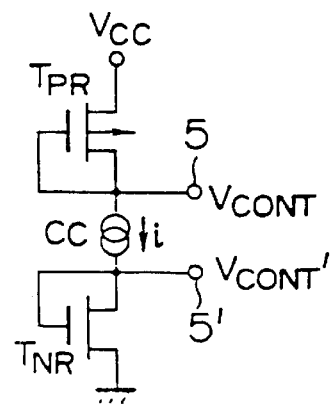

FIG. 23 shows another embodiment of the invention which corresponds to a combination of the circuits shown in FIGS. 21 and 22. With this circuit arrangement, the control voltages $V_{CONT}$ and $V_{CONT'}$ for the circuits shown in FIGS. 11A, 12 and 13, FIG. 15 and FIGS. 18 and 19, respectively, can be generated simultaneously. Additionally, since these control voltages $V_{CONT}$ and $V_{CONT'}$ are generated on the basis of one and the same constant current power supply source, there can be obtained the control voltages ($V_{CONT}$ and $V_{CONT'}$) of extremely high stability and mutual match ability.

Figure 24:
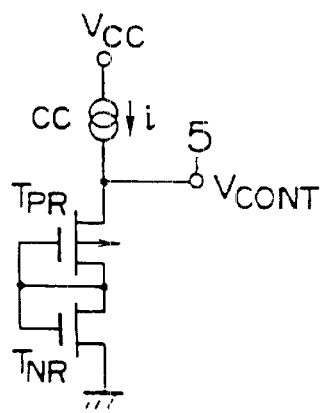

FIG. 24 shows still another concrete example of the control circuit (3) which is realized by a serial connection of a P-channel MOS transistor $T_{PR}$ and an N-channel MOS transistor or $T_{NR}$ for generating the control voltage $V_{CONT}$. With this circuit configuration, the value of the control voltage $V_{CONT}$ undergoes influence of deviations in the process conditions in fabrication of the P- and N-channel MOS transistors as well as variations in the operating conditions. Accordingly, this circuit can be advantageously used as the $V_{CONT}$-generating circuit m the devices shown in FIGS. 7 to 10, respectively.

Figure 25:
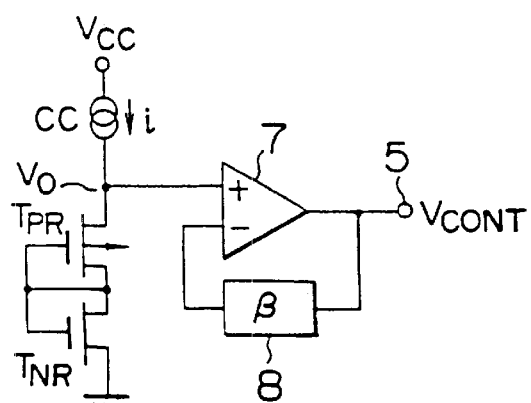

FIG. 25 shows another embodiment of the control circuit (3) according to the invention which differs from that shown in FIG. 24 in that an amplification circuit composed of an amplifier 7 and a feedback circuit having a feedback ratio β is additionally provided on the output side. By selecting a sufficiently large value for the amplification factor, the output control voltage $V_{CONT}$ is given by $$V_{CONT} = \frac{V_o}{\beta} \tag{3}$$

Thus, by setting the feedback ratio β at an appropriate value, the control output voltage $V_{CONT}$ of a desired value can be obtained. Accordingly, in addition to reflecting the influence of deviation in the fabrication process condition as well as variation in the operating condition to the value of the voltage $V_O$, it is also possible to take into account the dependency of the fabrication process condition and the operating condition in determining the feedback ratio β. In other words, the influence of deviation in the fabrication process condition and variation in the operating condition to the control voltage $V_{CONT}$ can be properly taken into consideration by selecting appropriately the feedback ratio β.

Figure 26:
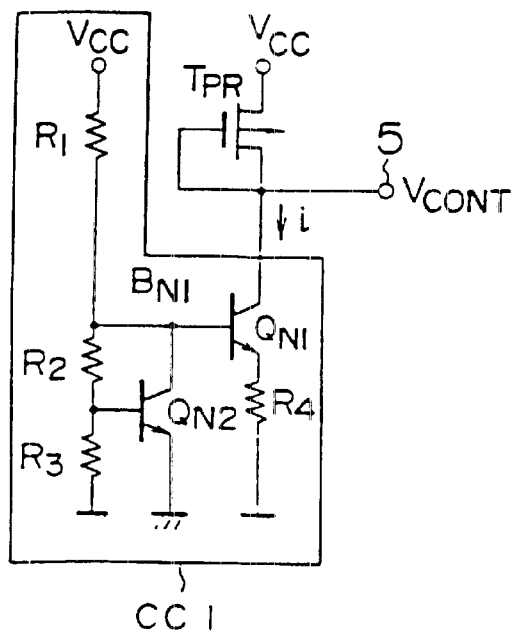

FIG. 26 shows a concrete example of the constant current power source CC. As will be seen in this figure, the constant current power source $C_{C1}$ is constituted by resistors $R_1$ to $R_4$ and NPN-bipolar transistors $Q_{N1}$ and $Q_{N2}$. According to this embodiment of the present invention, the base voltage $B_{N1}$ of the bipolar transistor $Q_{N1}$ assumes a constant value given by $V_{BE}(R_2+R_3)/R_3$, provided that the current amplification factor of the bipolar transistor is sufficiently large. In the above expression, VBE represents a forward voltage between emitter and base of the bipolar transistor.

Accordingly, a constant current i given by the following expression can flow.

$$i = \left[\left(V_{BE}R_2 + \frac{R_3}{R_3}\right) - V_{BE}\right]/R_4 \tag{4}$$

$$= V_{BE}\frac{R_2}{R_3 \times R_4}$$

Since the base-emitter voltage $V_{BE}$ is substantially insusceptible to the deviation in the fabrication process condition, there can be outputted a stable current.

Since the current, flows toward the ground from the external source, this embodiment is advantageously suited for use as the constant current power source in such circuit as shown in FIG. 21.

Figure 27:
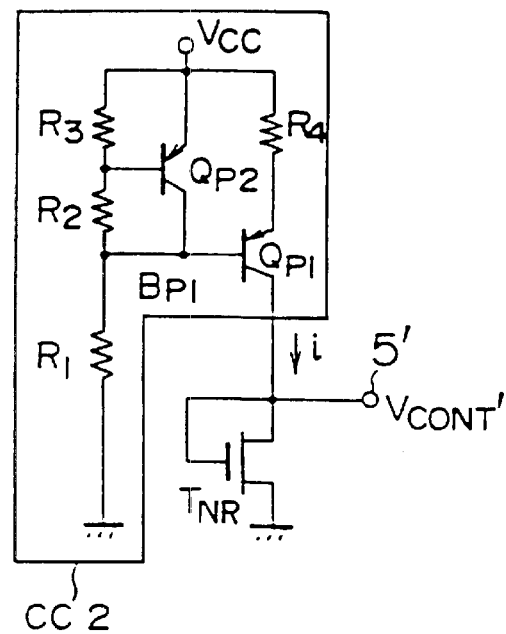

FIG. 27 shows another embodiment of the constant current power source which is realized by using PNP-bipolar transistors $Q_{P1}$ and $Q_{P2}$. Operation of this constant current circuit is utterly same as that of the circuit shown in FIG. 26 with only a difference in the polarity of voltage and current. Because of the circuit configuration in which the current i flows out from the voltage source $V_{CC}$, this circuit is very suitable for the constant current source in the circuit such as shown in FIG. 25.

Figure 28:
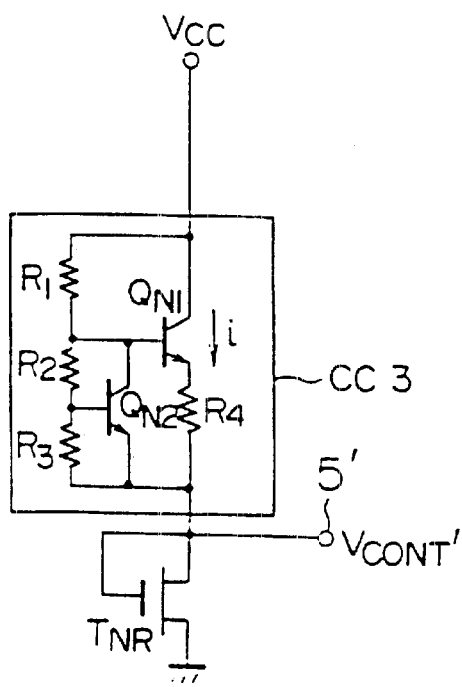

FIG. 28 shows still another embodiment of the constant current source of the type in which the current flows out from a voltage supply source as in the case of the circuit shown in FIG. 27. The constant current source shown in FIG. 28 is however realized by using NPN-bipolar transistors $Q_{N1}$ and $Q_{N2}$. In the case of this embodiment, there is a problem that the operation current flowing through the resistors $R_1$, $R_2$ and $R_3$ and the NPN-bipolar transistor $Q_{N2}$ is added to the constant current. However, influence of the above-mentioned operation current may be neglected by setting the current amplification factor of the transistor $Q_{N1}$ at a sufficiently large value.

Figure 29:
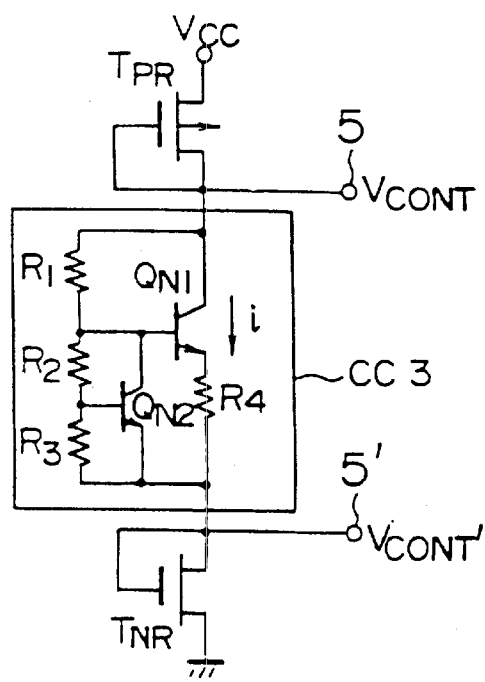

According to the embodiment of the invention shown in FIG. 29, the constant current supply source of the type in which the current flows out from the voltage supply source $V_{CC}$ can be fabricated in a facilitated manner by using NPN-bipolar transistors of high performance. Parenthetically, the constant current supply source shown in FIG. 29 can be used either in an arrangement in which the current flows into the current source circuit or in an arrangement in which the current flows out from the current source circuit By taking advantage of this feature, FIG. 29 shows an application of the above-mentioned constant current supply source to the circuit shown in FIG. 23. With the circuit configuration shown in FIG. 29, the control voltages $V_{CONT}$ and $V_{CONT'}$ simultaneously.

Figure 30:
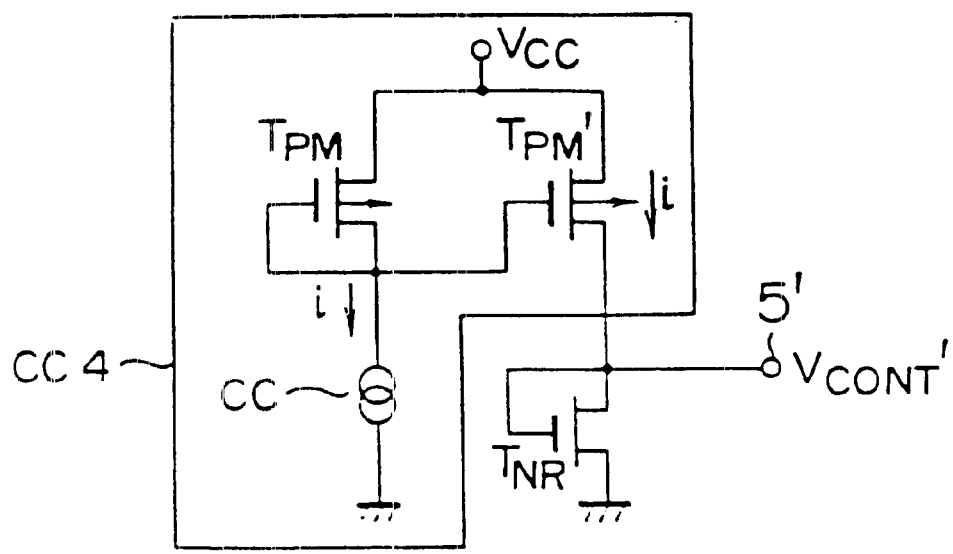

FIG. 30 shows a further embodiment of a constant current supply source of the type in which the current flows out from the voltage supply source $V_{CC}$ and which is realized by a current mirror circuit constituted by a current source CC implemented such that the current flows to the ground as in the case of the constant current source shown in FIG. 26 and P-channel MOS transistors $T_{PM}$ and $T_{PM'}$. By realizing the transistors $T_{PM}$ and $T_{PM'}$ in a same size, a current having a same value as the output current i of the current source CC can be derived externally from the voltage supply source. By inputting this current to the N-channel transistor $T_{NR}$ as in the case of the circuit shown in FIG. 22, the control voltage $V_{CONT'}$ can be obtained. According to the instant embodiment, the output can be determined rather arbitrarily for the current value of the current source CC by selecting appropriately the ratio in size between the P-channel MOS transistors $T_{PM}$ and $T_{PM}$.

Figure 31:
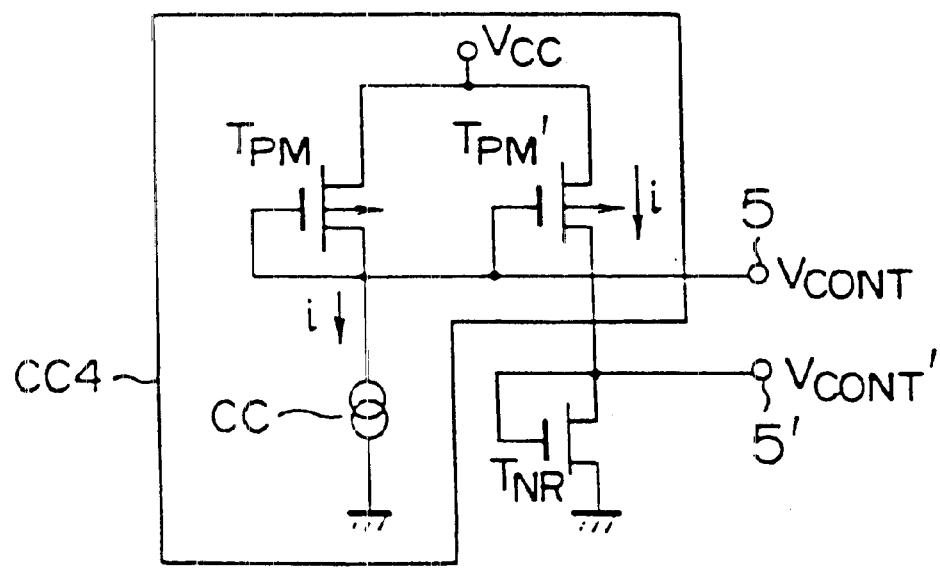

FIG. 31 shows a modification of the constant current supply source shown in FIG. 30. According to the instant embodiment shown in FIG. 30, the voltage generated through cooperation of the P-channel MOS transistor $T_{PM}$ and the current source CC is utilized as the control voltage $V_{CONT}$. With this arrangement, by the control voltages $V_{CONT}$ and $V_{CONT}$, simultaneously, wherein the characteristics of both voltages can be controlled with an improved match ability, to further advantage.

Figure 32:
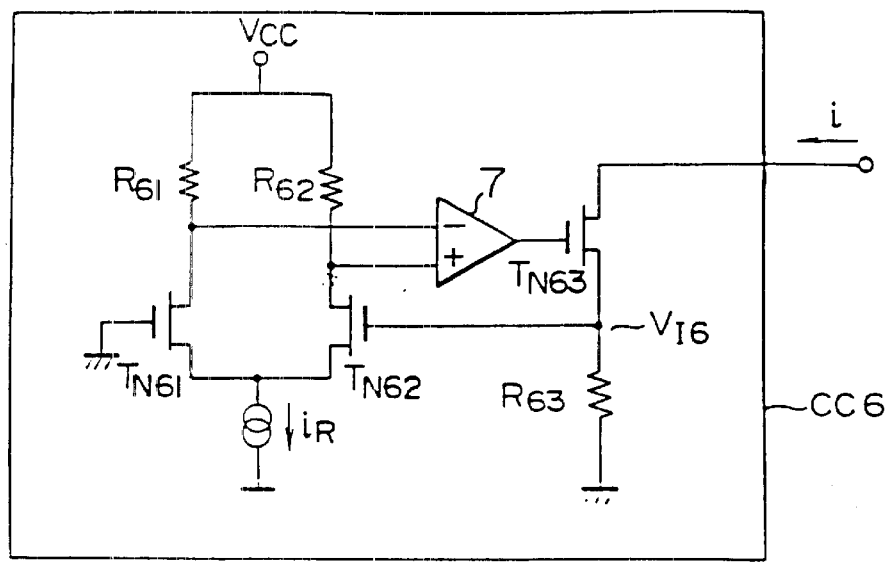

FIG. 32 shows another embodiment of the constant current supply source having a high stability and realized by using MOS transistors.

In this figure, $T_{N61}$ to $T_{N63}$ designate N-channel MOS transistors, respectively, wherein the MOS transistor $T_{N61}$ has a negative threshold voltage while the transistor $T_{N62}$ has a positive threshold voltage. The threshold voltage of the MOS transistor $T_{N63}$ may be positive or negative. Symbols $R_{61}$ to $R_{63}$ designate resistors, and 7 denotes a differential amplifier.

By setting the resistors $R_{61}$ and $R_{62}$ at a same value while realizing the transistors $T_{N61}$, and $T_{N62}$ in the same size, the currents flowing to the $T_{N61}$ and $T_{N62}$ become equal to each other. Consequently, the gate voltage $V_{I6}$ of the transistor $T_{N62}$ has a value equal to a difference between the threshold voltages of the transistors $T_{N6}$, and $T_{N62}$. In this connection, it should be noted that the value of a difference between these threshold voltages is held substantially constant independent of the fabrication process condition and the operating condition.

In the circuit described above, the drain current and the source current of the N-channel MOS transistor $T_{N63}$ are equal to each other. Accordingly, the output current i is given by $$i = \frac{V_{I6}}{R_{63}} \tag{5}$$

Thus, the output current having the same characteristics as the gate voltage $V_{16}$ can be obtained, wherein the value of the output current can be controlled arbitrarily with the aid of the resistor $R_{63}$.

The constant current supply source according to the instant embodiment can be used as the current supply source CC in the circuit shown in FIG. 31 as well as other circuits to make possible the characteristic of high stability control.

Further, according to the above-mentioned embodiment, the circuit can be implemented even without resorting to the use of the bipolar transistors and thus is suited for the integrated circuit constituted by using MOS transistors.

Figure 33:
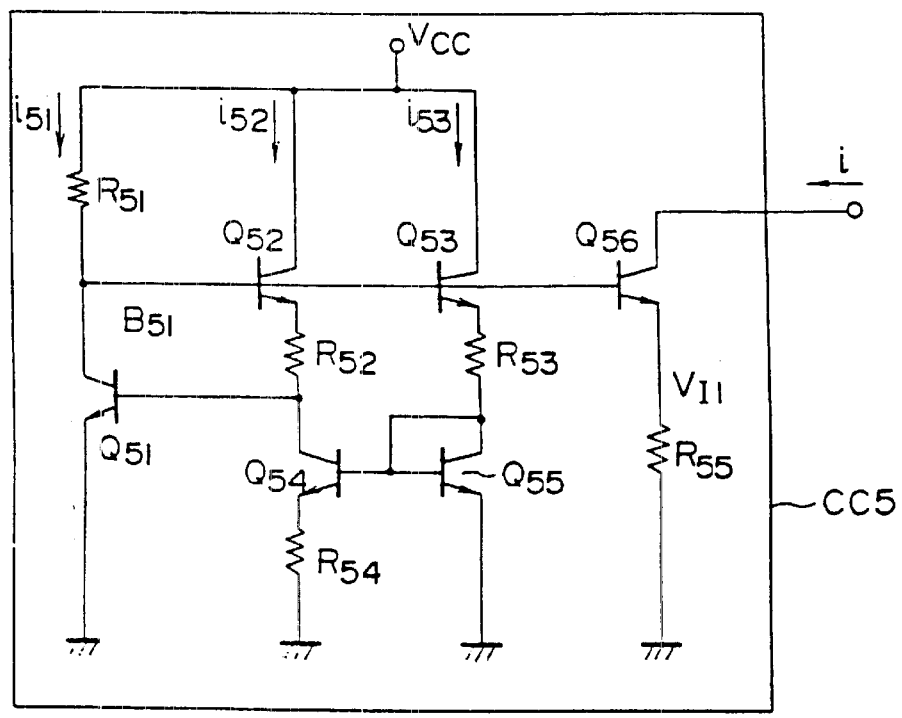

FIG. 33 shows a further embodiment of the constant current supply source advantageously suited to use with the circuits shown in FIGS. 21 to 25 and FIGS. 30 and 31. According to this embodiment, a current generator known per se is made use of as the constant current supply source which can supply a current which is highly stabilized against fluctuations in the source voltage and the ambient temperature among others Referring to FIG. 33, reference symbols $Q_{51}$ to $Q_{56}$ designate bipolar transistors and $R_{51}$ to $R_{55}$ designate resistors, respectively. These elements cooperate to generate a constant current i having desired temperature characteristics. Further, reference symbol 41 represents a current flowing through the resistor $R_{51}$, $i_{42}$ represents a collector current of the bipolar transistor $Q_{52}$ and $i_{53}$ represents a collector current of the bipolar transistor $Q_{53}$. Before entering into discussion about the output current i, description of the temperature dependency of the value of internal voltage $V_{II}$, will be given. For the sake of simplification, it is assumed in the following description that the value of the base current of the bipolar transistor can be neglected when compared with that of the collector current thereof and that the collector current is approximately equal to the emitter current. The voltage $V_{II}$ can be given by the following expression $$V_{II} = V_{BE}(Q_{51}) + I_{52} \times R_{52} + R_{52}V_E(Q_{52}) - V_{BE}(Q_{56}) \tag{6}$$

where $V_{BE}(Q_{51})$, $V_{BE}(Q_{52})$ and $V_{BE}(Q_{56})$ represent base-emitter forward voltages, respectively. The current $I_{52}$ appearing in the expression (4) is given by $$I_{52} = (V_{BE}(Q_{55}) - V_{BE}(Q_{54}))/R_{54} \tag{7}$$

When the current density in the bipolar transistor $Q_{55}$ is set at a value n times as large as that of the polar transistor $Q_{54}$ by appropriately selecting emitter areas of the bipolar transistors $Q_{55}$ and $Q_{54}$, the following relation is valid:

$$I_{52} = \frac{1}{R_{54}} \times \frac{kT}{q} l_n n \tag{8}$$

In the above expression (6), k represents Boltzmann's factor, T represents absolute temperature, and q represents electron charge. From expressions (4) to (6), the following relation can be derived:

$$V_{II} = V_{BE}(Q_{51}) + \frac{R_{52}}{R_{54}} \times \frac{kT}{q} l_n n + V_{BE}(Q_{52}) - V_{BE}(Q_{56}) \tag{9}$$

Accordingly, by designing such that the emitter current densities of the bipolar transistors $Q_{52}$ and $Q_{56}$ are equal to each other, the third and fourth terms in the right side of the expression (7) are canceled. Accordingly, $$V_{II} = V_{BE}(Q_{51}) + \frac{R_{52}}{R_{54}} \times \frac{kT}{q} l_n n \tag{10}$$

Thus, the temperature dependency of the voltage VII is given by $$\frac{\partial V_{II}}{\partial T} = \frac{\partial V_{Be}(Q_{51})}{\partial T} + \frac{R_{52}}{R_{54}} \times \frac{k}{q} l_n n \tag{11}$$

As is well known, the base-emitter voltage of the bipolar transistor exhibits a negative temperature dependency. Accordingly, by varying the ratio n of the emitter current density between the bipolar transistors $Q_{55}$ and $Q_{54}$ or the ratio between the resistance $R_{52}$ and $R_{54}$, $\partial V_{II}/\partial T$ given by the expression (9) can be set at an arbitrary value. In view of the fact that the value of $V_{II}$ obtained at the temperature coefficient set at zero is around 12 volt, which is substantially equal to the band-gap voltage of the silicon semiconductor, the circuit under consideration is generally referred to as a band-gap generator.

In the circuit described above, the collector current of the bipolar transistor $Q_{56}$ is substantially equal to the emitter current thereof. Accordingly, the output current i can be expressed as follows:

$$i = \frac{V_{II}}{R_{55}} \qquad (12)$$

In this way, there can be obtained the output current which has the characteristics as the internal voltage $V_{II}$ and whose value can be controlled arbitrarily with the aid of the resistor $R_{55}$.

Employment of the instant embodiment as the constant current supply source in the various embodiments described hereinbefore make possible control with extremely high stability. In conjunction with the temperature, among others, the operation characteristics of the circuit can be controlled in an arbitrary manner by setting the temperature coefficient of the constant current supply source at zero or alternatively at a given positive or negative value.

Further, the internal voltage $V_{II}$, in the circuit according to the instant embodiment can be used as a constant voltage supply of high stability. In this connection, it is noted that unless the constant current output i is required, the output terminal may be connected to the external voltage supply source $V_{CC}$.

Further, the internal voltage $V_{II}$ can be utilized as the control voltage $V_{CONT}$ for the circuit shown in FIG. 20. In that case, it becomes possible to control the temperature characteristic of the differential amplifier.

In the foregoing, the circuit characteristic control method according to the present invention has been described in conjunction with several illustrative embodiments. Certainly, these embodiments can be easily realized. However, when fine (small) elements are used for the realization with a view to increasing the integration density (bit density), there may arise such situation in which difficulty is encountered in directly applying the external voltage $V_{CC}$ because of rather small dielectric (dioxide) breakdown strength of the fine elements. Besides, variations in the external voltage may make it difficult to obtain the desired characteristics. Under these circumstances, it is preferred to generate the stable internal voltage $V_T$ on chip and use that voltage $V_I$ in place of $V_{CC}$, as with the case of the embodiments shown in FIGS. 4, 5 and 16. Of course, if application of the external voltage $V_{CC}$ is accompanied with no problems, the external voltage $V_{CC}$ may be utilized. In this case, the burden imposed on the voltage supply source generating the internal voltage $V_I$ can be correspondingly reduced, whereby the internal voltage $V_I$ can be obtained to be stable.

Figure 34:
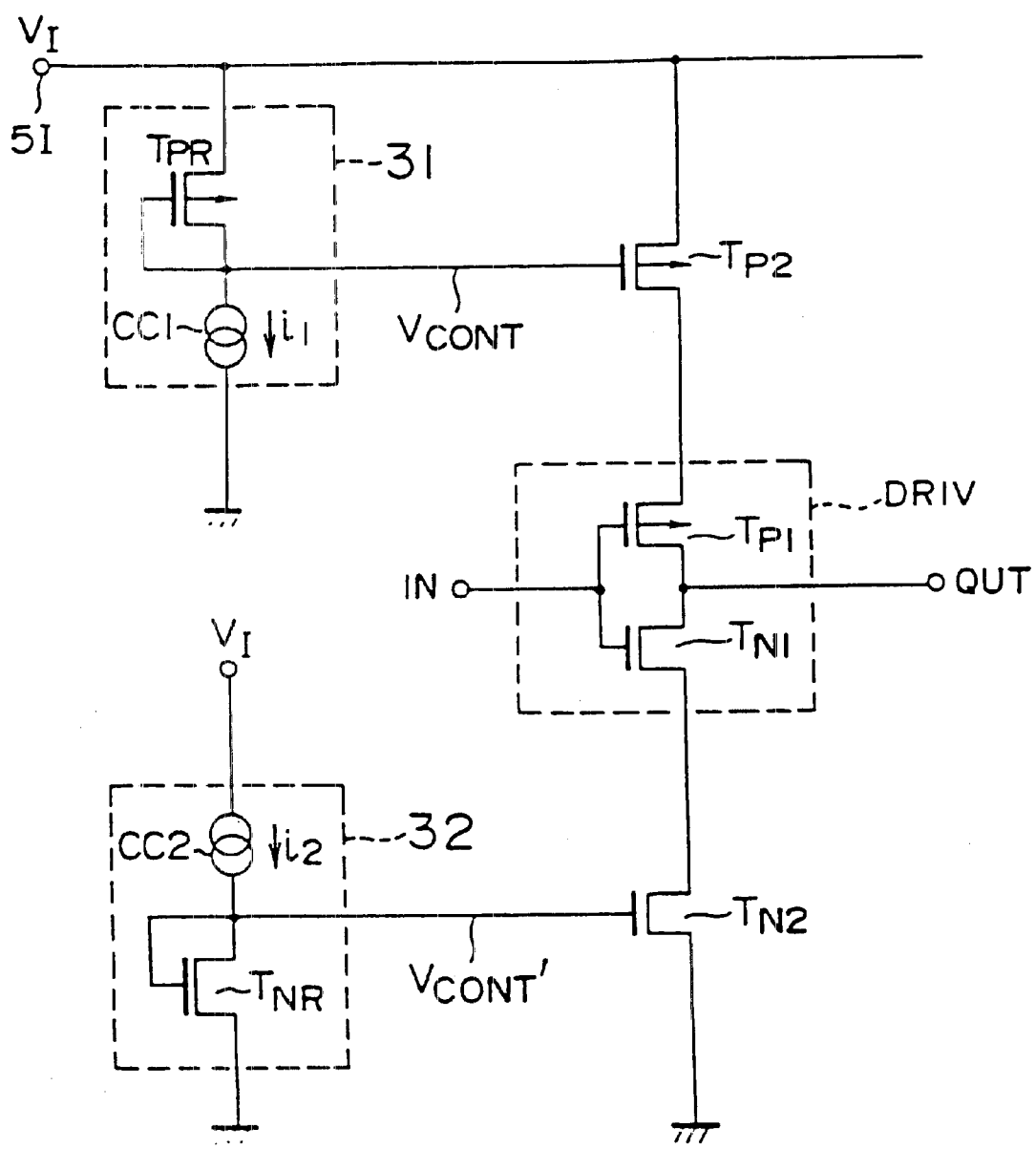

FIG. 34 shows an exemplary embodiment for controlling the operation speed of the circuit in which the internal voltage $V_I$ is utilized. Although the following description is based on the assumption that the CMOS invertor shown in FIG. 11A is controlled by the circuits shown in FIGS. 21 and 22, respectively, it should be understood that the embodiment of the invention elucidated below can be applied to other various embodiments described hereinbefore. Referring to FIG. 34, P-channel MOS transistors $T_{P2}$ and $T_{PR}$ and N-channel MOS transistors $T_{N2}$ and $T_{NR}$ constitute a current mirror circuit. Thus, by appropriately selecting the size of the transistor $T_{P2}$ relative to that of $T_{PR}$ as in the case of the foregoing embodiments, the charge current of the driver circuit DRIV can be set at an arbitrary value. Further, by appropriately determining the size of the transistor $T_{N2}$ relative to $T_{NR}$, the discharge current can be set at an arbitrary value. When source voltage of the P-channel MOS transistors $T_{PR}$ and $T_{P2}$ and the voltage $V_I$ of the current supply source CC2 are held at a value lower than the voltage level which the small or fine elements can withstand, the latter can of course be used. Further, since the output amplitude is $V_I$, the voltage which is an input to a succeeding stage can be controlled stably, whereby the stable operation of the succeeding stage can be assured. Additionally, it should be mentioned that the control voltage ($V_{CONT}$ $V_{CONT}$) generating circuits 31 and 32 can be used in common among a plurality of circuits. In that case, the operation speed of the individual circuits can be controlled as desired by setting the sizes of the associated MOS transistors $T_{P2}$ and $T_{N2}$ for every circuit separately.

Next, description will be made of a voltage transformer circuit suited advantageously for generating a voltage lower than the external voltage $V_{CC}$ within the body of chip as in the case of the circuits shown in FIGS. 4, 5, 34 and others.

Figure 35:
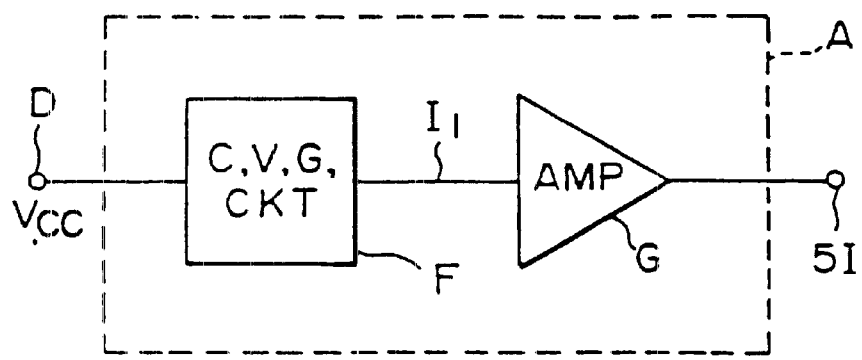

FIG. 35 shows a circuit configuration of the voltage transformer (limiter) circuit 35 according to an embodiment of the present invention. In the figure, a reference character A denotes generally a voltage transformer circuit, F denotes a constant voltage generating circuit, and G denotes an amplifier. The constant voltage generating circuit F is adapted to generate a constant voltage $V_{II}$ from the external supply voltage $V_{CC}$. The amplifier G amplifies the voltage $V_{II}$ to output a voltage $V_I$ of the value required by the internal circuit 2 or by a circuit portion 3A of the control circuit 3 onto the control line 5I. It should be mentioned that the voltage $V_I$ may be imparted with various characteristics through the constant voltage generating circuit F and the amplifier G. By compensating for the temperature dependency, for example, and the external supply voltage dependency, the output amplitude of the circuit such as the circuit shown in FIG. 34 can be made constant independent of the temperature, whereby the circuit operation of high stability can be realized. According to the instant embodiment, the output voltage $V_I$, of the constant voltage circuit can be amplified to a desired value through the amplifier G. In other words, the value or level of the voltage $V_I$ can be set without being limited to the value of the output voltage $V_I$, of the constant voltage circuit.

Figure 36:
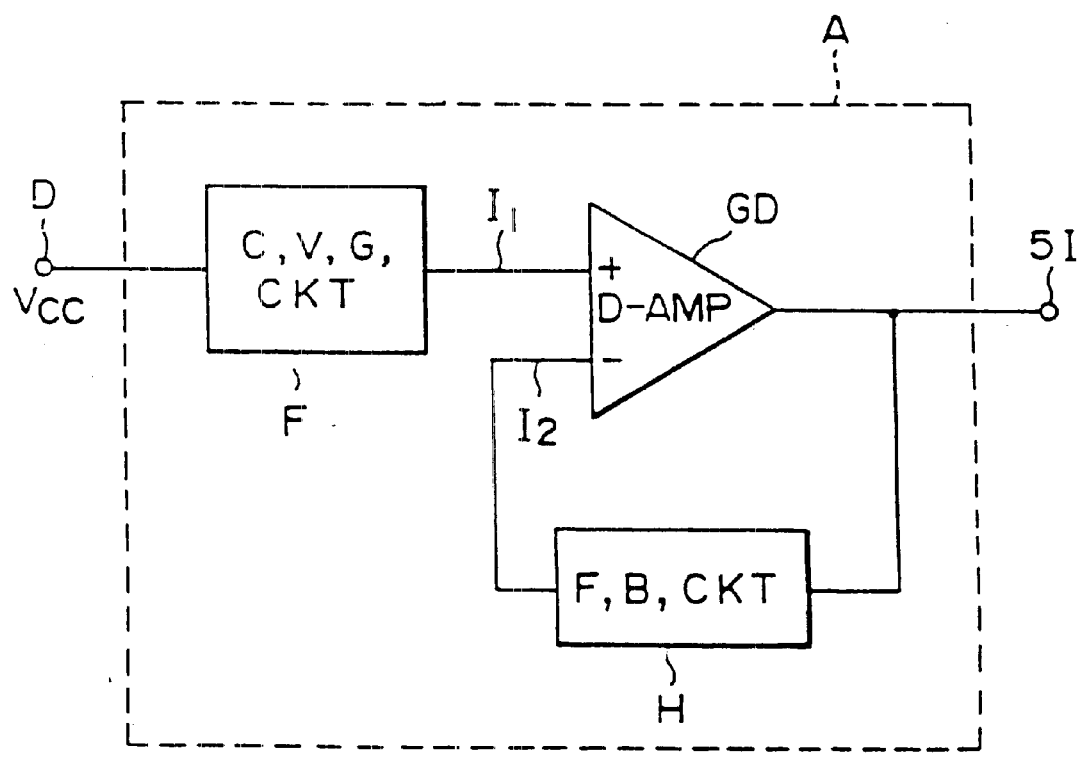

FIG. 36 shows another embodiment of the voltage transformer circuit which differs from the circuit shown in FIG. 35 in that the amplifier GD and a feedback circuit H are provided. The feedback circuit H is so designed that when the voltage $V_I$ assumes a desired value, a voltage equal to the constant voltage $V_{II}$ is outputted to the output line 12. According to this embodiment, fluctuation in the output voltage $V_I$ is fed back through the feedback circuit H, whereby the value of the output voltage $V_I$ can be maintained constant with high accuracy even when the current supplied by way of the control line 5I changes at high speed in the course of time lapse.

Figure 37:
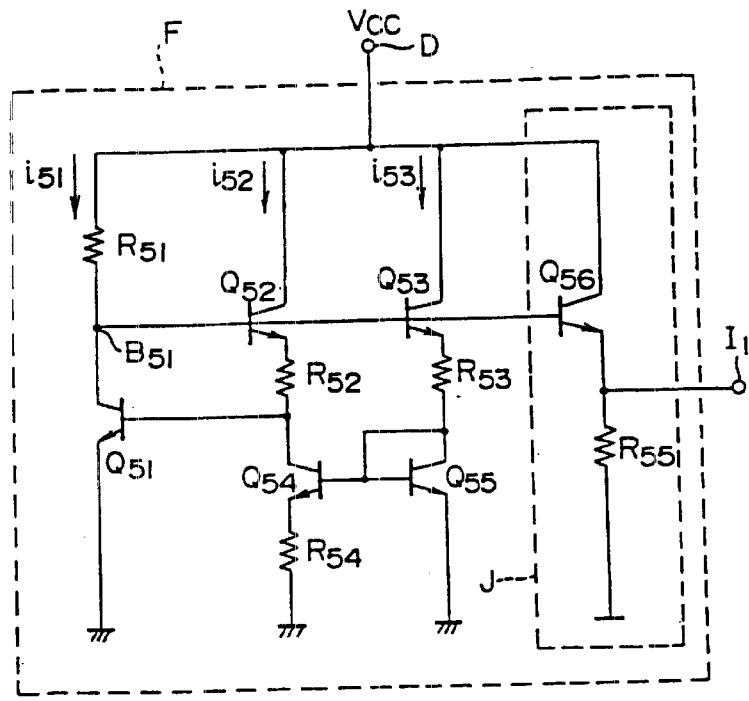

FIG. 37 shows a circuit configuration of constant voltage generating circuit for use in the embodiments shown in FIGS. 35 and 36. This constant voltage generating circuit corresponds substantially to the current supply circuit shown in FIG. 33 except that the collector of the bipolar transistor is connected to the external supply voltage $V_{CC}$. In the circuit shown in FIG. 37, the output voltage $V_{II}$ and the temperature dependency thereof are given by the aforementioned expressions (8) and (9), respectively. As described hereinbefore, by varying the resistance ratio or current density ratio of the bipolar transistors, the temperature dependency can be established. When the instant embodiment is applied to the constant voltage generating circuits F shown in FIGS. 35 and 36, the value of $\partial VII/\partial T$ is so determined as to match with the temperature characteristics of the amplifier G serving as the differential amplifier GD and the feedback circuit H of the succeeding stage, whereby the temperature dependency of the output voltage $V_I$ of the voltage transformer circuit can be nullified. It should be noted that in the circuit arrangement shown in FIG. 31, the voltage $V_I$, remains substantially constant independent of the external voltage $V_{CC}$ when the latter exceeds a value about twice as high as that of the base-emitter forward voltage of the bipolar transistor, i.e. about 1.8 volt. Accordingly, by applying the instant embodiment to the circuits shown in FIGS. 35 and 36, the output voltage V, exhibiting neither the temperature dependency nor the external voltage dependency can be obtained in a facilitated and convenient manner.

By the way, it is noted that when the constant voltage circuit F and other circuits are formed simultaneously in one and the same semiconductor substrate, same type of transistors, i.e. either the MOS transistors or the bipolar transistors should preferably be used in view of the simplification of the fabrication process and reduction in the manufacturing cost. For this reason, it may be desirable to use the MOS transistors in implementing the constant voltage circuit F rather than the bipolar transistors as in the case of the embodiment shown in FIG. 37. In that case, the voltage $V_{I6}$, in a circuit corresponding to the one shown in FIG. 32 except that the drain of the MOS transistor $T_{N63}$ is connected to the external supply voltage $V_{CC}$, may be used. Alternatively, a constant voltage generating circuit described in Oguey's article in "Journal of Solid-State Circuit", SC-15, June 1980 or Blauschild's article in "Journal of Solid-State Circuit", SC-13, December 1978 may be used.

Figure 38:
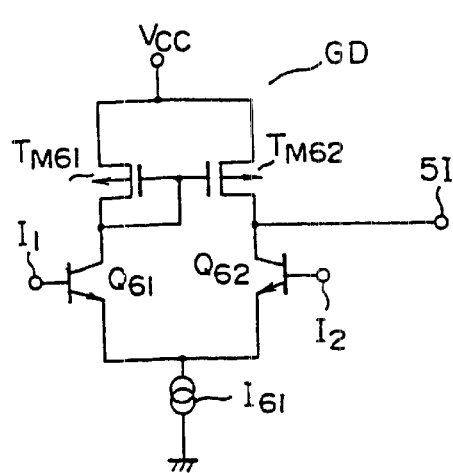

FIG. 38 shows a circuit configuration of the differential amplifier GD constituting a part of the circuit shown in FIG. 36.

Figure 39:
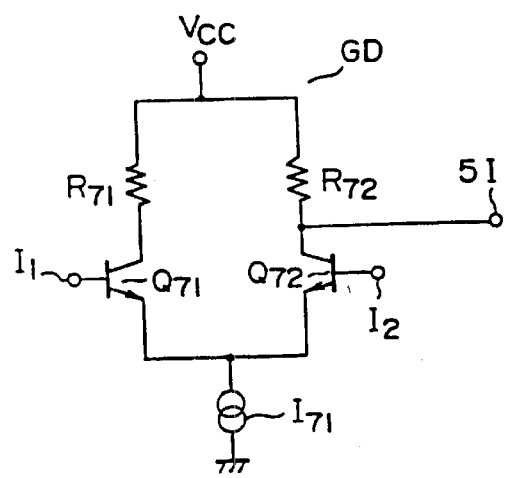

Referring to FIG. 38, the output voltage $V_{II}$ of the constant voltage circuit F is applied to the terminal I, while the output voltage $V_I$, of the feedback circuit is applied to the terminal $I_2$. In the case of the instant embodiment, since the terminals $I_1$ and $I_2$ correspond to the base electrodes of the bipolar transistors, respectively, gain can be increased while fluctuation in the voltage $V_I$ can be suppressed to a negligible level. Parenthetically, the P-channel MOS transistors in the circuit shown in FIG. 38 may be replaced by resistors, as is shown in FIG. 39. Since the resistor can be constituted by the base diffusion layer of the bipolar transistor, this resistor can be realized within an impurity layer for the collector of the bipolar transistor. Thus, the layout area of the circuit can be decreased.

Figure 40:
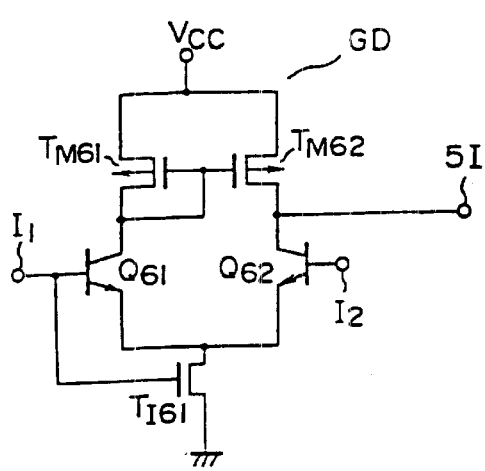
Figure 41:
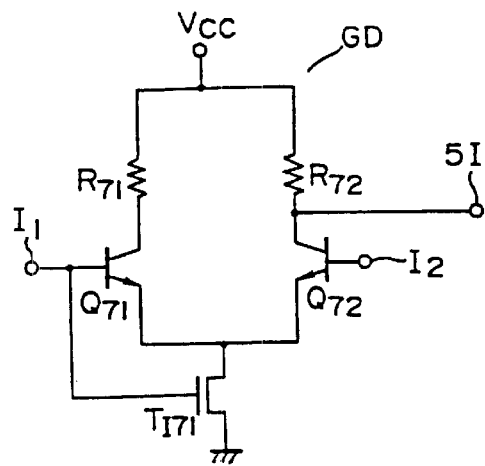

As the current source for the differential amplifiers shown in FIGS. 38 and 39, there may be conceived various types of circuits. It is however possible to realize the current source circuit with a single MOS transistor, as is illustrated in FIGS. 40 and 41. More specifically, the gates of the MOS transistors $T_{I61}$ and $T_{I71}$ are connected to the terminal $I_1$. With this circuit arrangement, the current of the differential amplifier can be held constant independent of the external voltage $V_{CC}$, since $V_I$, assumes a constant value for $V_{CC}$, as described hereinbefore. Further, when the characteristics of the differential amplifier need to be controlled stably, various controls may be performed with the aid of the circuits shown in FIGS. 18 to 20.

Figure 42:
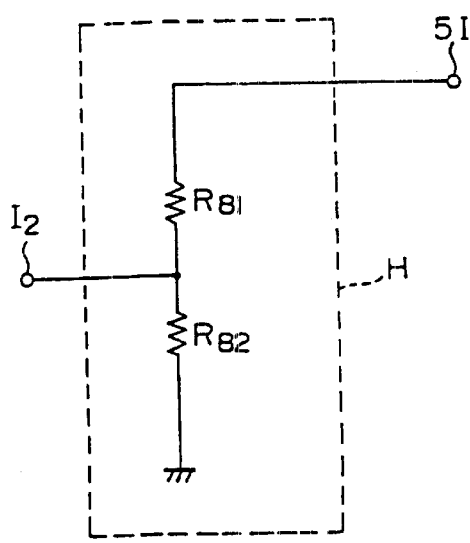

FIG. 42 shows a circuit configuration of the feedback circuit shown in FIG. 36.

Referring to FIG. 42, for the voltage $V_I$ on the control line $5_I$, there is produced at an output terminal $I_2$ a voltage $V_{I2}$ which can be given by $$V_{I2} = \frac{R_{82}}{R_{81} + R_{82}} \times V_I \qquad (13)$$

The above-mentioned voltage $V_{I2}$ is an input to the differential amplifier shown in FIG. 36. Accordingly, when the resistance values of resistors $R_{81}$ and $R_{82}$ are so selected that the following condition is met $$V_{I1} = \frac{R_{82}}{R_{81} + R_{82}} \times V_{I0} \qquad (14)$$

(where $V_{II}$ represents the output voltage of the constant voltage circuit F and $V_{I0}$ represents a desired voltage to be outputted onto the control line SI), then, $V_{I1}=V_{I2}$ provided that $V_{II}=V_{I0}$, which means that the voltage on the control line SI is stabilized at the desired voltage $V_{I0}$. By designing the constant voltage circuit F so that the temperature dependency of the output voltage $V_{I1}$ thereof is nullified, as described hereinbefore, the temperature dependency of the above mentioned voltage $V_{E0}$ can be substantially nullified.

Needless to say, it is also possible to impart a desired temperature dependency to the output voltage $V_{I0}$, if required.

Figure 43:
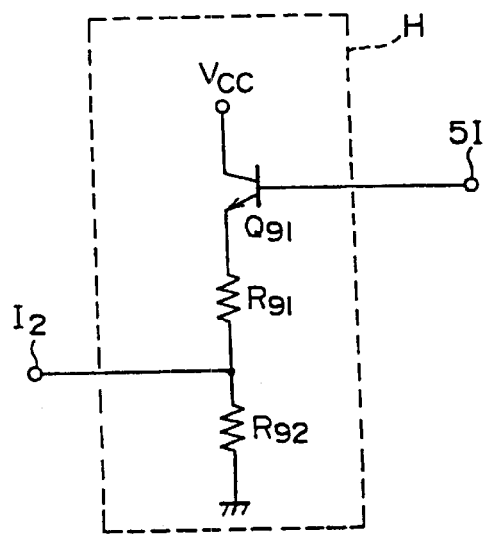

FIG. 43 shows concretely a circuit configuration of the feedback circuit H shown in FIG. 36. In the case of the embodiment shown in FIG. 43, the control line SI is not directly connected to the resistor but connected to the base electrode of the bipolar transistor $Q_{91}$. Accordingly, owing to the current amplification by the bipolar transistor $Q_{21}$, circuit operation of higher speed can be realized when compared with the circuit shown in FIG. 42. Further, the load current of the differential amplifier GD can be decreased. In the case of the circuit shown in FIG. 43, the aforementioned expressions (11) and (12) have to be rewritten as follows:

$$V_{I2} = \frac{R_{92}}{R_{91} + R_{92}} \{V_I - V_{BE}(Q_{91})\} \qquad (15)$$

$$V_{I1} = \frac{R_{92}}{R_{91} + R_{92}} \{V_{I0} - V_{BE}(Q_{91})\} \qquad (16)$$

The values of the resistors $R_{91}$ and $R_{92}$ are so determine that the condition given by the expression (14) can be satisfied. However, since $$V_{I0} = \frac{R_{91} + R_{92}}{R_{92}} V_{I1} + V_{BE}(Q_{91}) \qquad (17)$$

as is apparent from the expression (14), the temperature dependency of the voltage $V_{I0}$ is out of coincidence with that of the voltage $V_{I1}$, because of the second term in the expression (15). In this case, from the expression (11)

$$\frac{\partial V_{I0}}{\partial T} = \frac{R_{91} + R_{92}}{R_{92}} \times \frac{\partial V_{I1}}{\partial T} + \frac{\partial V_{BE}(Q_{91})}{\partial T} \qquad (18)$$

Accordingly, the circuit can be designed in accordance with the desired $V_{ID}$ and $\partial V_{I0}/\partial T$ so that the conditions given by the expressions (15) and (16) are satisfied. Of course, the term $\partial V_{I0}/\partial T$ may be nullified.

With the voltage transformer circuits described above, the output voltage can be maintained at a constant value lower than the external voltage $V_{CC}$ even when the latter is increased excessively, whereby the fine elements or devices can be protected against destruction, to a great advantage. However, there may arise such problem that the circuit can not be subjected to the aging test. This will be elucidated below.

Conventionally, the integrated circuits usually undergo a so-called aging test after the final fabrication step, wherein a higher voltage than that used in the ordinary operation is intentionally applied to the individual transistors implemented within the integrated circuit for finding out at an earlier stage those transistors inherently susceptible to failure due to defect in the gate oxide film for thereby enhancing the reliability of the products. In order to increase the possibility of finding out the failed product through the aging test, such a voltage which is slightly lower than the voltage at which a normal element or device would be destroyed has to be applied to the individual elements or device. In this connection, it is noted that in the case of the integrated circuit chip realized such that a predetermined source voltage is supplied by way of the on-chip voltage transformer (limiter) circuit, there may arise such a case in which an adequate aging test voltage can not be applied to the internal circuits. This problem can however be solved by designing the voltage transformer (limiter) circuit such that the voltage $V_I$ generated thereby is increased when the external power supply voltage $V_{CC}$ assumes an excessively high level.

Figure 44:
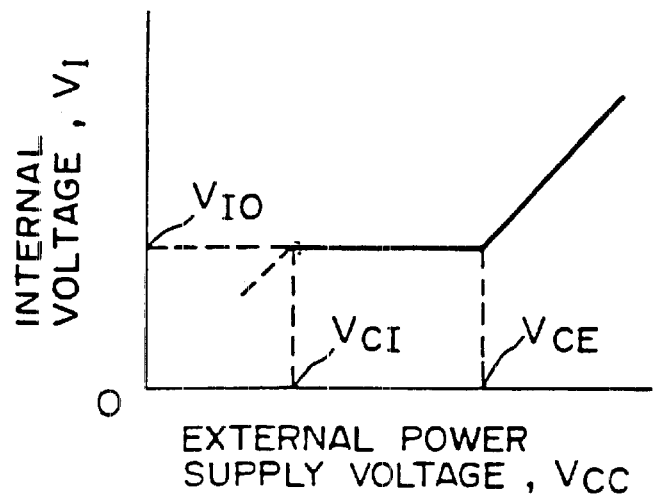

More specifically, referring to FIG. 44, the internally generated voltage $V_I$ is held at a constant value $V_{I0}$ when the external power supply voltage lies within a range of $V_{CI}$ to $V_{CE}$, while the internal voltage $V_I$ is increased as the external power supply voltage $V_{CC}$ is increased beyond the level $V_{CE}$. In this way, when the external power supply voltage $V_{CC}$ is increased beyond the level $V_{CE}$, the internal voltage $V_I$ can be increased. Accordingly, a voltage higher than the constant internal voltage level $V_{I0}$ can be applied to the on-chip circuitries by increasing the external power supply voltage $V_{CC}$ beyond the level $V_{EC}$ in the aging test, which test thus can be carried out effectively.

Figure 45:
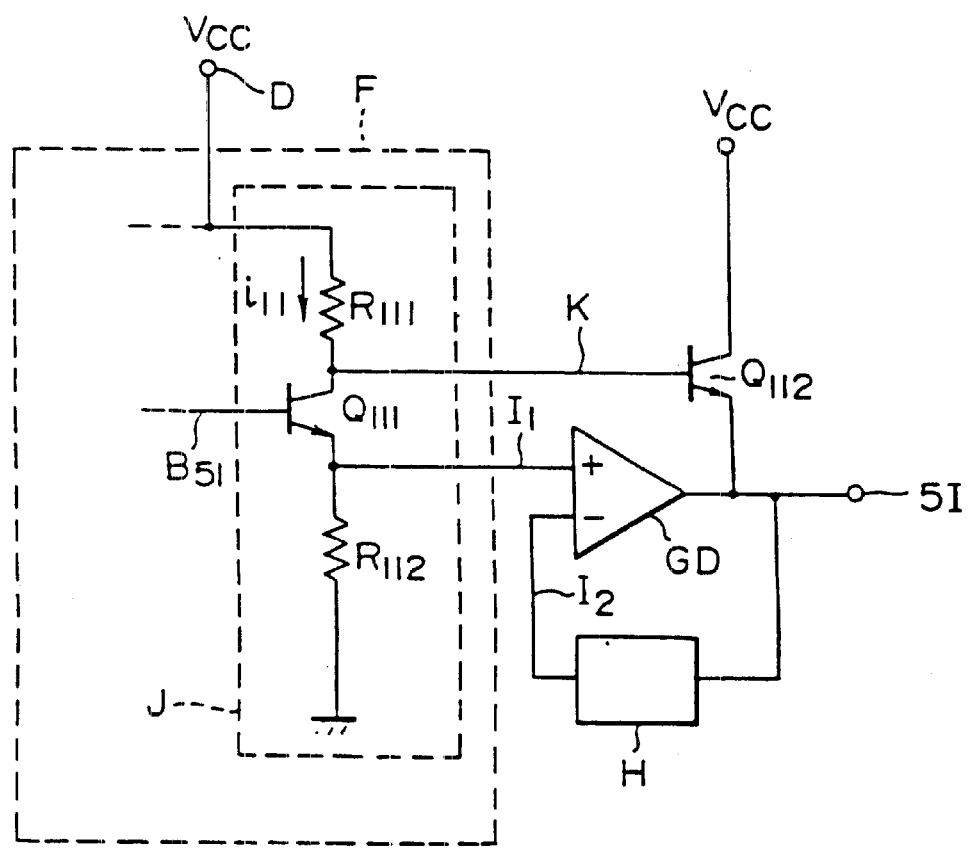

FIG. 45 shows a circuit arrangement for realizing the voltage characteristics illustrated in FIG. 44. Referring to FIG. 45, the constant voltage generating circuit F is similar to the circuit shown in FIG. 37 except for the differences mentioned below. Namely, a resistor $R_{III}$ is inserted between the collector of the bipolar transistor in the output stage J and the terminal D. The differential amplifier GD and the feedback circuit H are interconnected in the same manner as in the case of the circuit shown in FIG. 36.

Additionally, the collector of the bipolar transistor $Q_{III}$ is connected to the base of the bipolar transistor $Q_{112}$. The emitter of the latter is connected to the control line 5I with the collector thereof being coupled to the external power supply voltage $V_{CC}$. With this circuit arrangement, the output voltage $V_I$ remains constant at the value $V_{I0}$ until the bipolar transistor $Q_{112}$ is turned on after the external power supply voltage $V_{CC}$ has reached the stable point $V_{I0}$ of the output voltage $V_I$, which is increased as the external voltage $V_{CC}$ increases after the bipolar transistor $Q_{112}$ has been turned on. The point $V_{CE}$ at which the bipolar transistor $Q_{112}$ is turned on is given by the following expression:

$$V_{CE} = V_{I0} + V_{BE}(Q_{112}) + R_{111} \times i_{11} \quad (19)$$

where $i_{11}$ represents a current flowing through the resistor $R_{III}$ and satisfies the condition given by the following expression:

$$i_{11} = V_{I1}/R_{112} \quad (20)$$

Accordingly, $$V_{CE} = V_{I0} + V_{BE}(Q_{112}) + \frac{R_{111}}{R_{112}} V_{I1} \quad (21)$$

When the external power supply voltage $V_{CC}$ increases beyond the level or point $V_{CE}$, the internal voltage $V_I$ increases, as is given by the following expression:

$$V_I = V_{CC} - R_{111} \times i_{11} - V_{BE}(Q_{112}) \quad (22)$$

$$= V_{CC} - \frac{R_{111}}{R_{112}} V_{I1} - V_{BE}(Q_{112}) \quad (23)$$

In this way, since the voltage $V_I$ increases as the external voltage $V_{CC}$ is increased after the latter exceeds the level $V_{CE}$, the aforementioned aging test can be carried out effectively.

Parenthetically, when the temperature dependency of the voltage level $V_{I0}$ is nullified, then the voltage level $V_{CE}$ is given from the expression (19) as follows:

$$\frac{\partial V_{CE}}{\partial T} + \frac{\partial V_{I0}}{\partial T} = \frac{\partial V_{BE}(Q_{112})}{\partial T} + \frac{R_{111}}{R_{112}} \times \frac{\partial V_{I1}}{\partial T} \quad (24)$$

On the other hand, when $V_{CC} > V_{CE}$, the temperature dependency of the voltage $V_I$ is given by the following expression:

$$\frac{\partial V_I}{\partial T} = -\frac{R_{111}}{R_{112}} \times \frac{\partial V_{I1}}{\partial T} - \frac{\partial V_{BE}(Q_{112})}{\partial T} \quad (25)$$

When the circuit shown in FIG. 42 is used as the feedback circuit, $\partial V_{II}/\partial T = 0$ from the expression (12). Accordingly $$\frac{\partial V_{CE}}{\partial T} = \frac{\partial V_{BE}(Q_{122})}{\partial T} \quad (26)$$

When $V_{CC} > V_{CE}$ $$\frac{\partial V_E}{\partial T} = -\frac{\partial V_{BE}(Q_{112})}{\partial T} \quad (27)$$

Usually, the temperature dependency of the voltage $V_{BE}$ is about −2 mV/° C. Accordingly, the temperature dependency of the voltage $V_{CE}$ as well as that of $V_I$ is extremely small when $V_{CE} > V_{CC}$. Further, when the circuit shown in FIG. 43 is employed as the feedback circuit, the following expression applies valid from the expression (14) provided that $\partial V_{I0}/\partial T = 0$:

$$\frac{\partial V_{II}}{\partial T} = \frac{-R_{92}}{R_{91} + R_{92}} \times \frac{\partial V_{BE}(Q_{91})}{\partial T} \quad (28)$$

Accordingly, from the expressions (21) and (22)

$$\frac{\partial V_{CE}}{\partial T} = \frac{\partial V_{BE}(Q_{112})}{\partial T} - \frac{R_{111} \times R_{92}}{R_{112}(R_{91} + R_{92})} \times \frac{\partial V_{BE}(Q_{91})}{\partial T} \quad (29)$$

When $V_{CC} > V_{CE}$ $$\frac{\partial V_I}{\partial T} = \frac{R_{111} \times R_{92}}{R_{112}(R_{91} + R_{92})} \times \frac{\partial V_{BE}(Q_{91})}{\partial T} - \frac{\partial V_{BE}(Q_{112})}{\partial T} \quad (30)$$

From the expressions (11) and (1S), $$V_{CE} = V_{IO} + V_{BE}(Q_{112}) + \frac{R_{111}}{R_{112}} \quad (31)$$

$$\times \frac{R_{92}}{(R_{91} + R_{92})} [V_{IO} - V_{BE}(Q_{91})] \quad (32)$$

$$= (1 + \eta)V_{IO} + V_{BE}(Q_{112}) - \eta V_{BE}(Q_{91}) \quad (33)$$

where $$\eta = \frac{R_{111}}{R_{112}} \times \frac{R_{92}}{R_{91} + R_{92}} \quad (34)$$

Thus, assuming, by way of example, that $V_{CE}=6$ V and $V_{IO}=4$ V, then $V_{BE}(Q_{112})=V_{BE}(Q_{q1})=0.8$ V. Thus, $\eta=\frac{3}{8}$. From the expressions (23A) and (23B), the values of $\partial V_{CE}/\partial T$ and $\partial_{VE}/\partial T$ when $V_{CC} > V_{CE}$ are about $-125$ mV/° C. and about $+125$ mV/° C., respectively. This means that even when the circuit shown in FIG. 43 is employed as the feedback circuit H, the temperature dependency of the voltage level $V_{CE}$ as well as that of $V_E$ when $V_{CC} > V_{CE}$ is very small. Further by selecting the value of $V_{CE}$ about twice as large as the value of $V_{IO}$ when the circuit shown in FIG. 43 is employed, the temperature dependency of $V_{CE}$ and that of $V_1$ when $V_{CC} > V_{CE}$ can be simultaneously made approximately zero. More specifically, when $V_{BE}(Q_{112})$, $V_{BE}(Q_{91})$, $V_{CE} \approx 2V_{IO}$ from the expression (23C) provided that n=1. Thus, when $$\frac{\partial V_{BE}(Q_{91})}{\partial T} \approx \frac{\partial V_{BE}(Q_{112})}{\partial T} \quad (35)$$

then $\partial V_{CE}/\partial T \approx 0$ from the expression (23a). Similarly, $\partial V_1/\partial T \approx 0$ from the expression (23B) when $V_{CC} > V_{CE}$.

As will now be appreciated from the foregoing, the voltage characteristics illustrated in FIG. 44 can be realized without undergoing any appreciable influence of fluctuation in the temperature by using the circuit shown in FIG. 42 or the circuit shown in FIG. 43 as the feedback circuit H. As a result of this, the voltage $V_1$ exhibiting substantially no temperature dependency can be generated not only in the ordinary operation range of $V_{CC} \leq V_{CE}$ but also in the aging test range of $V_{CC} > V_{CE}$, whereby the internal circuits can be operated stably.

Of course, it is possible to impart the temperature dependency to the voltage $V_{IO}$, if demanded, as described hereinbefore. Further, when it is required to set the temperature dependency in the aging test range independent of the voltage $V_{IO}$, this can be achieved by connecting the collector of the bipolar transistor $Q_{III}$ to the external power supply voltage $V_{CC}$ while providing the resistor $R_{III}$ having a desired temperature dependency for the bias K separately from the feedback circuit F, as is shown in FIG. 45.

In the circuit shown in FIG. 45, the bipolar transistor $Q_{112}$ is employed for raising the internal voltage $V_1$ when $V_{CC} \geq V_{CE}$. However, this transistor may be replaced by an N-channel MOS transistor, wherein the gate of that N-channel MOS transistor is connected to the terminal K while the drain thereof is connected to the external power supply $V_{CC}$ with the source of that transistor being connected to the terminal E. Since the terminal K is connected to the gate of the N-channel MOS transistor, there is required no current supply, whereby the design of the constant voltage generating circuit can be facilitated correspondingly.

According to the embodiment of the invention described above, it is possible to supply a stable voltage having a desired temperature dependency to the control line 5I within a desired range independent of the external power supply voltage, which in turn means that the circuits implemented on one and the same chip can be operated stably. However, when the current supplied through the control line 5I is especially large, a buffer circuit for amplification of current may be provided in the voltage transformer circuit A, wherein the output line 5I' of the buffer circuit may be made use of as the control line for preventing fluctuation in the voltage.

Figure 46:
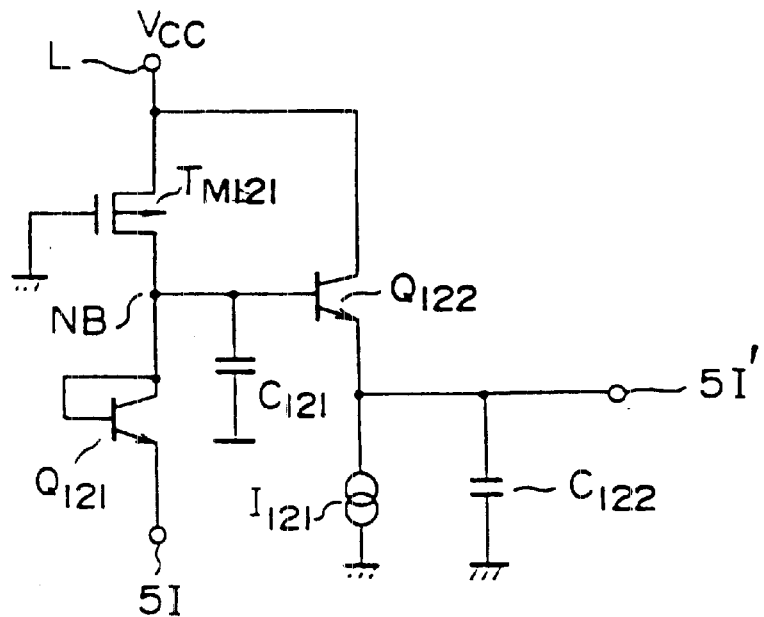

FIG. 46 shows an embodiment of the above-mentioned buffer circuit, wherein $C_{121}$ and $C_{122}$ designate capacitors for suppressing fluctuation in potential on the control line 5I'. In this circuit, the output voltage $V_I'$ on the control line $5_I'$ can be expressed as follows:

$$V'_I = V_{CC} - V_{BE}(Q_{121}) (V_{CC} \leq V_I + V_{BE}(Q_{121})) \quad (36)$$

or $$V_M = V_I + V_{BE}(Q_{121}) - V_{BE}(Q_{122}) \ (V_{CC} > V_I + V_{BE}(Q_{121})) \quad (37)$$

The voltages $V_I'$ and $V_I$ (internal voltage) are substantially equal to each other in the range given by $$V_{CC} > V_I + V_{BE}(Q_{121}) \quad (38)$$

Figure 47:
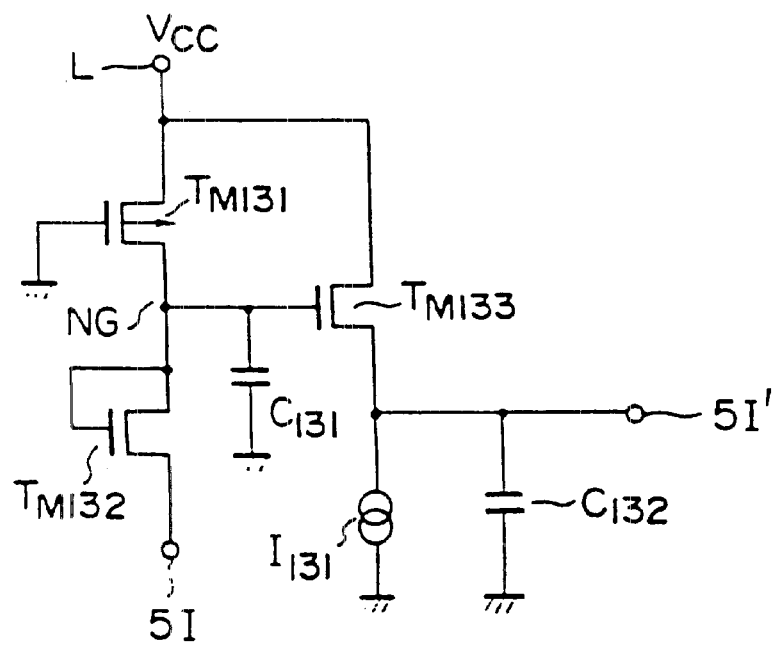

The temperature dependency of the output voltage $V_I'$ can be controlled by employing the aforementioned embodiment as the circuit for generating the internal voltage $V_I$. In the circuit under consideration, the control line 5I' is connected to the emitter of the bipolar transistor. Thus, it is possible to supply a large current through the control line 5I'. In other words, the voltage $V_I'$ can be held stably even when a large current is supplied to the on-chip circuit. FIG. 47 shows another embodiment of the buffer circuit which differs from the one shown in FIG. 46 in that the bipolar transistor is replaced by the MOS transistor. With the circuit configuration shown in FIG. 47, the voltage $V_1'$ is substantially equal to the internal voltage VI in the range given by $$V_{CC} \geq V_I + V_{TH}(Q_{132}) \quad (39)$$

where $V_{TH}$ represents the threshold voltage of the MOS transistor.

Since the threshold voltage of the MOS transistor can be easily controlled, it is possible according to this embodiment to stabilize the output voltage $V_I'$ starting from the state in which the external voltage $V_{CC}$ is still at a low level, by making the output voltage $V_I'$ equal to the internal voltage $V_I$.

Figure 48:
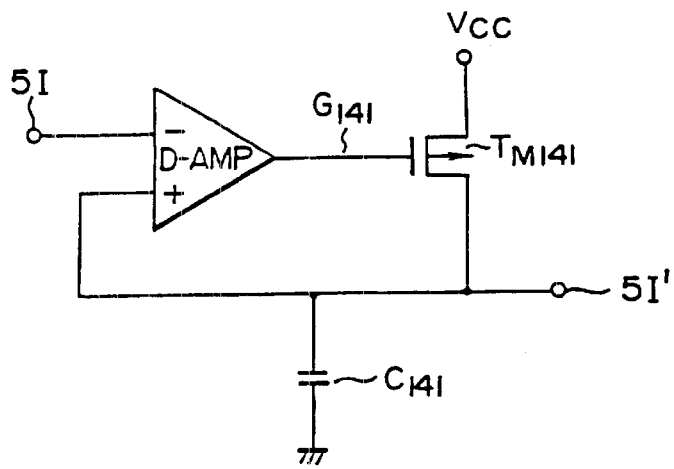

In the case of both embodiments of the buffer circuit described above, the range of the external voltage $V_{CC}$ in which the internal voltage $V_I$ and the output voltage $V_I'$ become equal to each other is limited by the forward voltage in the base-emitter path of the bipolar transistor or by the threshold voltage of the MOS transistor. Accordingly, even when the circuit shown in FIG. 46 is designed such that the output voltage $V_I$ of the voltage transformer circuit becomes constant at 4 volts with the external voltage $V_{CC}$ being equal to or higher than 4 volts, by way of example, the output voltage $V_I'$ of the buffer circuit shown in FIG. 46 can not become constant at 4 volts unless the external voltage becomes equal to or higher than about 4.8 volts. As a consequence, the operation margin of the internal circuits relative to the external voltage $V_{CC}$ may possibly be narrowed. For coping with this problem, the buffer circuit of such configuration as shown in FIG. 48 may be employed. In the circuit shown in FIG. 48, the control line 5I' is connected to a drain electrode of a P-channel MOS transistor M141 having a source electrode connected to the external power supply voltage $V_{CC}$, while the gate G141 of the MOS transistor is connected to the output of a differential amplifier Q so as to be controlled by the output voltage thereof. The input terminal of the differential amplifier Q is supplied with the output voltage $V_I$ of the voltage transformer (limiter) circuit A and the output voltage $V_I'$ of the buffer circuit under consideration. The capacitor $C_{141}$, serves for suppressing fluctuation in the output voltage $V_I'$. With this circuit arrangement, the output voltage $V_I'$ can be held at a value equal to the voltage $V_I$ by means of the differential amplifier mentioned above. Thus, in contrast to the buffer circuits shown in FIGS. 46 and 47, the output voltage $V_I'$ can be made equal to the internal voltage $V_I$ independent of the external voltage $V_{CC}$ in the case of the embodiment shown in FIG. 48, whereby a stable voltage can be derived over a wide range of the external voltage $V_{CC}$.

Figure 49:
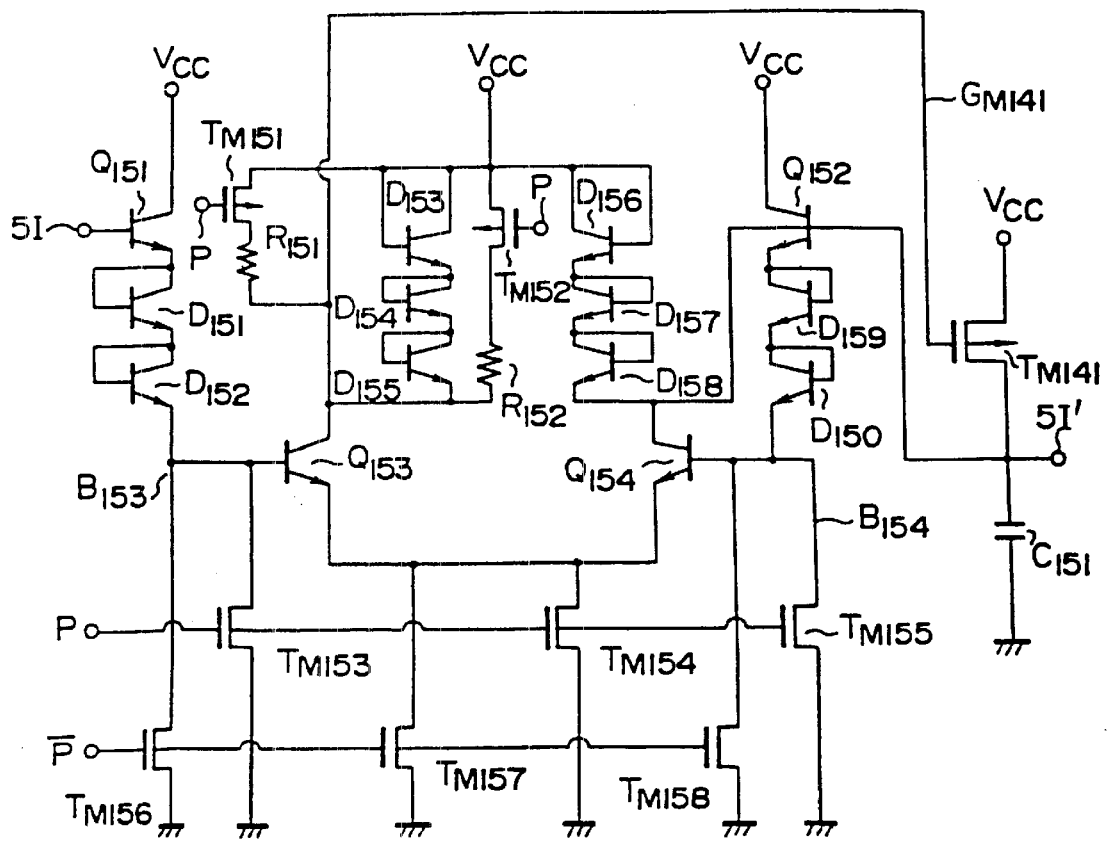

FIG. 49 shows a concrete example of the circuit configuration for the circuit shown in FIG. 48 Referring to FIG. 49, terminals P and $\overline{P}$ are supplied with signals of opposite phases, respectively. Although it is assumed in the following description that the signal P is of high level with the signal $\overline{P}$ being low level, essentially same effect can be obtained even when the level of these signals is reversed. Further, in the following description, the external voltage $V_{CC}$ is assumed to be 5 volts with the internal voltage $V_I$ being 4 volts, it goes without saying that other voltage values may also be used within the purview of the invention. Additionally, for the sake of simplification of description, the base-emitter voltage of the bipolar transistor is assumed to be 0.8 volt. When the internal voltage $V_I$ is 4 volts, the base potential $V_{B153}$ of the bipolar transistor $Q_{153}$ is 1.6 volts. At that time, the potential $V_I'$ on the control line 5I' assumes the base potential $V_{B154}$ of the bipolar transistor $Q_{154}$, i.e. 1.6 volts. When the potential $V_I'$ on the control line 5I' is lowered, the collector current of the bipolar transistor $Q_{154}$ is decreased. On the other hand, the collector current of the bipolar transistor $Q_{153}$ is increased, which results in that the current flowing through a resistor $R_{151}$ is increased. Consequently, the gate potential $V_{GM141}$ of the MOS transistor $T_{M141}$ is lowered, whereby the drain current of the MOS transistor $T_{M141}$ is increased, as the result of which the voltage $V_I'$ is restored to 4 volts. When the voltage $V_I$ rises up, the gate potential $V_{GM141}$ becomes high, causing the MOS transistor $T_{M141}$ to be turned off. Thus, the voltage $V_I'$ is lowered to restore 4 volts. In this connection, it should be mentioned that the collector potential of the bipolar transistor $Q_{153}$ is prevented from being lowered below 2.6 volts because of a series connection of diodes $D_{153}$ to $D_{155}$ inserted between the collector of the transistor $Q_{153}$ and the external power supply $V_{CC}$. On the other hand, since the base potential $V_{B153}$ is 1.6 volts, the base potential of the bipolar transistor $Q_{153}$ always remains lower than the collector potential. Thus, the bipolar transistor $Q_{153}$ will never become saturated. The base potential of the bipolar transistor $Q_{154}$ is at ($V_1$'2.4) volts with the collector potential thereof being ($V_{CC}$–2.4) volts. Since the internal voltage $V_I$ is ordinarily lower than the external voltage $V_{CC}$, the bipolar transistor $Q_{154}$ will never be saturated. By the way, when the circuit connected to the control line 5I' is in the standby state, the current flowing through the control line 5I' is substantially constant at a small value in most cases. In this state, the internal voltage $V_I$ can be maintained constant even when the current flowing to the amplifier is decreased, which in turn means that the power consumption can be reduced by decreasing the current flowing through the amplifier. To this end, however, the resistance value of the resistor $R_{152}$ has to be selected greater than that of the resistor $R_{151}$, while the gate widths of the MOS $T_{M153}$, $T_{M154}$ and $T_{M155}$ have to be selected greater than those of the MOS transistors $T_{M156}$, $T_{M157}$ and $T_{M158}$, respectively. Besides, the potentials at the terminals P and $\overline{P}$ have to be changed over to low and high levels, respectively, when the circuit connected to the control line 5I' is in the standby state.

It should be mentioned here that the output $V_I$ or $V_I'$ of the voltage transformer (limiter) circuits described above by reference to FIGS. 35 to 49 may also be utilized as the control voltage $V_{CONT}$ for the circuits shown in FIGS. 7 to 10. Since the fluctuations in the output voltage $V_I$ and $V_I'$ due to the variations in temperature and the external voltage can be controlled with the circuits shown in FIGS. 35 to 49, the characteristics of the circuits shown in FIGS. 7 to 10 can be maintained constant independent of the external voltage and the temperature. Thus, the circuits shown in FIGS. 35 to 49 are advantageously effective for solving the problem brought about by variations or changes in the external voltage $V_{CC}$ and the temperature in particular.

Figure 50A:
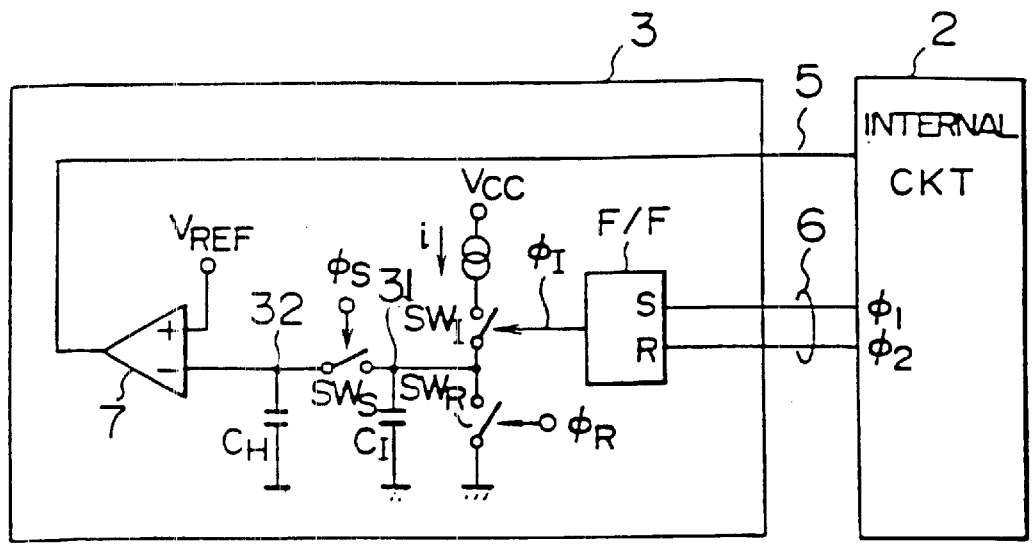

FIG. 50A shows a circuit configuration of the basic arrangement schematically shown in FIG. 2. The circuit shown in FIG. 50A is so arranged as to detect a phase difference in time at between two predetermined pulses $\varphi_1$ and $\varphi_2$ in the circuit 2 for thereby controlling the operation of the circuit 2 so that the operating speed is maintained constant.

Figure 50B:
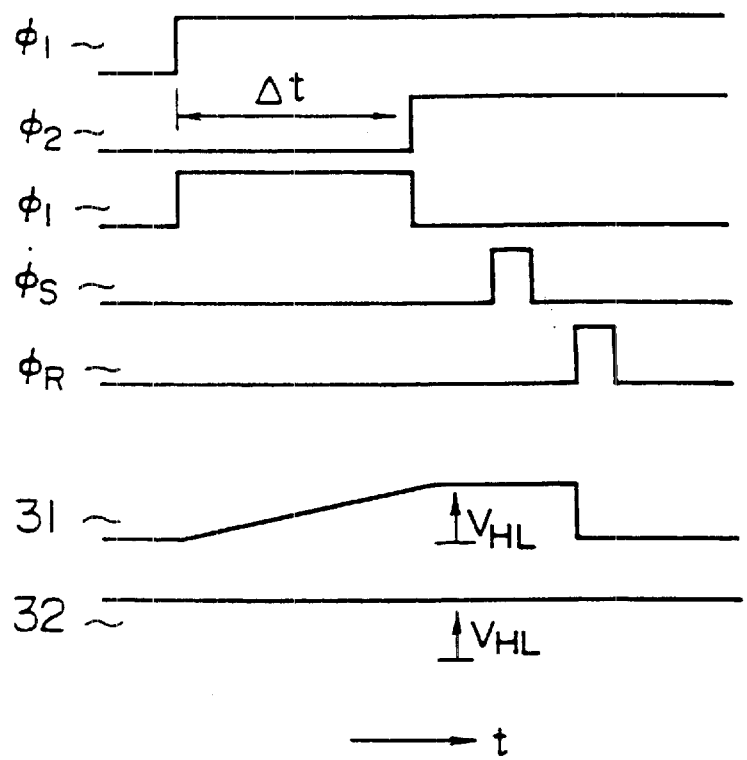

In FIG. 50A, F/F designates a set-reset type flip-flop adapted to produce the pulse signal $\varphi_0$ having a pulse width (duration) equal to the time difference between the pulse signals $\varphi_1$ and $\varphi_2$. Reference symbols $SW_I$, $SW_R$ and $SW_S$ designate switches, respectively, $C_1$ and $C_H$ designate capacitors and $V_{REF}$ represents a voltage for reference. Operation of the circuit shown in FIG. 50A will be described by reference to FIG. 50B.

In response to the input of the signal $\varphi_1$, a pulse signal $\varphi_1$ is outputted, whereupon the switch $SW_1$ is turned on to cause the capacitor $C_I$ to be charged with a constant current i, resulting in that the voltage at the terminal 31 of the capacitor $C_I$ rises. When the pulse signal $\varphi_2$ is an inputted after time lapse of Δt, the signal $\varphi_1$ assumes a low potential level, whereupon the switch $SW_I$ is turned off. Consequently, a voltage $V_{HL}$ at a circuit point 31 assumes a value proportional to the time or phase difference Δt. This voltage $V_{HL}$ is charged in the capacitor $C_H$ when the switch $SW_S$ is turned on in response to the inputting of a pulse signal $\varphi_S$. By dimensioning the capacitances of the capacitors $C_I$ and $C_H$ such that $C_I \gg C_H$, the voltage at the circuit point +32 becomes substantially equal to the voltage $V_{HL}$. On the other hand, the capacitor C is discharged to zero volt in preparation for the succeeding operation when the switch $SW_R$ is turned on in response to a pulse signal $\varphi_R$. The voltage $V_{HL}$ stored in the capacitor $C_H$ is compared with the reference voltage $V_{REF}$ through an operational amplifier 7, whereupon a voltage corresponding to the resultant difference is outputted onto the line 5 for controlling the operation characteristics of the circuit 2 which may be implemented in such circuit configuration as shown In FIGS. 7 to 20 so that the operation characteristics thereof are varied in dependence on the voltage on the line 5 until the voltage value $V_{HL}$ ultimately becomes equal to the reference voltage $V_{REF}$. In this manner, the characteristics of the circuit 2 is maintained to be constant.

With the arrangement according to the instant embodiment, the characteristics of the circuit 2 are controlled by detecting directly the operation characteristics of the circuit 2. Accordingly, response can be made even to variations in other characteristics than those previously taken into consideration. Thus, the characteristics of the circuit 2 can be controlled with an extremely high accuracy. In the case of the instant embodiment, the reference voltage $V_{REF}$ and the current i mainly determine the control accuracy and are thus required to be highly stable. In this connection, the reference voltage $V_{REF}$ can be produced with the aid of the circuits shown in FIGS. 32 and 37, while the current i of such high stability can be produced with the circuits-shown in
FIGS. 26 and 33, respectively.

Although the operation characteristics of the circuit 2 are detected in terms of time (phase) difference between the pulse signals $\phi_1$ and $\phi_2$, it is equally conceivable to perform the characteristic control on the basis of other detected quantities such as, for example, operation current.

Figure 51:
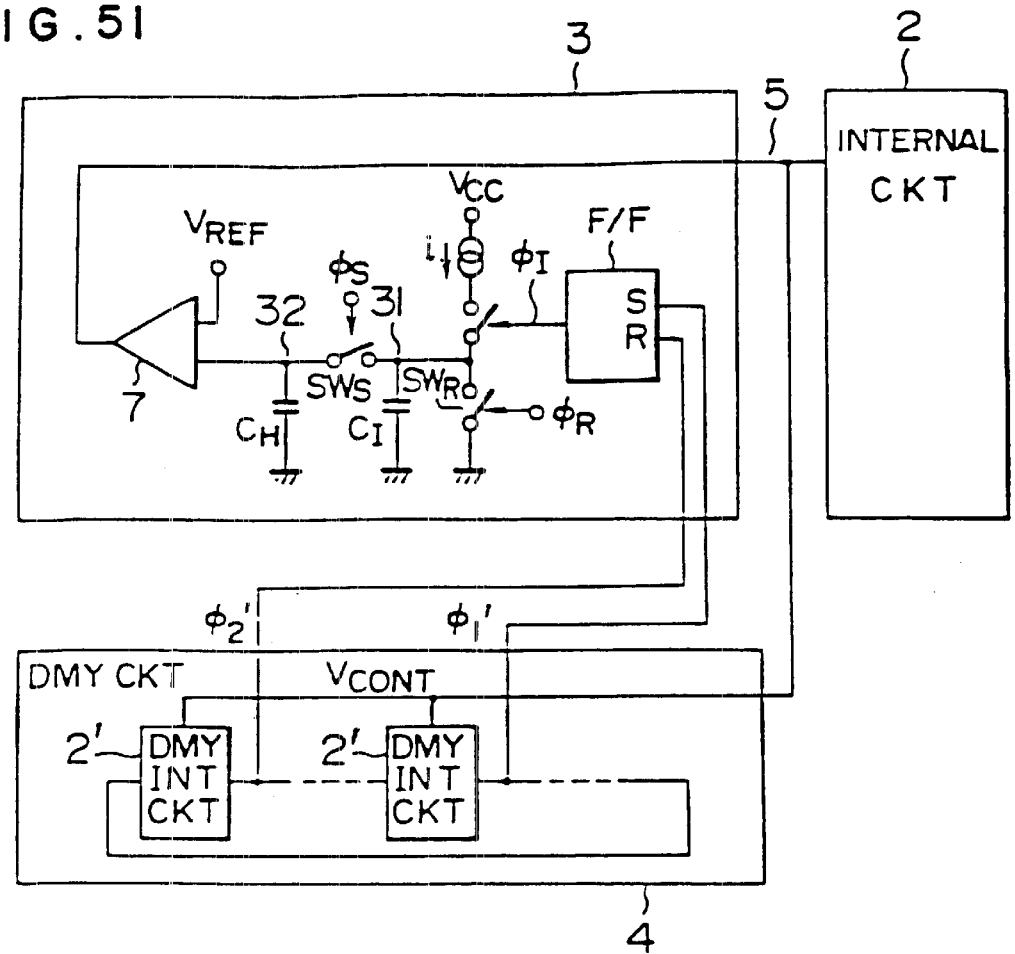

FIG. 51 shows an embodiment corresponding to the one shown in FIG. 50 applied to the basic arrangement shown in FIG. 3. According to this embodiment, a dummy circuit 4 is constituted by a part of the internal circuitry 2' constituting the circuit 2, wherein the operation characteristics are detected with the aid of outputs $\phi_1'$ and $\phi_2'$ of the dummy circuit 4 and controlled in a manner similar to that described above in conjunction with FIG. 50. The dummy internal circuitry 2' may be implemented m the form of a ring oscillator by using an inverter such as shown in FIG. 7 or any other suitable circuits. This embodiment provides similar advantageous effects as those attained with the circuit shown in FIG. 50.

Figure 52B:
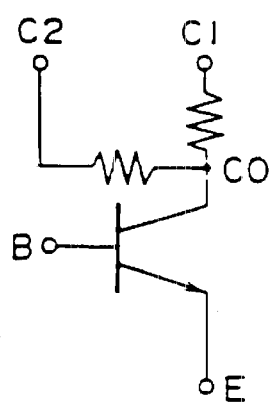
Figure 52A:
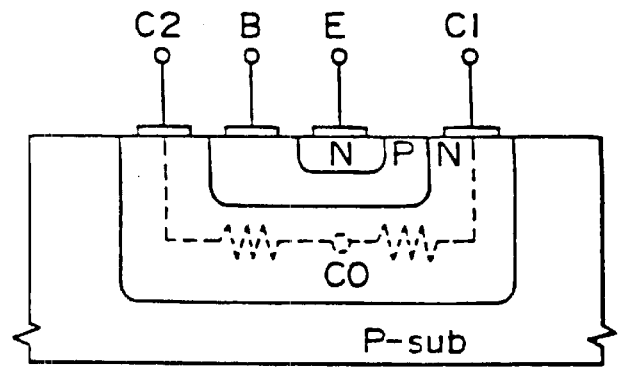

Of the embodiments described above, the circuit shown in FIG. 12, for example, is so arranged that the base and collector currents of the bipolar transistor are supplied from the same power supply source. In that case, there may arise such a situation that the collector potential is temporarily lowered below the base potential due to voltage drop appearing across the collector resistor of the bipolar transistor, whereby the latter may be driven to the saturated state. For avoiding such undesirable situation, two collector terminals C1 and C2 are provided, wherein the terminal C1 is used as the collector electrode of the bipolar transistor while the terminal C2 is connected to the MOS transistor supplying the base current, as is shown in FIGS. 52A and 52B. With this arrangement, the potential at the second collector electrode is lower than the that of the inherent collector CO of the bipolar transistor, as a result of which the potential at the base connected to the second collector electrode by way of the MOS transistor will never become higher than the potential at the collector CO. In this way, the possibility of the bipolar transistor being driven into saturation can be positively excluded. It should be understood that the application of this embodiment is never restricted to the circuit shown in FIG. 12.

Figure 53:
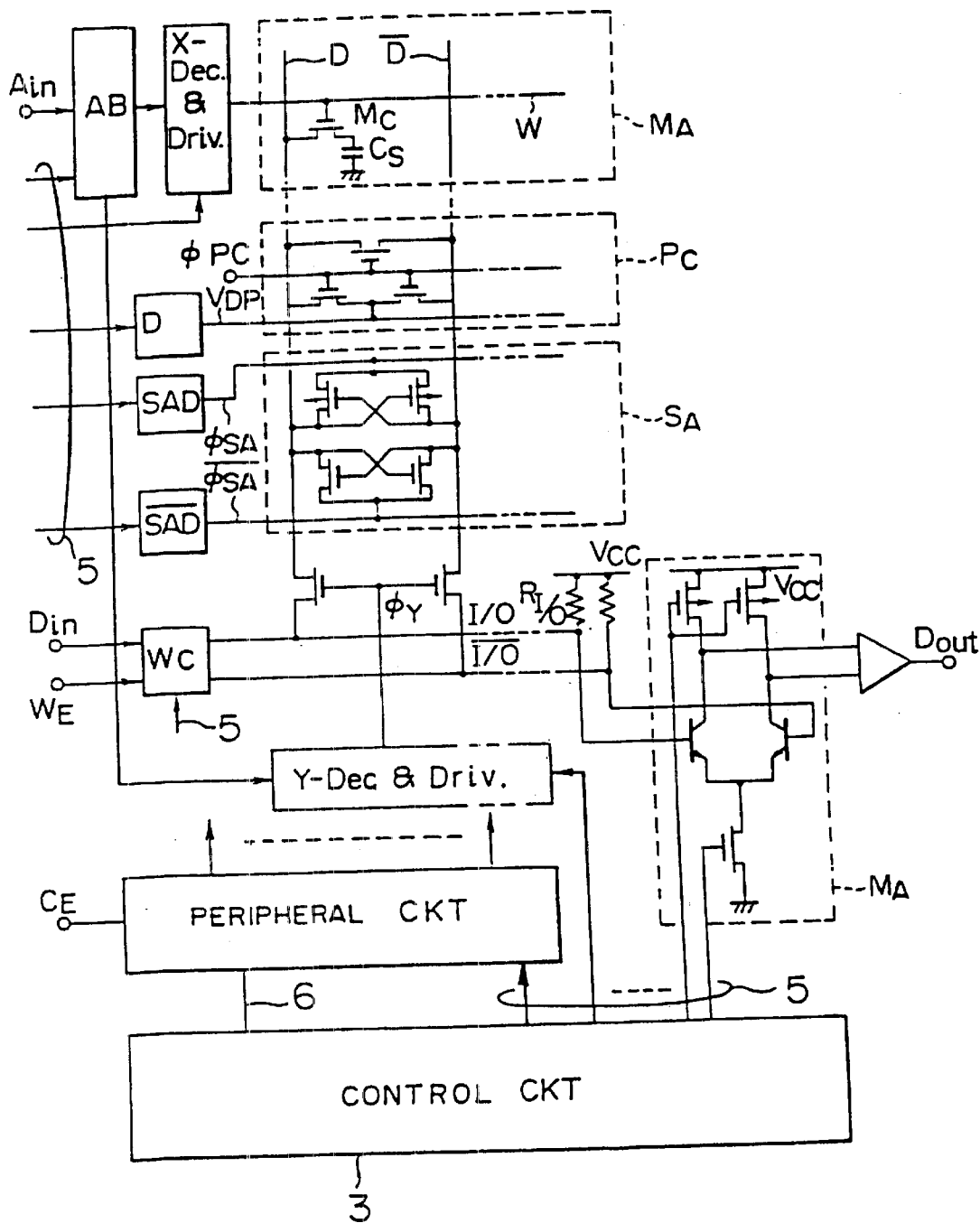
FIGS. 53 to 70 are schematic circuit diagrams showing exemplary embodiments of the invention applied to DRAM (dynamic random access memory) and SRAM (static random access memory).

FIG. 53 shows concretely an arrangement of a dynamic random access memory (DRAM) to which the embodiments of the invention described above may be applied.

In this figure, a reference symbol MA designates a memory cell array constituted by memory cells arrayed two-dimensionally. Reference symbol PC designates a data wire precharge circuit, and SA designates a sense amplifier for amplifying a feeble or low level signal outputted onto the data wire from the memory cell, the sense amplifier being constituted by P-and N-channel MOS transistors. Symbol AB designates an address buffer circuit for translating an address input $A_m$ into an internal signal, "X-Dec & Driv" and "Y-Dec & Driv" designate an X-decoder driver and a Y-decoder driver, respectively, DP designates a generator circuit for generating the data wire precharge voltage when the memory is in the standby state, SAD and $\overline{SAD}$ designate driver circuits for the sense amplifier, and WC designates a write control circuit for writing the data input signal $D_m$ into memory cell under the command of a write-in signal WE. A peripheral circuit serves for generating pulse signals required for operation of the individual circuit in accordance with external inputs. A reference symbol $M_A$ denotes a main amplifier for amplifying the readout signals on the input/output (I/O) line. The circuit shown in FIG. 19 may be employed as the main amplifier. A reference numeral 3 designates a circuit for outputting signals 5 in accordance with a deviation or variation in the fabrication process condition and the operating condition onto the lines 5 for controlling operation of the individual circuit so that the characteristics thereof can be stably maintained. The individual circuits are implemented in the configurations shown in FIGS. 7 to 20 so as to be controlled by the outputs of the circuit 3.

In operation, upon inputting of a signal CE, the memory read operation is started. The address input signal $A_m$ is amplified by the address buffer circuit AB to supply the output signal thereof to the decoders X-Dec and Y-Dec. In response thereto, one word wire W is selected by the associated drivers "X-Dec & Driv", whereupon information charge stored in the capacitors of the memory cell is outputted onto the selected data wire or line, resulting in appearance of a feeble signal on the data line, which signal is then amplified by the sense amplifier SA. The selected data wire signal is outputted to the I/O and $\overline{I/O}$ ports through "Y-Dec & Driv". This signal is amplified by the main amplifier $M_A$ to be outputted externally as the signal $D_{out}$. The write operation is performed through a procedure reverse to the above in response to the data input signal WC.

With the arrangement described above, controls may be performed for various purposes.

In the first place, there can be mentioned a control method for maintaining the operation speed or reliability of the whole circuit to be constant. To this end, the control circuit 3 can produce the control signals conforming to the individual circuits in accordance with the fabrication process condition and the operating condition, which control signals being outputted to the circuit 5 to be utilized for the intended controls.

A method of controlling the individual circuits independently in accordance with the functions thereof is described below. In particular, in the case of the DRAM, the memory cell array unit is realized by using the finest (smallest) elements and is poor in respect to its dielectric (dioxide) breakdown strength as compared with the other circuitries. Under the circumstances, the control of the memory cell array will be concerned with the enhancement of reliability, while the control for the other circuits will be for operation speed and stabilization. The method of controlling the operation speed can be realized in accordance with the embodiments of the invention described hereinbefore. Concerning the control of the memory array, several methods are conceivable. One of them is a method of maintaining the electric field to be constant in the thickness of insulation film of the capacitor $C_S$ constituting the memory cell. This is because the dielectric breakdown strength of the capacitor $C_S$ is smallest in the whole chip, since there is a general trend for minimizing the thickness $t_{OXS}$ of the insulation film of the capacitor serving as the dielectric thereof with a view to realizing the element $C_S$ as a large capacitance in the smallest possible area where the element $C_S$ should have a large capacitance for ensuring the stable operation by increasing the amount of information charge $Q_S$. In order to ensure high reliability by maintaining the electric field $E_{OXS}$ to be constant, the output voltages of the sense amplifier drive circuit SAD, precharge driver DP, write circuit WC and others may have to be controlled to thereby control the voltage $V_S$ at which the information is written in the cell element $C_S$. In this connection, the quantity of information charge $Q_S$ is expressed as follows:

$$= \frac{\varepsilon_{oxs} \times A_{oxs}}{t_{oxs}} \times V_s \qquad (45)$$

$$= \varepsilon_{oxs} \times A_{oxs} \times E_{oxs} \qquad (46)$$

$$Q_s = C_S \times V_S \qquad (47)$$

where $\varepsilon$ represents the dielectric constant, and $A_{OXS}$ represents the area of $C_S$.

As will be seen from the above expression, the quantity of information charge $Q_S$ can be maintained constant by maintaining constant the electric field $E_{OXS}$, whereby reliability as well as stability of operation can be enhanced. Further, as the temperature rises, the diffusion layer leakage current in the memory cell MC is decreased. Accordingly, the minimum quantity of the information charge required for the stable operation also has to be increased. To this end, such control may be performed for increasing the information charge $Q_S$ and hence the electric field $E_{OXS}$ as the temperature becomes higher, to thereby further enhance the reliability. In this case, since conductance $G_m$ of the MOS transistor is lowered as the temperature increases, the control can be accomplished without involving any significant increase in the peak values of the data line charge/discharge currents.

Further, there can be mentioned a control method associated with the MOS transistors constituting other parts of the memory cell MA. The MOS transistor is the finest element on the chip, and in most cases, the dielectric breakdown strength and the hot-carrier breakdown strength tend to be smaller when compared with other elements. The various strength factors of the MOS transistor are more degraded as the gate length $L_g$ is shorter and as the gate insulation film thickness $t_{OXS}$ becomes smaller. Accordingly, it is desirable to lower the voltages applied to the word wire, data wire and others, as the values of the gate length $L_g$ and the insulation film thickness $t_{OXS}$ become smaller. To this end, the control of the applied voltage can be performed by a method similar to those described hereinbefore. Besides, the hot carrier breakdown strength also becomes lowered as the temperature decreases. Accordingly, the voltages on the data wire and others may have to be lowered as the temperature becomes lower. Through this control, there can be realized highly stable and reliable characteristics. Needless to say, the control method described just above may be combined with the control method concerned with the memory cell capacitance $C_S$.

As will be appreciated from the above description, operation of the DRAM can be controlled in association with various factors. In the case of the DRAM, the prevailing trend is to implement the constituent element in a smaller and smaller size in an effort to realize a higher integration bit density. At present, an external power supply voltage $V_{CC}$ of 5 volts is used, it is expected in the future that difficulty will be encountered in applying a voltage of 5 volts directly to the fine elements in view of degradation in the voltage withstanding capability thereof as the integration bit density is increased from 4 Mbits and hence to 16 Mbits. However, a smaller value of the voltage $V_{CC}$ than 5 volts is not preferred when taking into consideration the compatibility with the conventional DRAMs, because otherwise a burden is imposed on the user. Accordingly, it is also preferred in the case of DRAM that a lower voltage than $V_{CC}$ is generated by the control circuit such as shown in FIGS. 4 and 5 to thereby protect the fine constituent elements of the DRAM in performing the various controls.

Figure 54:
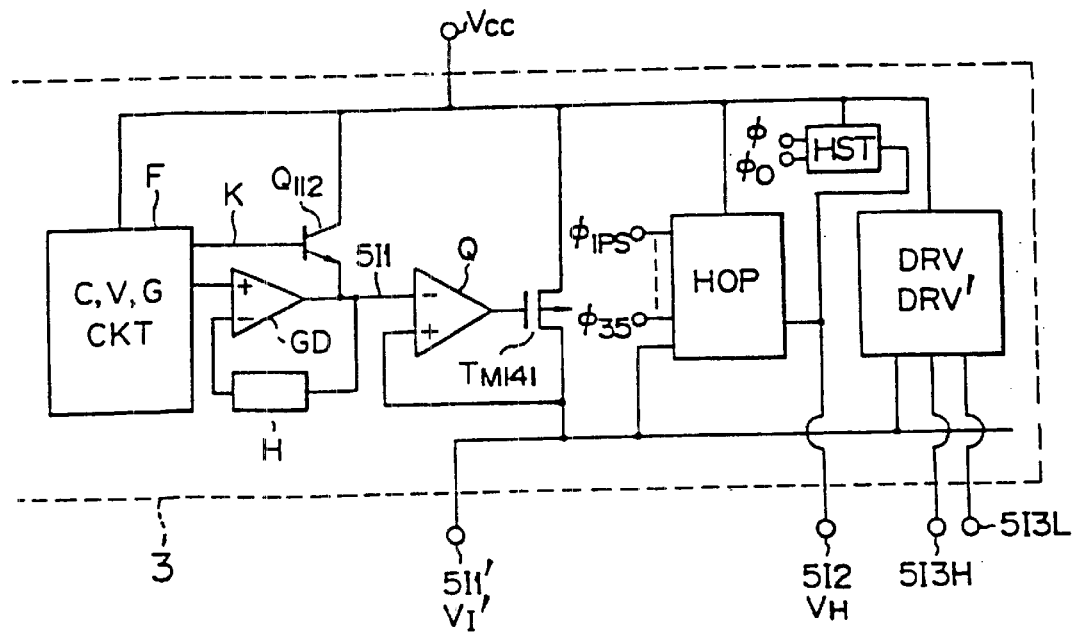
Figure 55:
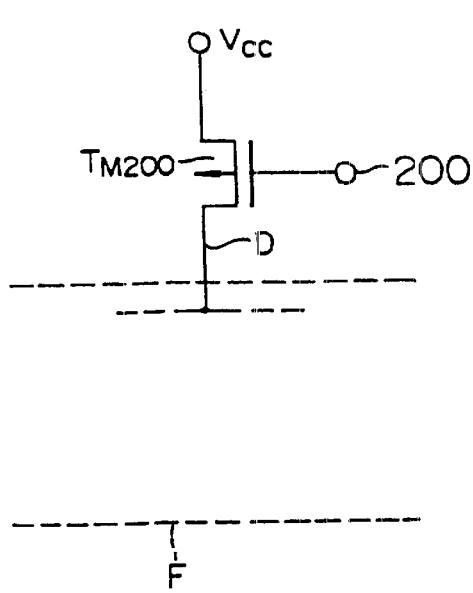
Figure 56:
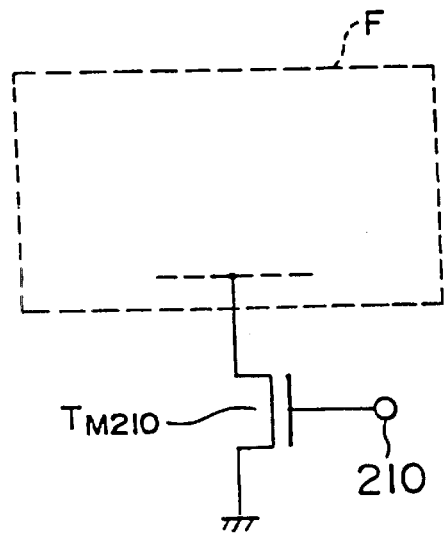

FIG. 54 shows an embodiment of a control circuit according to the present invention which incorporates therein the power supply circuit mentioned above. In this figure, reference symbol 511' denotes a control line for supplying a voltage $V_I'$ lower than $V_{CC}$ to peripheral circuits such as address buffer, decoder, clock driver and the like, 512 denotes a control line for supplying voltage V higher than $V_1'$ to a word driver circuit, 513H and 513L denote control lines for controlling driver circuits SAD and $\overline{SAD}$ for the sense amplifier SA. It goes without saying that the control circuit 3 shown in FIG. 54 includes other circuits as required for the control, although they are omitted from illustration. Further, in FIG. 54, reference symbol F denotes a constant voltage generating circuit for generating a stable reference voltage suited for the aging test, $Q_{112}$ denotes a bipolar transistor, GD denotes a comparator, H denotes a feedback circuit, Q denotes a comparator for supplying the voltage $V_I'$ lower than $V_{CC}$ to the address buffer, decoder, the clock drivers and the like on the basis of the reference voltage $V_I'$ $T_{M141}$ denotes MOS transistor, HOP denotes a high voltage generating circuit for supplying a higher voltage V than $V_I'$ to the word driver and others for operation, HST denotes a high voltage generating circuit for generating a high voltage in the standby state, and DRV and DRV' denote driver circuits for controlling a data wire voltage $V_O$ and a data wire current, respectively. With the arrangement shown in FIG. 54, the voltages $V_I'$ and $V_I$ are equal to each other. Besides, the voltages V and $V_O$ are determined on the basis of the voltage $V_I'$. Accordingly, all the internal voltage within the DRAM can be controlled on the basis of the voltage $V_I$. Thus, the memory cell array and the peripheral circuits according to the preceding embodiment can be positively protected against variation in their characteristics regardless of fluctuation in the external voltage $V_{CC}$ and temperature, whereby a DRAM enjoying extremely stable operation can be realized. The aging test can of course be carried out effectively. In case the circuit shown in FIG. 37 or 45 is employed as the constant voltage circuit F in the control circuit 3 shown in FIG. 54, power consumption can be reduced in the manner elucidated below. In the constant voltage circuit F shown in FIGS. 37 and 45, the output voltage $V_{I1}$, is determined by the resistance ratio, as will be seen from the expression (15). Besides, the aging voltage characteristics are also determined by the resistance ratio, as can be seen from the expression (20). In this way, the characteristics undergo no variation independent of change in the absolute value of the resistances, which in turn means that the characteristics are less susceptible to the influence of deviations in the fabrication process condition. Accordingly, it is possible to set only the current at a desired value with the resistance ratio being left unchanged, by multiplying the absolute values of resistors uniformly with a factor Z (Z is greater than zero). In case the current value is decreased, noise generated by another circuit implemented on the same semiconductor substrate may provide an influential factor. This problem can be solved by increasing the current flowing to the reference voltage generating circuit F when the semiconductor device including this circuit F is in the operating state, to thereby prevent fluctuation in the voltage brought about by noise or other transients, while in the standby state, the current is decreased for the purpose of reducing the power consumption. FIGS. 55 and 56 illustrate embodiments of the circuit designed to this end. Referring to FIG. 55, a P-channel MOS transistor is provided between a positive (plus) voltage supply terminal D of the reference voltage generating circuit F and the external power supply source $V_{CC}$. In the case of the circuit shown in FIG. 56, an N-channel MOS transistor is connected between the grounded terminal of the reference voltage generating circuit F and the ground potential. By varying the gate voltage of the P-channel MOS transistor $T_{M200}$ or that of the N-channel MOS transistor $T_{M210}'$ the current value of the reference voltage generating circuit F can be easily controlled. In the circuit shown in FIG. 55, for example, when the potential at the gate terminal 200 is lowered, the resistance of the P-channel MOS transistor $T_{M200}$ is decreased, whereby the current flowing to the reference voltage generating circuit F is increased. On the other hand, when the potential at the gate terminal 200 is increased, the resistance of the P-channel MOS transistor $T_{M200}$ is increased, so that the current flowing to the reference voltage generating circuit F is decreased. Thus, according to the embodiment shown in FIG. 55, the potential at the terminal 200 is lowered when the semiconductor device including the reference voltage generating circuit F is in the operating state, while it is raised in the standby state, whereby fluctuation in the voltage value due to noise or the like can be prevented in the operating state with the power consumption being reduced in the standby state because of the decreased current. Also in the case of the embodiment shown in FIG. 56, similar effects can be attained by raising the potential at the terminal 210 in the operating state while lowering it in the standby state. Since an N-channel MOS transistor is used in the circuit shown in FIG. 56, the gate width can be decreased more than that of the P-channel MOS transistor used in the circuit shown in FIG. 55. Thus, the circuit configuration shown in FIG. 56 allows the area occupied by the circuit to be decreased when compared with the circuit shown in FIG. 55. It should further be added in connection with the circuits shown in FIGS. 55 and 56 that insertion of the MOS transistor between the power supply source and the reference voltage generating circuit involves lowering the net voltage applied to the reference voltage generating circuit owing to the resistance between source and drain of the MOS transistor. However, since the output voltage $V_{f1}$ of the circuit shown in FIG. 37 or 45 is held substantially at a constant value independent of the power supply voltage, as will be seen from the expression (15), the current control can be carried out without exerting any appreciable influence to the voltage characteristic.

The driver circuits for the address buffer, decoder, clock driver or the like operating with the power supply from the control line 5I' in the circuit shown in FIG. 54, can be comprised of one of the circuits shown in FIGS. 9 to 17 replacing $V_{CC}$ by $V_I'$ If desired, the voltage $V_I'$ may be utilized as the control voltage in the circuits shown in FIGS. 7 and 8. Although illustration of logic circuits such as a NAND circuit used for the decoder is omitted in FIGS. 7 to 17, it will readily occur to those skilled in the art to replace the circuit DRIV shown in FIG. 11A with a NAND circuit, by way of example. By the way, in applications where the load capacitance is large, highspeed operation can be accomplished by using the BiCMOS circuit. In this connection, it is to be noted that when the breakdown strength of the bipolar transistor $Q_3$ in the circuits shown in FIGS. 8, 12 and so forth is sufficiently great, the collector potential may be left at the level of the external voltage $V_{CC}$. In that case, since the collector current is supplied from the external power supply $V_{CC}$, a major proportion of the charging current is derived from $V_{CC}$, as a result of which the voltage $V_I'$ is sufficient to be capable of supplying only the base voltage. With this circuit arrangement, the current supply from $V_I'$ can be reduced while assuring the stability of the circuit characteristics because the collector potential scarcely exerts influence to the circuit characteristics so long as the collector potential lies within the range in which the bipolar transistor is not saturated. In this way, the voltage $V_I'$ can be held more stably. Further, it is noted that in the first stage of the address buffer to which the external signal is directly inputted, there arises a large penetration current when amplitude of the externally inputted signal is inadequate. Accordingly, if $V_I'$ is used as the power supply for this stage of the address buffer, the current supplied from the voltage source $V_I$, is increased, making it difficult to maintain the voltage $V_I'$ to be constant. To deal with this problem, it is possible to operate only the first stage of the address buffer with the external voltage $V_{CC}$.

Figure 57:
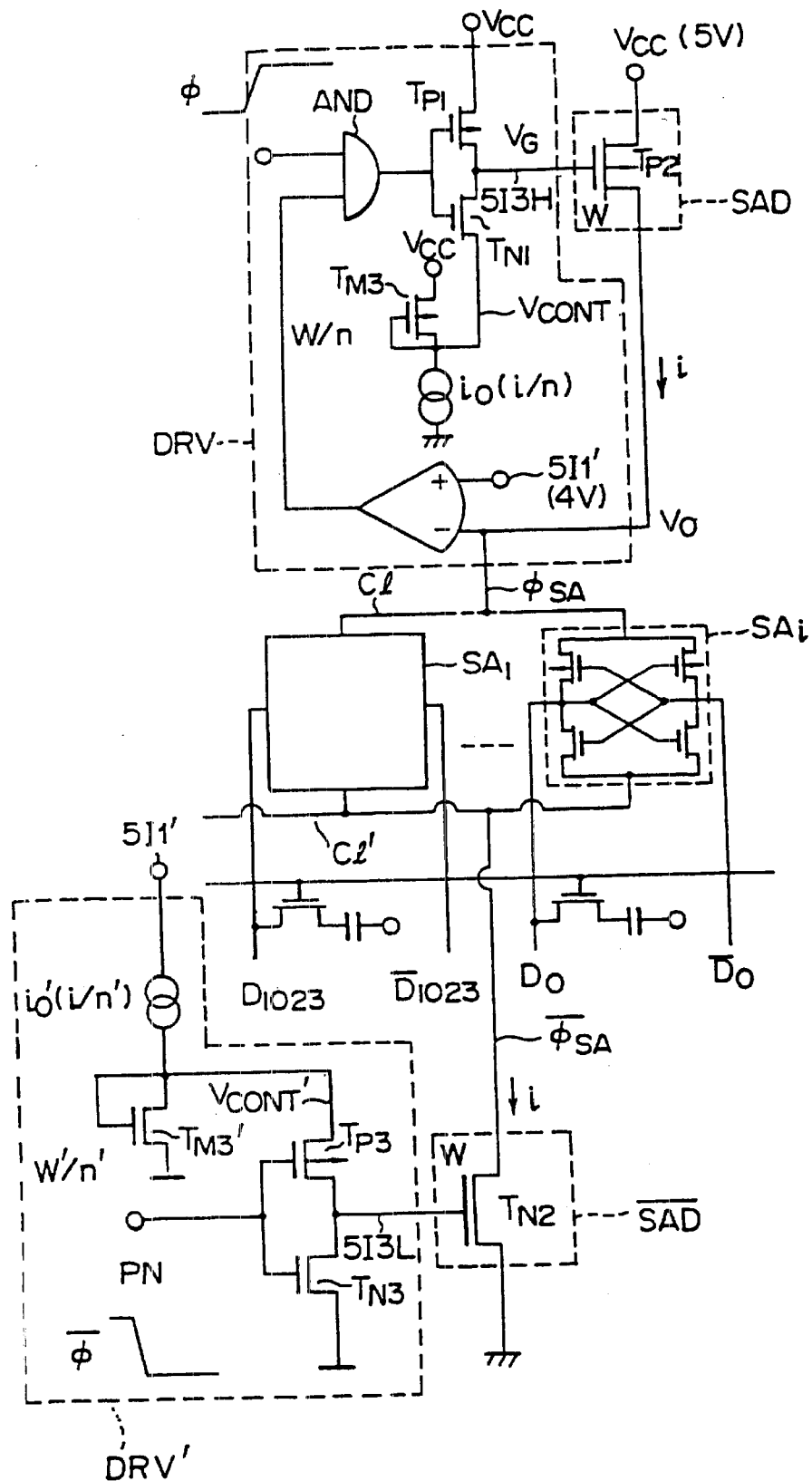

Next, an embodiment of the invention for controlling the charge/discharge of the data line or wire will be described by referring to FIG. 57.

In the DRAM, it is practically performed to charge and discharge the paired data wires through a well known sense amplifier composed of P-channel and N-channel MOS transistor in dependence on information read out from a memory cell (constituted by one MOS transistor and one capacitor). At that time, the quantity of electric charge $Q_c$ stored in the capacitor of the memory cell is determined by a product of the data line voltage $V_{DL}$ and the capacity $C_S$ of the capacitor. In view of the reliability of the DRAM, it is desirable to maintain the above-mentioned charge quantity $Q_c$ to be stable. Accordingly, by making the data line voltage $V_{DL}$ independent of the external power supply voltage $V_{CC}$ and temperature, highly stable and reliable operation insusceptible to the influence of external conditions can be ensured. Furthermore, by setting the data line voltage $V_{DL}$ at a value lower than the external power supply voltage $V_{CC}$ within the range in which operation is affected by no adverse influence, the power consumption can be reduced. In a modem M-bit DRAM, for example, it is necessary to charge simultaneously 1024 pairs of data lines at a high speed. In that case, the capacity in total of these data lines amounts to as large a value as on the order of 500 to 1000 pF drive transistor $Q_D$. When the transistor $Q_2$ is off (non-conduction) with $Q_1$ being on, the transistor is tuned off. In the mirror circuit, the current inlet of the internal current supply is represented by i/n, the gate width of the MOS transistor is represented by w/n and the gate width of the transistor $Q_D$ is represented by W, the ON-current (current in the conducting state) of the output drive transistor $Q_D$ is a constant current i. By setting the ratio of i/n to be constant, the drive current of the transistor $Q_D$ can remain substantially constant even when the factor w or gate width and the threshold value of the transistor is changed due to deviation in the fabrication process condition. The reason for selecting i/n and w/n involves the problem concerning the transient current, which of course should preferably be reduced. Further, in order to reduce the occurrence of noise, accompanying the charge and discharge, it is desirable to carry out symmetrically the charge and the discharge of the data line.

According to another embodiment of the invention, it is therefore proposed to make the data line voltage $V_{DL}$ equal to the aforementioned voltage $V_I'$ through the control by the voltage transformer (limiter) circuit described hereinbefore to thereby nullify the external voltage dependency as well as the temperature dependency and at the same time to reduce the power consumption by reducing the voltage $V_{DL}$ below $V_{CC}$ while reducing the transient current and noise mentioned above by controlling the rate of charging and discharging of the data line. Now, this embodiment will be described. Charging of the data line is performed by the driver circuit DRV connected to a common line cl of a flip-flop constituting a part of the sense amplifier composed of a P-channel MOS transistor. The instant embodiment is characterized in that the above-mentioned drive circuit DRV is constituted by a current mirror circuit and a comparator, wherein the current mirror circuit is controlled by a sort of inverter constituted by transistors $Q_1$ and $Q_2$. When the transistor $Q_2$ is turned on with the transistor $Q_1$ being off, the current mirror circuit is formed through cooperation by a transistor $Q_3$, a constant current supply source (i/n) and an output 2 drive transistor $Q_D$. When the transistor $Q_2$ is off (non-conducting) with $Q_1$ being on, the transistor is turned off. In the mirror circuit, the current inlet of the internal current supply is represented by i/n, the gate width of the MOS transistor is represented by w/n and the gate width of the transistor $Q_D$ is by W, the ON-current (current in the conducting state) of the output drive transistor $Q_D$ is a constant current i. By setting the ratio of i/n to be constant, the drive current of the transistor $Q_D$ can remain substantially constant even when the factor w or gate width and the threshold value of the transistor is changed due to a deviation in the fabrication process condition. The reason for selecting i/n and w/n for the constant current supply source is for the purpose of diminishing the current consumption as well as the area to be occupied. It is preferred to select n to be greater.

The comparator serves to compare the output voltage $V_I'$ (e.g. 4 volts) of the voltage transformer (limiter) circuit and the output voltage $V_0$. When $V_1'$ is higher than $V_0$, the output of the comparator is a voltage of high level. Reversely, when $V_I'$ is lower than $V_0'$ the comparator outputs a voltage of low level.

Now, the operation will be described.

Figure 58:
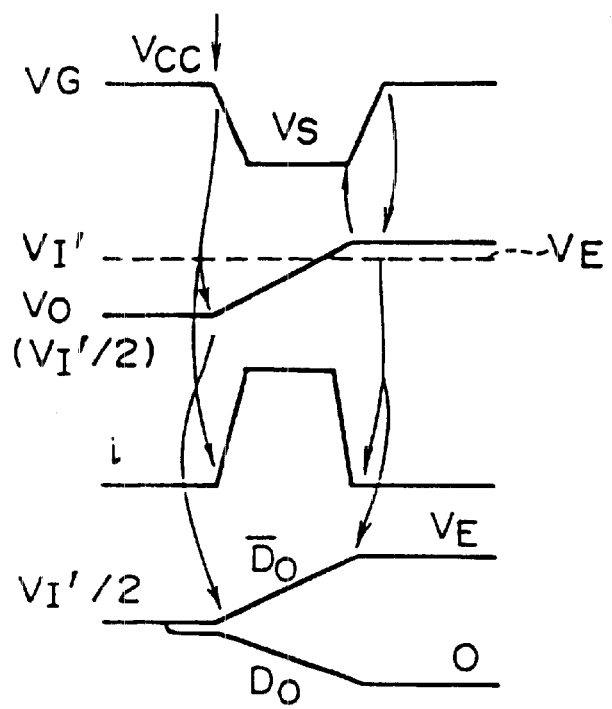

Ordinarily, the DRAM is implemented as a so-called half-precharge type DRAM in which the paired data lines are set at a voltage value approximately equal to a half of the data line voltage $V_{DL}$ during the precharge period. Accordingly, the common drive line cl or all the paired data lines are precharged to the level of $V_{DL}/2$ during the precharge period. When a pulse is applied to a selected one of the word lines in this state, minute differential read-out signals appear on each pair of the data lines, as illustrated typically by $D_0$ and $\overline{D_0}$ in FIG. 58. Subsequently, the low voltage is discharged to 0 volt with the high voltage being charged to $V_1'$ by the sense amplifier constituted by N-channel and P-channel MOS transistors. Discharge is effectuated through the MOS transistor $T_{N2}$. The following description will be directed only to the charging operation. The common line cl is driven by application of an input pulse ø. When the input pulse ø is ON (i.e. high voltage is inputted), the output voltage of a control
circuit AND assumes a high voltage level, while the gate voltage $V_G$ of the transistor $Q_D$ assumes the same level as the output voltage $V_S$ of the constant current supply source, whereby the load is driven with the constant current i by the drive transistor $Q_D$. As a result of this, the load voltage $V_0$ rises up at a constant rate from the level $V_I'/2$. However, when the load voltage $V_0$ exceeds $V_I'$, the comparator operates to cause the output of the control circuit AND to assume a low level, as a result of which the transistor $Q_1$ is turned on with $Q_2$ being off. Thus, the drive transistor $Q_D$ is turned off, whereby the output voltage $V_0$ is clamped at a level substantially equal to $V_I'$. Consequently, one of the paired data lines is charged approximately to $V_I'$ from the level $V_I'/2$.

It will be appreciated that the discharge rate is controlled as in the case of the charging operation since the N-channel MOS transistors $T_{M3}$, and $T_{N2}$ form a current mirror circuit in response to application of the input pulse ø.

According to the embodiment described above which allows the data line voltage $V_{DL}$ to be approximately equal to the voltage $V_I'$ the temperature dependency of the data line voltage $V_{DL}$ can be zeroed while the dependency on the external supply voltage $V_{CC}$ can be nullified within a desired range. Furthermore, since the data line can be charged with a substantially constant current, the charging of the data lines can be achieved at a high speed without being accompanied with any appreciable increase in the transient current. Besides, by keeping the current $i_o$ to be constant, influence of fluctuation in the source voltage and deviation in the fabrication process conditions can be suppressed to minimum. Additionally, the power consumption can be reduced by virtue of the low data line voltage. Finally, the possibility that the data line charging and discharging can be carried out at the same speed is advantageously effective in noise reduction.

Now, an embodiment of the word line drive circuit will be described. In the DRAM, the voltage on the word line is set at a level higher than that of the data line by about 2 volts. By way of example, if the data line voltage is 4 volts, that of the line must be about 6 volts. Thus, there exists a need for a means to increase the word line voltage beyond the external supply voltage $V_{CC}$ which is typically 5 volts. The circuit for driving the word line with a voltage $V_H$ higher than the external supply voltage $V_{CC}$ may be realized in such configuration shown in FIG. 59, by way of example. The circuit for generating the voltage $V_H$ will be described hereinafter.

Figure 59:
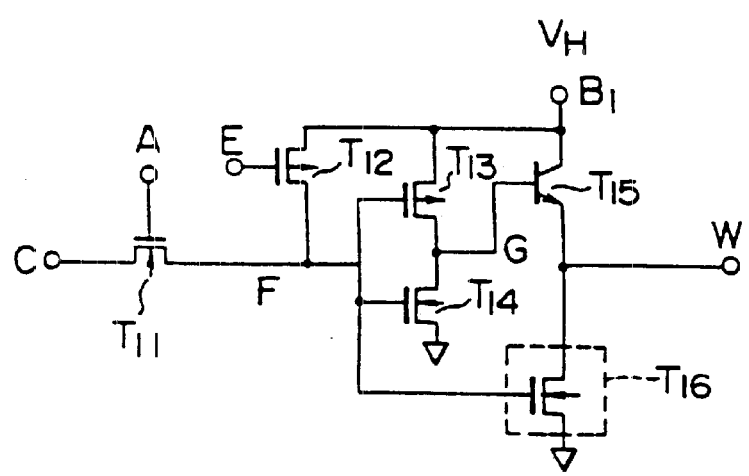
Figure 60:
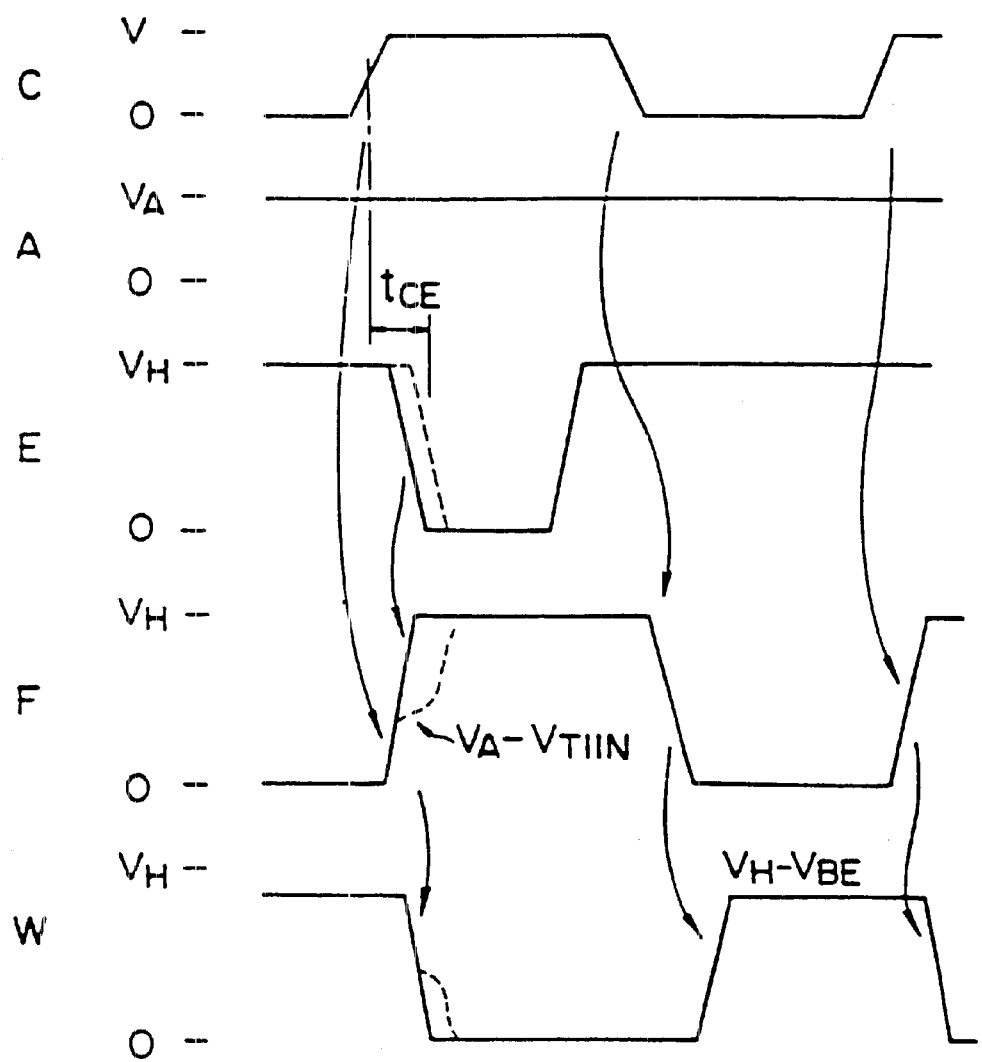

Operation of the circuit shown in FIG. 59 will be explained by reference to a voltage waveform diagram shown in FIG. 60. When a high potential appears at a terminal C in the state in which the potential at a terminal E is high, the potential at the line F is set at a level of $V_A - V_{THn}$ (FIG. 60) by an N-channel MOS transistor $T_{II}$. Subsequently, when the potential at E becomes low, a P-channel MOS transistor $T_{12}$ is turned on, with the potential at F is $V_H$. As a consequence, a P-channel MOS transistor $t_{13}$ turned off with an N-channel MOS transistor $T_{14}$ being on, while a bipolar transistor $T_{15}$ is turned off with an N-channel MOS transistor $T_{16}$ being on, whereby the output W is set to zero volt. Parenthetically, when the potential on the line F rises up to $V_H$, the potential at terminals A and C remains zero with the transistor $T_{II}$ being off. Accordingly, lowering of the potential at F due to the current flow from F to C will never take place. On the other hand, when the potential at the terminal C becomes low in the state in which the potential at the terminal E is high, the transistor $T_{II}$ is turned on, resulting in that the same low potential makes appearance at both terminals F and C. As a result of this, the transistor $T_{13}$ is turned on with the transistors $T_{14}$ and $T_{16}$ being both off, resulting in that the potential $V_H$ makes appearance at a circuit mode G, whereby the output W assumes rapidly a high potential level of $V_H - V_{BE}$ (FIG. 60). In conjunction with this circuit, it is noted that when the period $t_{CE}$ (FIG. 60) intervening between a time point at which the terminal C assumes the high potential and a time point when the potential at E becomes low is long, the potential at E remains at the high level of $V_A - V_{TIIn}$ for a time, a penetration current flows through the transistors $T_{13}$ and $T_{14}$, as a result of which there may exist a period during which the potential at W remains at a low level. Accordingly, it is desirable to shorten the period $t_{cE}$. This can be accomplished by changing over the potential at E to low level simultaneously with appearance of high potential at C. Thus, the above-mentioned problem can be solved.

According to the circuit described above, the word line can be charged to the potential level of $V_H - V_{BE}$ at a high speed by virtue of employment of the bipolar transistor at the output stage. It is however to be mentioned that the output may be directly led out from the circuit point G without using the bipolar transistor 15, as shown in FIG. 7A. In that case, the output voltage rises up to the level $V_I$. Accordingly, the voltage $V_H$ equal to the desired word line voltage can be generated. This means that the design of the voltage source G can be much facilitated when compared with the design in which the bipolar transistor is used. Further, since the circuit under consideration can be constituted by the MOS transistors, the fabrication process is correspondingly facilitated. It should be added that in the case of the circuit shown in FIG. 59, a MOS transistor may be inserted in succession to the power supply for the purpose of controlling the operation speed, as described hereinbefore in conjunction with the circuit shown in FIG. 13.

Figure 61:
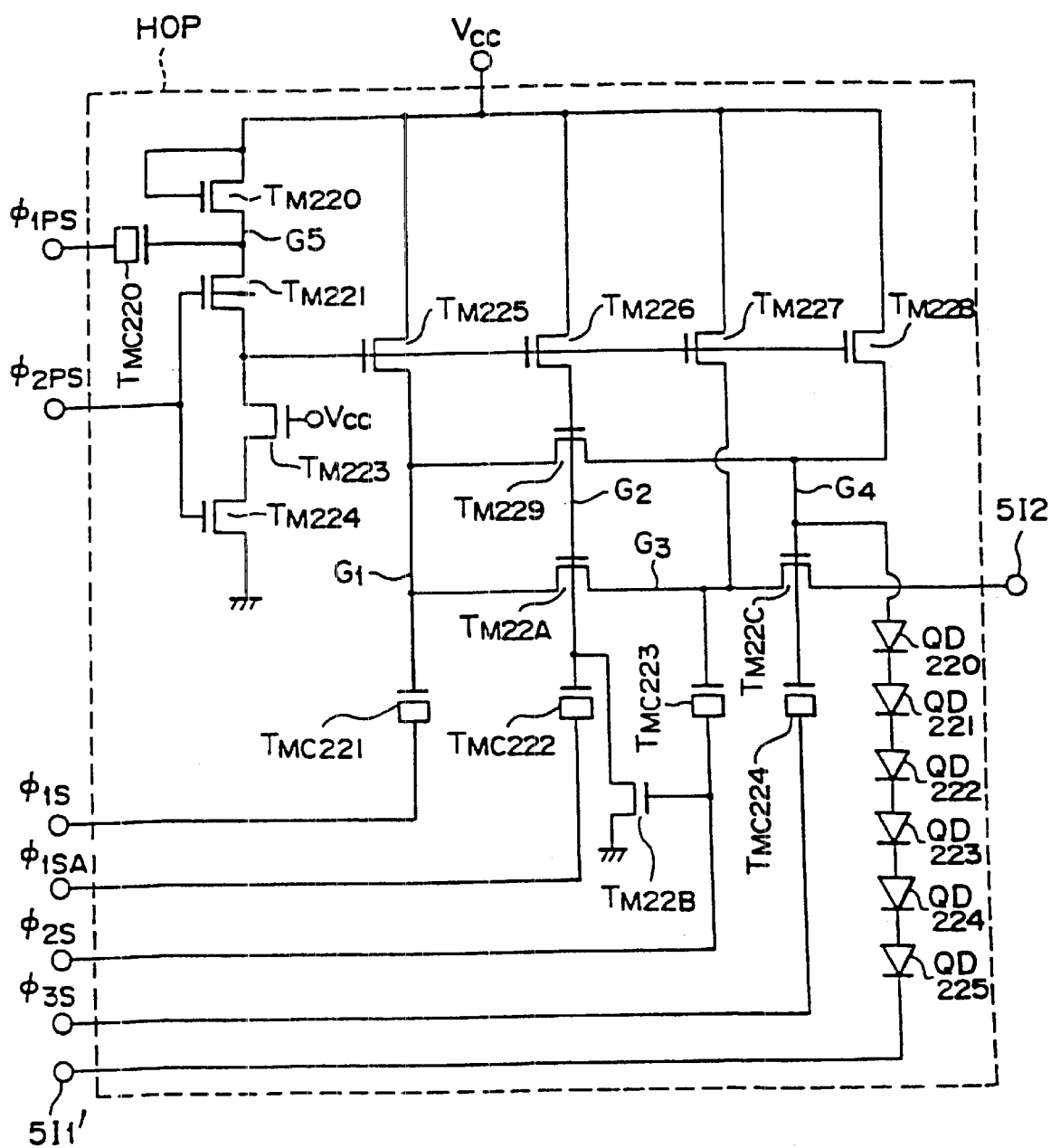
Figure 62:
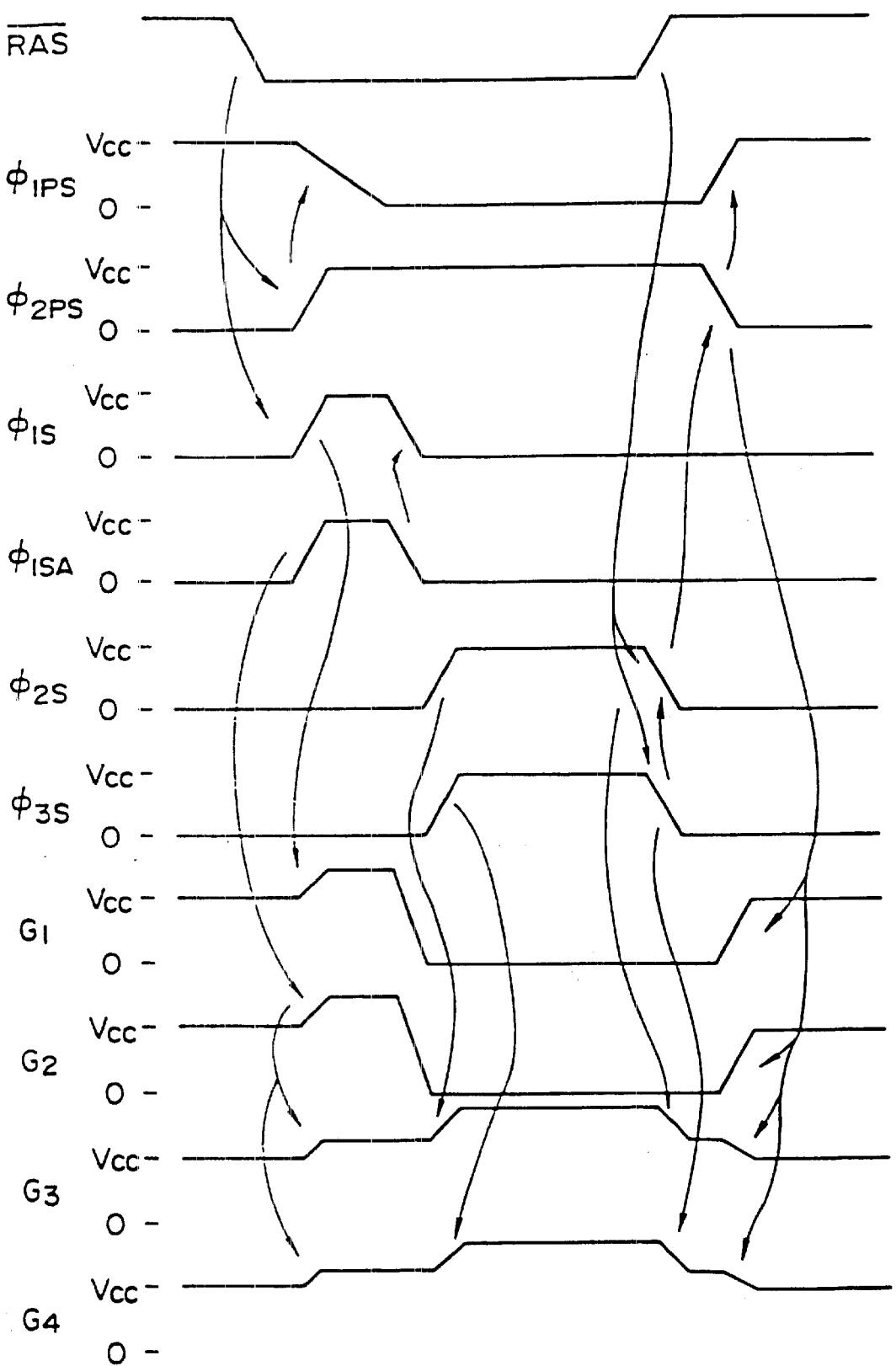

FIG. 61 shows an embodiment of a circuit for obtaining a high voltage not lower than the external voltage $V_{CC}$ on the basis of the voltage $V_I$, and FIG. 62 is a waveform diagram for illustrating operation of the above-mentioned circuit. In the following, operation of the circuit shown in FIG. 61 will be described by reference to FIG. 62.

Figure 63:
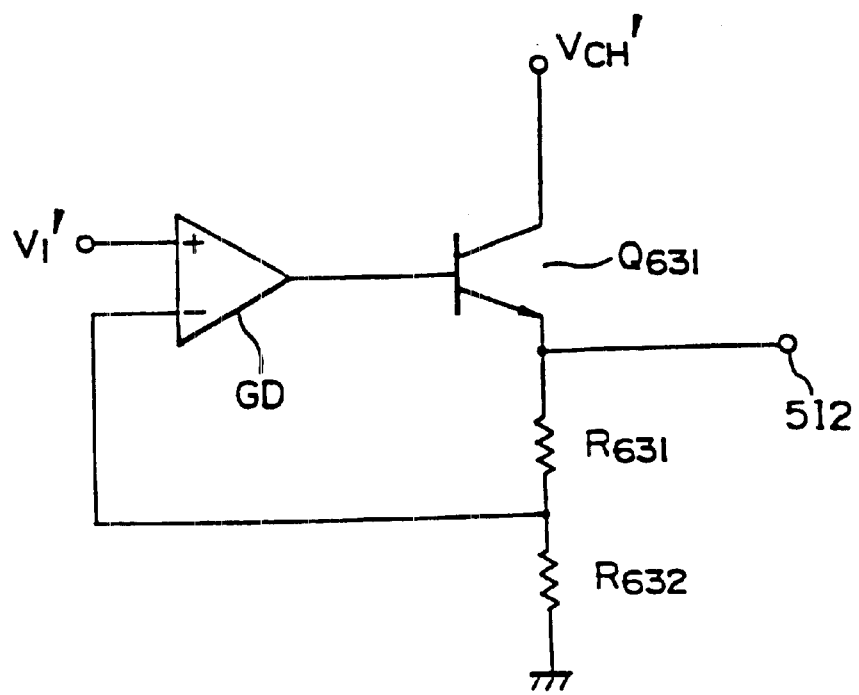

The circuit shown in FIG. 61 serves to boost the terminal voltage $V_H$ in synchronism with a signal $\overline{RAS}$ in the DRAM. When the DRAM starts operation in response to the signal $\overline{RAS}$ of a low level, a pulse signal $\phi_{1ps}$ transits or shifts to a low level and signals $\phi_{1S}$ and $\phi_{1SA}$ shifts to high levels, respectively, as illustrated in FIG. 62. As a result, lines G1 and G2 of those G1, G2, G3 and G4 precharged to the same potential as the external power supply voltage $V_{CC}$ are boosted by MOS capacitances $TMC_{221}$ and $TMC_{222}$, as a result of which currents flow to G4 and G3 from G1 by way of MOS transistors $TM_{M29}$ and $TM_{22A}$, whereby the potentials at the lines G3 and G4 are increased. At this time point, since the line G2 is boosted higher than the external voltage $V_{CC}$, the potentials at G3 and G4 can be increased without being limited to the threshold values of the MOS transistors $TM_{229}$ and $TM_{22A}$, respectively. Next, the signals $\phi_{1S}$ and $\phi_{1SA}$ transit to low level with $\phi_{2S}$ and $\phi_{3S}$ shifting to a high level. Then, the potential at G1 and G2 transit to a low level while the line G3 and G4 are boosted up. At that time point, the potential at G2 becomes zero volt since the MOS transistor $TM_{22A}$ is turned on in response to the high level of $\phi_{2S}$ whereby the MOS transistor $TM_{22A}$ is turned off. Thus, the potential at G2 is prevented from being increased under the influence of deviation in the timing of the pulse signal $\phi_{2S}$ or due to coupling noise. Consequently, a current flows from G3 to the terminal 512 through the MOS transistor $TM_{22C}$, whereby the terminal 512 is boosted. Because of the presence of a serial connection of six diodes between the gate of the MOS transistor $TM_{22C}$ and the terminal 511', the potential at G4 is clamped to the level of $V_{CL} = 6V_{BE}$. As a sequence, the voltage at $V_H$ is clamped to the level of $V_I' + 6V_{BE} - V_{T22C}$, where $V_{T22C}$ represents the threshold voltage of the MOS transistor $TM_{22C}$. When the $V_I'$ is set at 4 volts with $V_{BE}$ being set at 0.8 volt while $V_{T22C}$ is set at 0.8 volt, by way of example, then, the voltage at $V_I$, is 8 volts. In the illustrated embodiment, six diodes are used. By changing the number of these diodes, it is possible to prevent the voltage $V_H$ from exceeding the voltage $V_I'$ by a predetermined value. Accordingly, when the word driver, for example, is connected to $V_H$, the word line voltage can be controlled to a desired value. Subsequently, when the signal $\overline{RAS}$ of the DRAM assumes a high level, the signals $\phi_{2S}$ and $\phi_{3S}$ are reset to the low level with $\phi_{1SP}$ and $\phi_{2PS}$ being set to high and low levels, respectively. As a result, the potential at G5 is boosted up from the MOS capacitance $TM_{C220}'$ as a result of which the gate voltages of the MOS transistor $TM_{225}$, $TM_{226}$, $TM_{227}$ and $TM_{228}$ are boosted higher than the external power supply voltage $V_{CC}$ by way of the P-channel MOS transistor $TM_{221}$, whereby the potentials at G1, G2, G3 and G4 are set to the potential level of $V_{CC}$ through the above-mentioned MOS transistors to thereby restore the initial state. It should be mentioned that the MOS transistor $TM_{223}$ serves to prevent the drain of the MOS transistor $TM_{224}$ from being applied with a high voltage to thereby protect that transistor $TM_{224}$. When the series connection of diodes is employed, the voltage $V_H$ is imparted with temperature dependency because the voltage $V_{BE}$ exhibits a temperature dependency. For suppressing the temperature dependency of the voltage $V_H$, the amplitude of the pulse signals $\phi_1$, is to $\phi_{3S}$ may be selected equal to $V_I'$ rather than $V_{CC}$ with the clamping circuit being spared. In this case for obtaining the desired voltage value at 512, there may be employed such a circuit as shown in FIG. 63. By obtaining a high voltage $V_{CH}'$ by using the circuit shown in FIG. 63 in the circuit of FIG. 61, a voltage given by $V_{REF} \times (R_{631} + R_{632})/R_{632}$ is outputted at 512. As the reference voltage $V_{REF}$, there can be utilized the voltage $V_I'$ or other voltage having a temperature dependency which can cancel out the temperature dependency of the voltage $V_{BE}$ of the bipolar transistor $Q_{631}$.

Figure 66:
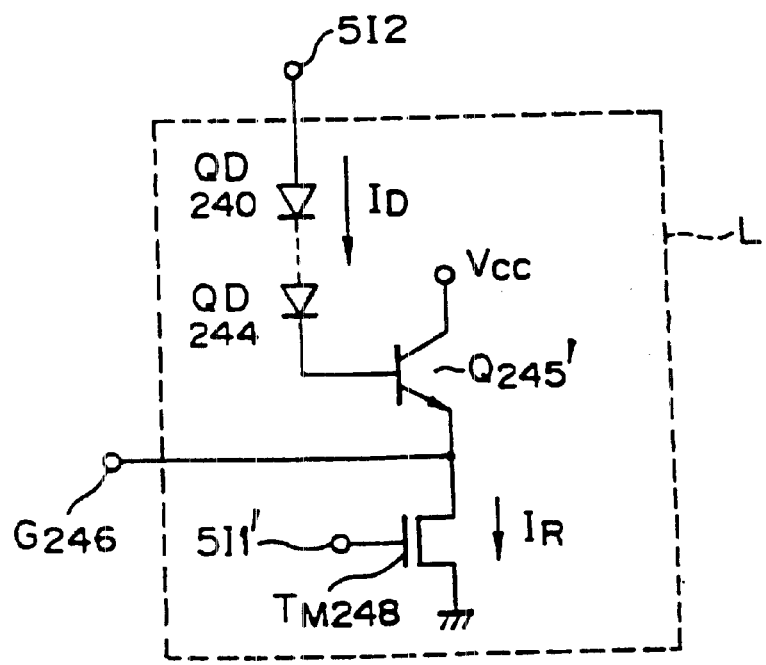
Figure 64:
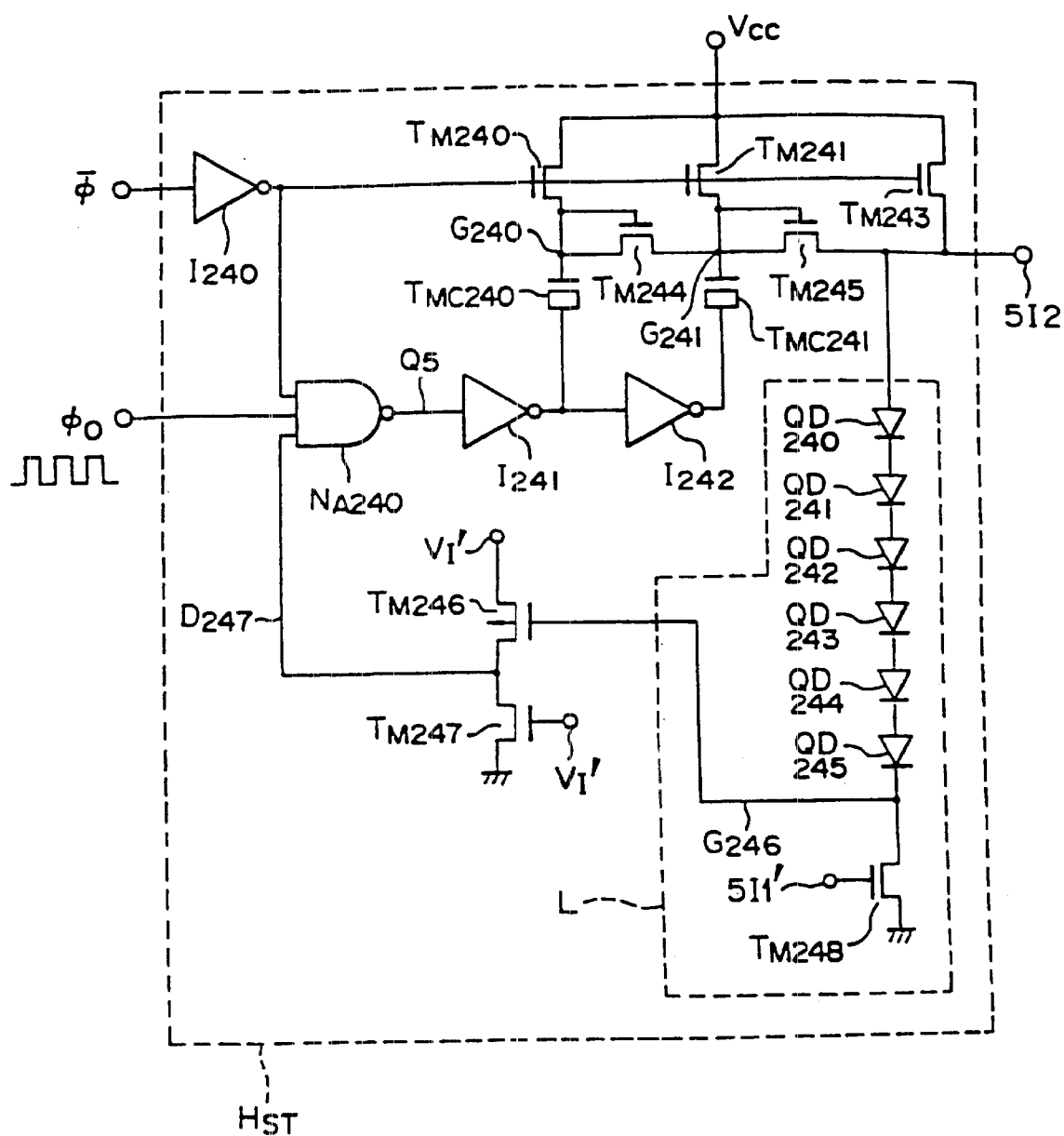
Figure 65:
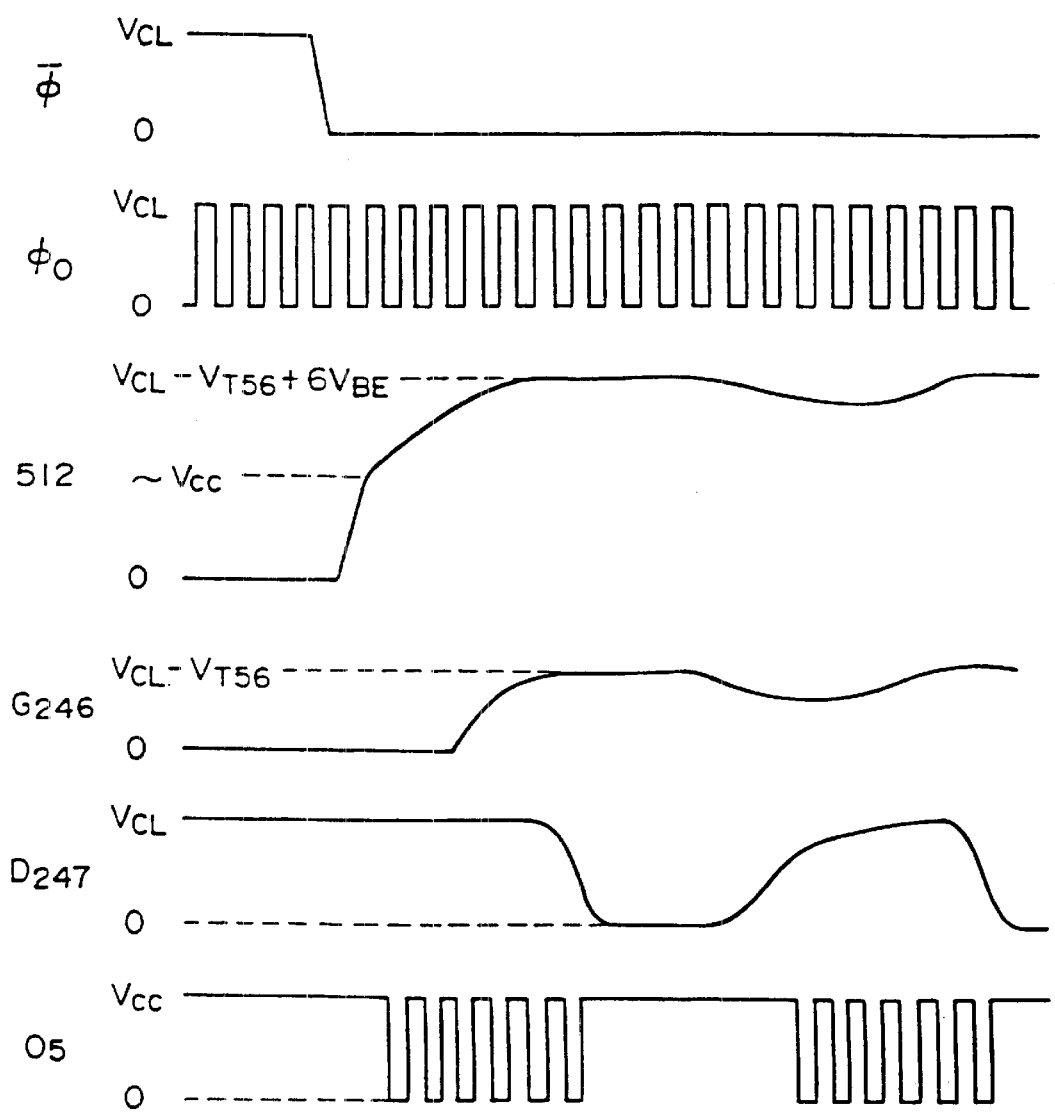

As will be appreciated from the above description, there can be obtained at 512 a voltage higher than $V_{CC}$. As described above, $V_H$ is boosted up on the operating state in synchronism with the signal $\overline{RAS}$ without being accompanied with the boosting operation in the standby state in which no current supply from $V_H$ is required, whereby the operation can be realized with low power consumption. However, the standby state may possibly continue over an extended period in dependence on the operating condition. In that case, it is conceivable that the potential $V_I$ at $V_H$ might be lowered for some reason such as leakage. This problem can however be solved by providing separately a circuit for compensating for the leakage in the standby state. To this end, the circuit described above in conjunction with FIGS. 61 to 63 in which, however, the capacitance and the size of the transistors are reduced to thereby lower the current driving capability may be additionally and separately provided so as to be operated independent of the signal $\overline{RAS}$. Alternatively, such a circuit as shown in FIG. 64 may be provided. In the following, operation of the circuit shown in FIG. 64 will be described by reference to FIG. 65. When a signal $\overline{\phi_0}$ is at low level, circuit points $G_{240}$ and $G_{241}$ as well as $V_H$ are precharged to a level approximating to the external voltage $V_{CC}$ by way of MOS transistors $TM_{240}$, $TM_{241}$ and $TM_{243}$. When $\phi_0$ subsequently rises up to a high level, the outputs of inverters $I_{241}$ and $I_{242}$ assume high and low levels, respectively. As a result, $G_{240}$ is boosted up beyond $V_{CC}$, whereby a current flows to $G_{240}$ to increase the potential threat. When $\phi_0$ becomes low, the outputs of the inverters $I_{124}$, and $I_{242}$ assume low and high levels, respectively, resulting in that $G_{241}$ is further boosted up to cause a current to flow toward $V_H$. In this way, by lowering and raising the level of the signal $\phi_0$ periodically, the potential at $V_H$ is increased. As the potential at $V_H$ rises, $V_{G246}$ at $G_{246}$ becomes high in accordance with the relation of $V_H-6V_{BE}$ by way of the diodes $QD_{240}$ to $QD_{245}$. When the voltage value given by $V_I'\ V_{T\,246}+{}^6V_{BE}$ is exceeded by the potential at $V_h$ upon setting of the threshold value of the MOS transistor $TM_{246}$ at $-V_{T246}$, then $V_{G246}=V_I'-V_{T56}$, MOS transistor $TM_{246}$ is turned off, resulting in that the potential $D_{247}$ is set to zero by the MOS transistor $TM_{247}$. As a consequence, the voltage at the output $Q_5$ of a NAND circuit $NA_{240}$ is fixed at a high level, to thereby stop the voltage boosting operation. Thereafter, when the potential at $V_H$ is lowered by the current $I_h$ flowing out from the control line 512 below the level given by $V_I'-V_{T246}+6V_{BE}$, then the MOS transistor $TM_{246}$ is again turned on to restart the $V_H$ boosting operation. In this way, the potential at $V_H$ can be maintained at a level of $V_I'-V_{T246}+6V_{BE}$ which is higher than the external power supply voltage $V_{CC}$ according to the embodiment shown in FIG. 64. By way of example, when $V_I'$ is set at 4 volts, $V_{T246}$ is at 0.5 volt and $V_{BE}$ is at 0.8 volt, then $V_H$ is at the potential of 8.3 volts. In this manner, according to the instant embodiment which corresponds to a combination of the charge pump circuit and the level shift circuit described hereinbefore, the output voltage $V_H$ can be maintained at a constant voltage higher than the external power supply voltage $V_{CC}$. Needless to say, the number of the clamping diodes $QD_{240}$ to $QD_{245}$ may be increased or decreased, as occasion requires. Further, in case the current flowing through the $QD_{240}$ to $QD_{245}$ from $V_H$ is excessively large, the diode $QD_{245}$ may preferably be replaced by a bipolar transistor $Q_{245}'$, wherein the collector thereof is connected to $V_{CC}$ with the base being connected to the output terminal of the diode $QD_{244}$, as is shown in FIG. 66. With this circuit configuration, the above mentioned current can be decreased to $1/h_{FE}$. The number of the diodes QD can be determined so that difference between the voltages $V_H$ and $V_H'$ is equal to a desired value. Further, the MOS transistor $TM_{248}$ may be replaced by other element such as a resistor. In case the MOS transistor is employed, a high resistance value can be realized with a relatively small area for occupation by selecting a larger gate length $L_g$ when compared with the gate width.

In the illustrated embodiment, it is assumed that the pn-junction type diodes are employed. In this connection, it will be readily understood that such a pn-junction type diode can be realized, for example, by connecting together the base and collector of the bipolar transistor. In that case, the diodes can be formed simultaneously with the bipolar transistors, which in turn means that the fabrication process can be correspondingly simplified. Such simplification can further be promoted by realizing the resistor by using the base layer of the bipolar transistor. Since the forward bias voltage $V_{BE}$ of the pn-junction type diode is ordinarily about 0.8 volt, the difference between the voltages $V_H$ and $V_I'$ in the device shown in FIG. 64 can assume only a value that is based on the unity voltage of 0.8 volt. There may however arise such a case where it is required that difference between the voltage $V_I$, and $V_I'$ be set at other value than 0.8n volts (n=1, 2, . . . ). In that case, a Schottky diode having the forward voltage $V_F$ on the order of 0.4 volt may be used. Then, $$V_H = V_I' - V_{T246} + iV_F \tag{56}$$

Figure 67:
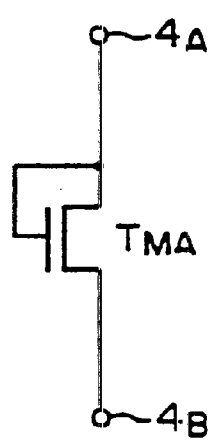

Thus, the value $V_H$ can be set on the basis of the unit voltage of 0.4 volt. Of course, a N-channel MOS diode may be used, as is shown in FIG. 67. In this case, $$V_H = V_I' - V_{T246} + iV_{TMA} \tag{57}$$

where $V_{TMA}$ represents the N-channel MOS diode $T_{MA}$. Thus, the potential difference of concern can be varied on the basis of the unity voltage of $V_{TMA}$.

Figure 68:
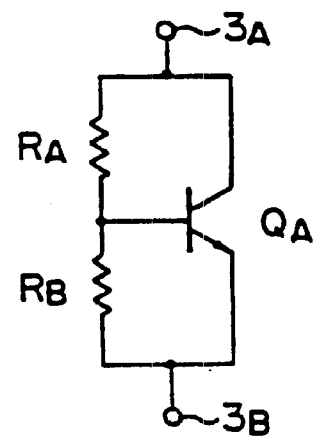

A circuit shown in FIG. 68 may be used in place of diode for producing the desired potential difference. Referring to FIG. 68, the potential difference making appearance across the terminals 3A and 3B is given by $$V_{BE}(1+R_A/R_S) \tag{58}$$

Figure 69:
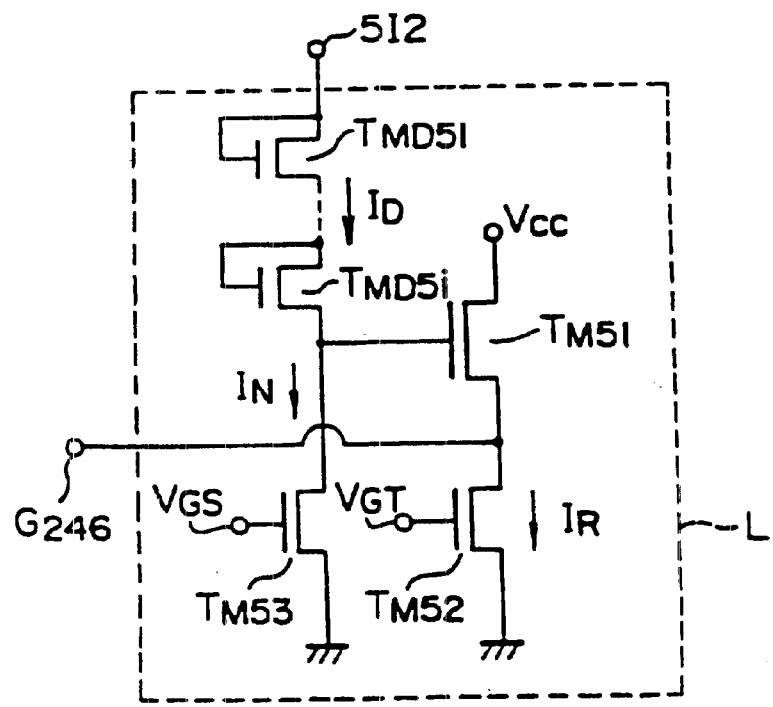

Thus, the potential difference can be varied continuously by varying the resistance ratio of $R_A/R_B$. Other versions and modifications are possible within the purview of the present invention FIG. 69 shows a version of the level shift circuit shown in FIG. 64. It will be seen that the level shift circuit shown in FIG. 69 is constituted by using only N-channel MOS elements. More specifically, the clamping diodes are realized as the N-channel MOS diodes, and the bipolar transistor $Q_1$ and the resistor R are replaced by N-channel MOS transistors $TM_{51}$ and $TM_{52}$, respectively. According to the embodiment shown in FIG. 69, the relation between $V_H$ and $V_I'$ is given by $$V_H = V_I' - V_{T246} + V_{TM51} + nV_{TD} \tag{59}$$

where $V_{TM51}$ represents the threshold voltage of the transistor $TM_{51}$ and $V_{TD}$ represents the threshold voltage of the MOS diode. It is apparent that the potential difference can be established on the basis of the unity voltage of $V_T$. In the case of this embodiment, the current flowing through the N-channel MOS diodes $T_{MD51}$ to $T_{MD51}$, is only the bias current $I_N$ flowing through the N-channel MOS transistor $TM_{53}$. Accordingly, it is unnecessary to increase the current supply capacity of 512 beyond the requisite value. Further, since the circuit shown in FIG. 69 can be constituted only by the MOS transistors without need for the use of bipolar transistor, this embodiment is suited advantageously for application to LSI which is composed only of MOS transistors. The gate voltages, gate lengths and the gate widths of the MOS transistors $TM_{51}$ and $TM_{53}$ may be so determined that the currents $I_R$ and $I_N$ can assume desired values, respectively. By way of example, by setting the current $I_R$ at a value ten times as high as that of the current $I_L$, fluctuation in the drain current of the MOS transistor $T_{M51}$ can be suppressed to about 10%, whereby $V_L$ can be maintained to be substantially constant. In case a problem arises in connection with the temperature characteristics of the clamping circuit in the embodiment described above, the voltage supplied to the MOS transistor $T_{M246}$ may be imparted with such temperature dependency which can compensate for that of the clamping circuit.

Figure 70:
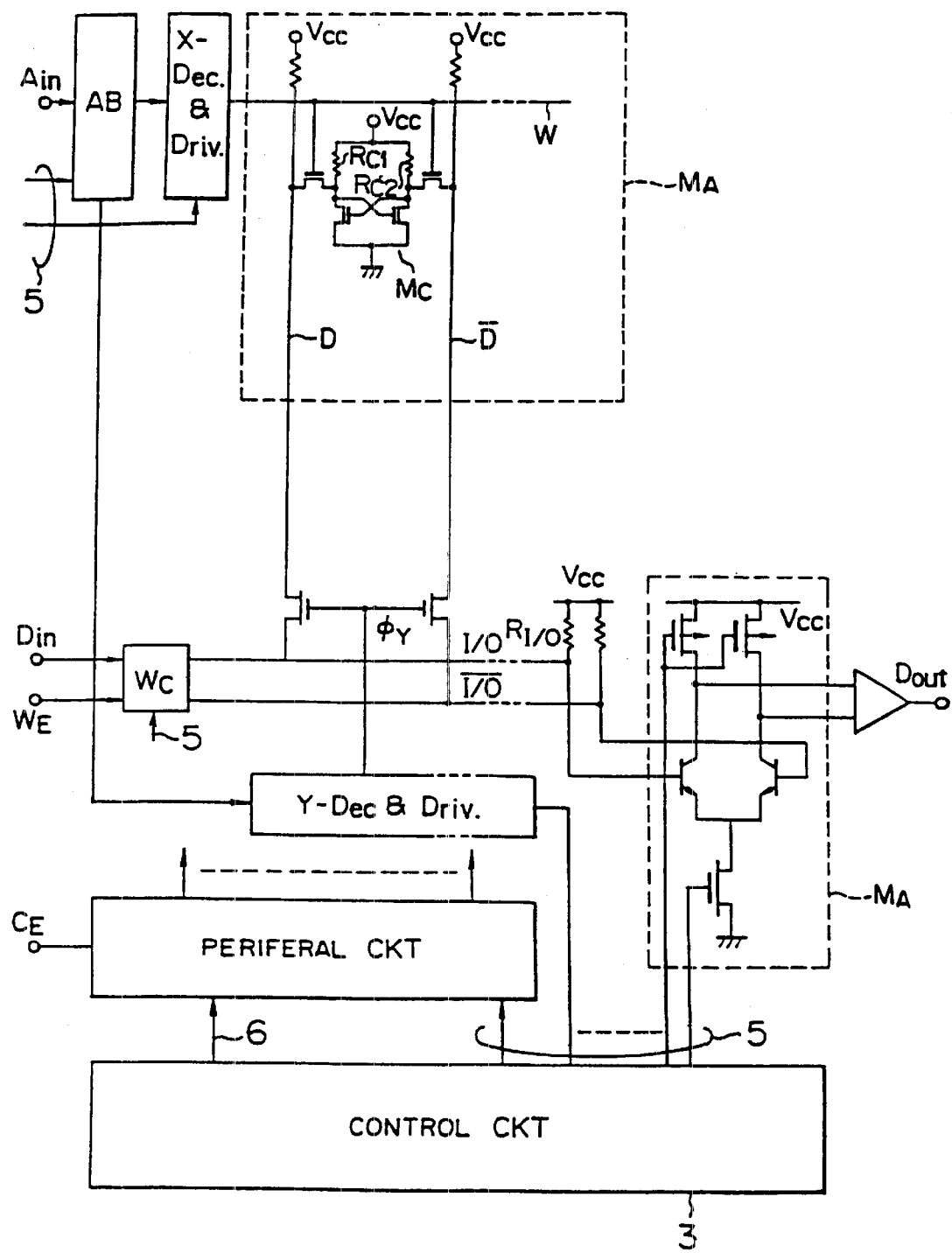

The present invention can be effectively and advantageously applied to SRAMs in addition to the DRAMs. FIG. 70 shows an exemplary embodiment of the SRAM in which the memory cell is constituted by using a N-channel MOS transistor and a resistor. Highly stable and reliable operation of the SRAM can be accomplished by performing the control on the drive circuit and the differential amplifier constituting the peripheral circuitry of the SRAM in the manner described hereinbefore. Besides, by supplying the voltage applied to load resistors $R_{C1}$, and $R_{C2}$ of the memory cell from the voltage transformer circuit according to the invention instead of the external power supply $V_{CC}$, the temperature dependency as well as the external voltage dependency of the characteristics of the memory cell can be eliminated, whereby the soft-error withstanding capability can be enhanced. Thus, the extremely stable memory operation can be realized. Further, since the current supplied through $R_{C1}$ and $R_{C2}$, i.e. the memory cell hold current, is an extremely small DC current which is substantially constant, it is possible to maintain the voltage to be constant with high accuracy. Besides, the reliability can further be improved by controlling the data line voltages DL and $\overline{DL}$ (i.e. the write voltages) as well as the word line (W) voltage to be stable. To this end, the write voltage can be determined on the basis of the voltage $V_I$ derived according to the invention as described hereinbefore, whereby the temperature dependency as well as the external-voltage dependency can be essentially nullified with the reliability being further enhanced.

Moreover, the present invention can be applied to other logic LSIs than the memory. In the control circuit shown in FIG. 53, the characteristics of the peripheral circuit are detected at 6. It should however be understood that the detection may be carried out at other various circuit points in dependence on the intended purposes. By way of example, duration required for amplification of the feeble (weak) signal by the sense amplifier may be detected, wherein the result of the detection may be utilized for changing the driving voltage and the driving current of the sense amplifier to thereby control the operation characteristics of the memory cell array. Of course, other control methods may occur to those skilled in the art. Although the invention has been described on the assumption that the MOS transistor and/or bipolar transistor are employed as main constituent elements, it will be appreciated that the principle of this invention can be equally applied without any substantial modification to the circuits constituted by compound semiconductor elements such as GaAs-elements. As the variable factors of the characteristics, element constants of MOS transistor are mainly considered. However, it goes without saying that variations in the current amplification factor, cut-off frequency and the forward bias voltage of the bipolar transistor can be similarly taken into consideration. Further, although the foregoing description of the embodiments has been made primarily with the intention to maintain the various characteristics to be constant. However, when such deviation in the fabrication process condition as the variations in the gate length and the threshold voltage as well as changes in the operating condition such as changes in the temperature and the power supply voltage have tendency to contribute to the increasing in the operation speed of the semiconductor, control may be made such that the operation speed is further increased, by applying correspondingly the teaching of the present invention. Reversely, when the deviation in the fabrication process condition and variation in the operating condition tend to lower the operation speed of the semiconductor device, control may be made such that the operating speed is further decreased.

Although the foregoing description has been mainly directed to the utilization of TTL interface, it is self-explanatory that the invention can equally be carried out with other type of interface such as ECL.

As will now be appreciated from the foregoing description, there can be realized semiconductor devices enjoying high stability and reliability regardless of deviations and variations in the fabrication process condition and the operating condition according to the present invention. Besides, since high yield can be assured even in the fabrication on the mass production basis, the semiconductor devices can be manufactured inexpensively when compared with the hitherto known devices.

It is further understood by those skilled in the art that the foregoing description is a preferred embodiment of the disclosed device and that various changes and modifications may be made in the invention without departing from the spirit and scope thereof.

What is claimed is:

1. A semiconductor device, comprising:
   an internal circuit including a first CMOS circuit;
   a detector outputting a first signal indicating an operating parameter of said internal circuit;
   a wire supplying a first voltage to said internal circuit and said detector; and
   an amplifier generating the first voltage according to a difference between the first signal and a reference value and outputting the first voltage to said wire,
   wherein the first voltage is supplied to a source node of said first CMOS circuit as a power source of said first CMOS circuit.

2. The semiconductor device according to claim 1,
   wherein said amplifier generates the first voltage by receiving an external voltage from outside of said semiconductor device.

3. The semiconductor device according to claim 1,
   wherein said detector is a second CMOS circuit, and
   wherein the first voltage is supplied to the source node of the second CMOS circuit as a power source of the second CMOS circuit.

4. The semiconductor device according to claim 3,
   wherein the second CMOS circuit is a ring oscillator using CMOS invertors.

5. The semiconductor device according to claim 1,
   wherein the first signal represents an operating speed of said internal circuit.

6. The semiconductor device according to claim 1, further comprising:
   a reference value generator for generating the reference value,
      wherein the reference value has characteristics of a small voltage fluctuation against a fabrication process fluctuation of said semiconductor device or a operating temperature fluctuation of said semiconductor device, and
      wherein the reference value makes the operating parameter of said internal circuit substantially constant.

7. The semiconductor device according to claim 1,
   wherein the first signal is a phase signal from said detector,
   wherein said semiconductor device further comprises a circuit which outputs second signals (Φ1', Φ2') to said detector and receives a voltage (VCONT) from said internal circuit,
   wherein said detector outputs said first signal according to the phase difference of said second signals, and
   wherein said amplifier generates the first voltage according to a difference between the detection voltage and the reference value as a reference voltage.

8. A semiconductor device, comprising:
   an internal circuit including a first CMOS circuit;
   a detector outputting a first signal indicating an operating parameter of said internal circuit;
   a wire supplying a first voltage to said internal circuit and said detector; and an amplifier generating the first voltage according to a difference between the first signal and a reference value and outputting the first voltage to said wire, wherein the first voltage is supplied to the substrate of MOS transistors including in said first CMOS circuit.

9. The semiconductor device according to claim 8, wherein the first voltage controls the threshold voltage of the MOS transistors included in said first CMOS circuit.

10. The semiconductor device according to claim 8, wherein said amplifier generates the first voltage by receiving an external voltage from the outside of said semiconductor device.

11. The semiconductor device according to claim 8, wherein said detector is a second CMOS circuit, and wherein the first voltage is supplied to the source node of the second CMOS circuit as a power source of the second CMOS circuit.

12. The semiconductor device according to claim 11, wherein the second CMOS circuit is a ring oscillator using CMOS invertors.

13. The semiconductor device according to claim 8, wherein the first signal represents an operating speed of said internal circuit.

14. The semiconductor device according to claim 8, further comprising:

a reference voltage generator for generating the reference value, wherein the reference value has characteristics of a small voltage fluctuation against a fabrication process fluctuation of said semiconductor device or a operating temperature fluctuation of said semiconductor device, and wherein the reference value makes the operating parameter of said internal circuit substantially constant.

15. The semiconductor device according to claim 8, wherein said semiconductor device further comprises a circuit which outputs second signals ($\Phi 1'$, $\Phi 2'$) to said detector and receives a voltage (VCONT) from said internal circuit, wherein said detector outputs said first signal according to the phase difference of said second signals, and wherein said amplifier generates the first voltage according to a difference between the detection voltage and the reference value as a reference voltage.

16. A semiconductor device, comprising:

an internal circuit including a CMOS circuit;

a detector outputting a first signal indicating an operating speed of said internal circuit;

a wire supplying a first voltage to said internal circuit and said detector; and an amplifier generating the first voltage based on the first signal and a reference value and outputting the first voltage to said wire, wherein the first voltage controls the operating speed of said CMOS circuit based on the reference value.

17. The semiconductor device according to claim 16, further comprising:

a reference voltage generator for generating the reference value, wherein the reference value has characteristics of a small voltage fluctuation against a fabrication process fluctuation of said semiconductor device or a operating temperature fluctuation of said semiconductor device, and wherein the reference value makes the operating parameter of said internal circuit substantially constant.

18. The semiconductor device according to claim 16, further comprising:

a reference voltage generator for generating the reference value, wherein the reference value has characteristics of a programmed variation against a operating circumstance fluctuation of said semiconductor device, and wherein the reference value changes the operating condition of said internal circuit according to the programmed variation.

19. The semiconductor device according to claim 18, wherein the operating circumstance fluctuation of said semiconductor device is a operating temperature.

20. The semiconductor device according to claim 16, wherein said semiconductor device further comprises a circuit which outputs second signals ($\Phi 1'$, $\Phi 2'$) to said detector and receives a voltage (VCONT) from said internal circuit, wherein said detector outputs said first signal according to the phase difference of said second signals, wherein said circuit has a two circuits which have components of said inner circuit, and wherein said amplifier generates the first voltage according to a difference between the detection voltage and the reference value as a reference voltage.

21. The semiconductor device according to claim 16, wherein the first signal is an operation current from said detector.

* * * * *

UNITED STATES PATENT AND TRADEMARK OFFICE
CERTIFICATE OF CORRECTION

PATENT NO.   : 6,608,791 B2
DATED        : August 19, 2003
INVENTOR(S)  : Takao Watanabe et al.

It is certified that error appears in the above-identified patent and that said Letters Patent is hereby corrected as shown below:

Column 10,
Line 35, change "V." to -- $V_H$ --.

Column 18,
Lines 36 and 40, change "$V_I$" to -- $V_{//}$ --.

Column 26,
Line 51, change "$V_{iiL}$" to -- $V_{HL}$ --.
Line 52, change "capacitor C is" to -- capacitor $C_I$ is --.

Column 27,
Line 66, change "$A_m$ to -- $A_{in}$ --.

Column 28,
Line 5, change "$D_m$ into" to -- $D_{in}$ into --.
Line 22, change "$A_m$" to -- $A_{in}$ --.

Column 32,
Line 18, change "$V_I$" to -- $V'_I$ --.

Column 35,
Line 45, change "$TM_{m29}$" to -- $TM_{229}$ --.
Line 55, change "$TM_{22A}$" to -- $TM_{22B}$ --.

UNITED STATES PATENT AND TRADEMARK OFFICE
CERTIFICATE OF CORRECTION

PATENT NO. : 6,608,791 B2
DATED : August 19, 2003
INVENTOR(S) : Takao Watanabe et al.

It is certified that error appears in the above-identified patent and that said Letters Patent is hereby corrected as shown below:

Column 36,
Line 2, change "$V_I$" to -- $V_H$ --.

Column 37,
Line 1, change "$I_{124}$" to -- $I_{241}$ --.
Line 62, change "$V_I$" to -- $V_h$ --.

Column 38,
Line 33, change "$V_T$" to -- $V_{TD}$ --.

Signed and Sealed this

Third Day of August, 2004

JON W. DUDAS
*Acting Director of the United States Patent and Trademark Office*